United States Patent
Takada et al.

(10) Patent No.: US 10,141,061 B2
(45) Date of Patent: Nov. 27, 2018

(54) MEMORY SYSTEM

(71) Applicant: Toshiba Memory Corporation, Minato-ku (JP)

(72) Inventors: Marie Takada, Yokohama (JP); Masanobu Shirakawa, Chigasaki (JP); Tsukasa Tokutomi, Kamakura (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/703,057

(22) Filed: Sep. 13, 2017

(65) Prior Publication Data

US 2018/0277228 A1 Sep. 27, 2018

(30) Foreign Application Priority Data

Mar. 24, 2017 (JP) .................................. 2017-059244

(51) Int. Cl.
  *G11C 16/04* (2006.01)
  *G11C 16/28* (2006.01)
  *G11C 16/08* (2006.01)

(52) U.S. Cl.
  CPC .......... *G11C 16/28* (2013.01); *G11C 16/0408* (2013.01); *G11C 16/08* (2013.01)

(58) Field of Classification Search
  CPC ............ G11C 11/5642; G11C 11/5628; G11C 16/0483; G11C 16/08; G11C 29/02; G11C 2029/0411; G11C 2211/5642; G11C 11/56; G11C 16/04
  See application file for complete search history.

(56) References Cited

U.S. PATENT DOCUMENTS

| | | | |
|---|---|---|---|
| 8,462,549 B2 | 6/2013 | Haratsch et al. | |
| 2009/0267128 A1* | 10/2009 | Maejima | H01L 27/11565 257/314 |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |
| 2011/0083060 A1 | 4/2011 | Sakurada et al. | |
| 2011/0284946 A1* | 11/2011 | Kiyotoshi | H01L 27/11565 257/324 |
| 2012/0069663 A1 | 3/2012 | Itagaki et al. | |
| 2012/0069666 A1 | 3/2012 | Fukuda | |

(Continued)

FOREIGN PATENT DOCUMENTS

| | | |
|---|---|---|
| JP | 2012-069192 | 4/2012 |
| JP | 2016-062623 | 4/2016 |

*Primary Examiner* — Hien Nguyen
(74) *Attorney, Agent, or Firm* — Oblon, McClelland, Maier & Neustadt, L.L.P.

(57) ABSTRACT

According to one embodiment, a memory system includes a semiconductor memory and a controller. The semiconductor memory is configured to execute a first to third read operations. In the first read operation, a first voltage is applied to a selected word line. In the second read operation, a second voltage different from the first voltage and a third voltage are applied to the selected word line. In the third read operation, a fourth voltage different from the first to third voltages and a fifth voltage are applied to the selected word line. An absolute value of a difference between the second voltage and the fourth voltage is different from an absolute value of a difference between the third voltage and the fifth voltage.

17 Claims, 66 Drawing Sheets

(56) References Cited

U.S. PATENT DOCUMENTS

| | | | | |
|---|---|---|---|---|
| 2012/0297273 A1* | 11/2012 | Sakaue | ............... | G06F 11/1048 |
| | | | | 714/773 |
| 2012/0307557 A1 | 12/2012 | Itagaki | | |
| 2013/0003451 A1* | 1/2013 | Bedeschi | ........... | G11C 16/3418 |
| | | | | 365/163 |
| 2013/0077400 A1* | 3/2013 | Sakurada | ............ | G11C 11/5642 |
| | | | | 365/185.03 |
| 2014/0254242 A1* | 9/2014 | Siau | ................... | G11C 13/0026 |
| | | | | 365/148 |
| 2016/0078954 A1 | 3/2016 | Shirakawa et al. | | |

* cited by examiner

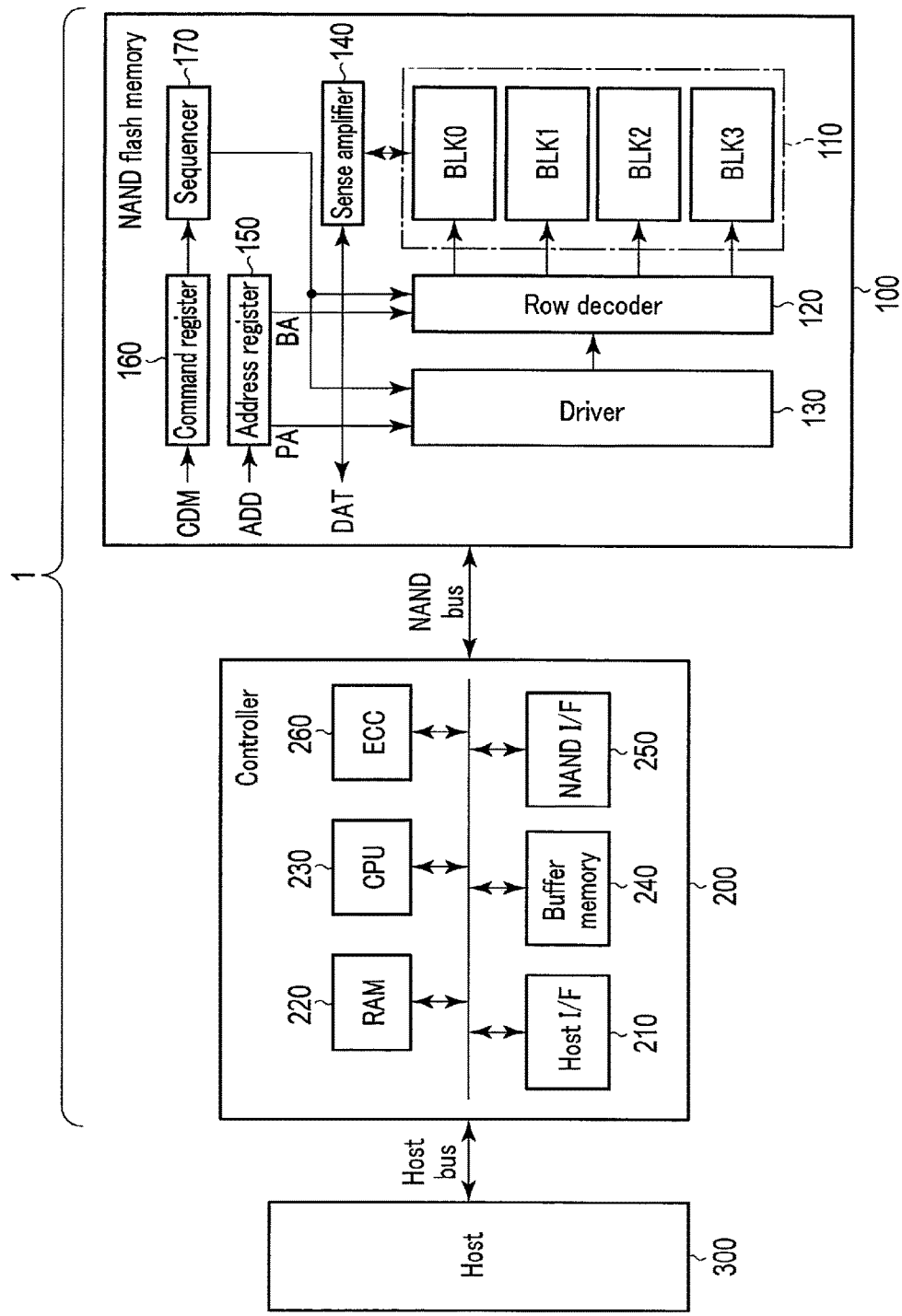
F I G. 1

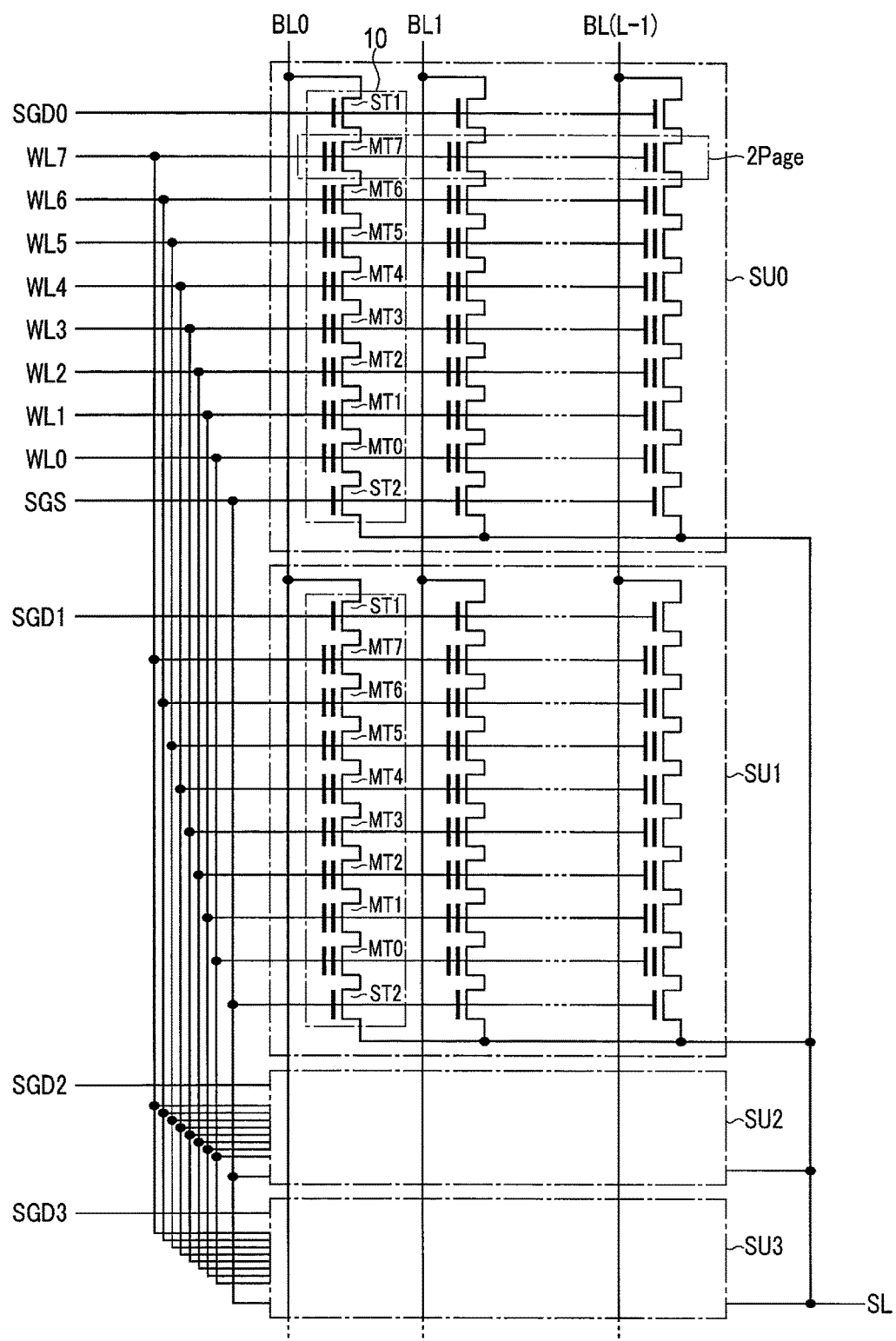
F I G. 2

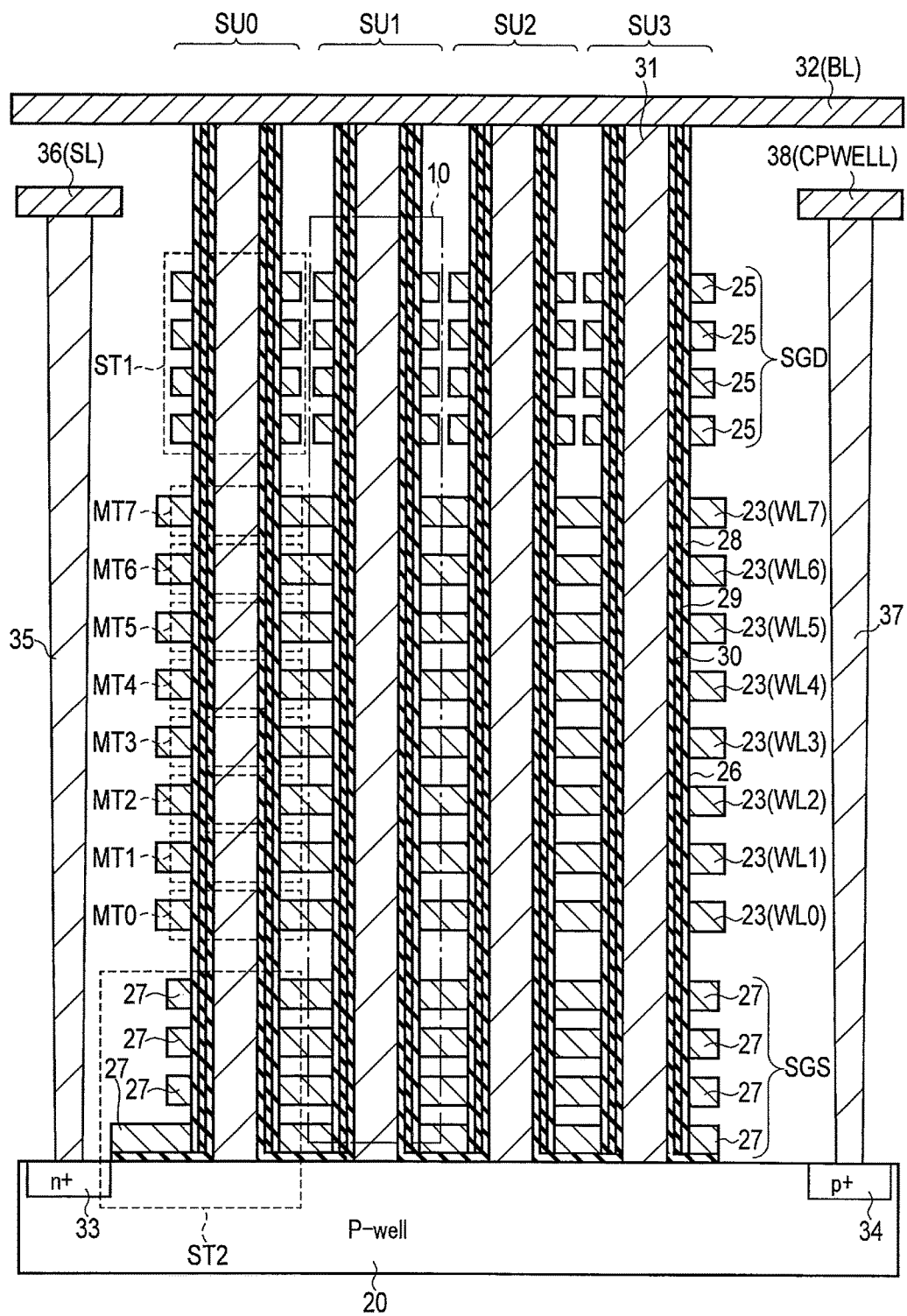
F I G. 3

| 1-month lapse table ||
|---|---|
| Reading operation | Shift amount |
| AR1 | S1_A1 |
| AR2 | S1_A2 |
| AR3 | S1_A3 |
| ... | ... |
| ARn | S1_An |
| CR1 | S1_C1 |
| CR2 | S1_C2 |
| CR3 | S1_C3 |
| ... | ... |
| CRn | S1_Cn |
| BR1 | S1_B1 |
| BR2 | S1_B2 |
| BR3 | S1_B3 |
| ... | ... |
| BRn | S1_Bn |

| 2-month lapse table ||
|---|---|
| Reading operation | Shift amount |
| AR1 | S2_A1 |
| AR2 | S2_A2 |
| AR3 | S2_A3 |
| ... | ... |
| ARn | S2_An |
| CR1 | S2_C1 |
| CR2 | S2_C2 |
| CR3 | S2_C3 |
| ... | ... |
| CRn | S2_Cn |
| BR1 | S2_B1 |
| BR2 | S2_B2 |
| BR3 | S2_B3 |
| ... | ... |
| BRn | S2_Bn |

| m-month lapse table ||
|---|---|
| Reading operation | Shift amount |
| AR1 | Sm_A1 |
| AR2 | Sm_A2 |
| AR3 | Sm_A3 |
| ... | ... |
| ARn | Sm_An |
| CR1 | Sm_C1 |
| CR2 | Sm_C2 |
| CR3 | Sm_C3 |
| ... | ... |
| CRn | Sm_Cn |
| BR1 | Sm_B1 |
| BR2 | Sm_B2 |
| BR3 | Sm_B3 |
| ... | ... |
| BRn | Sm_Bn |

F I G. 5

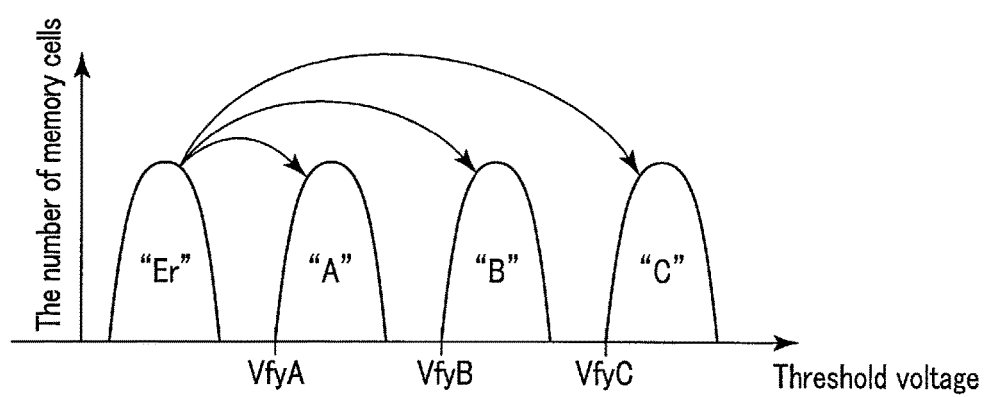
F I G. 6

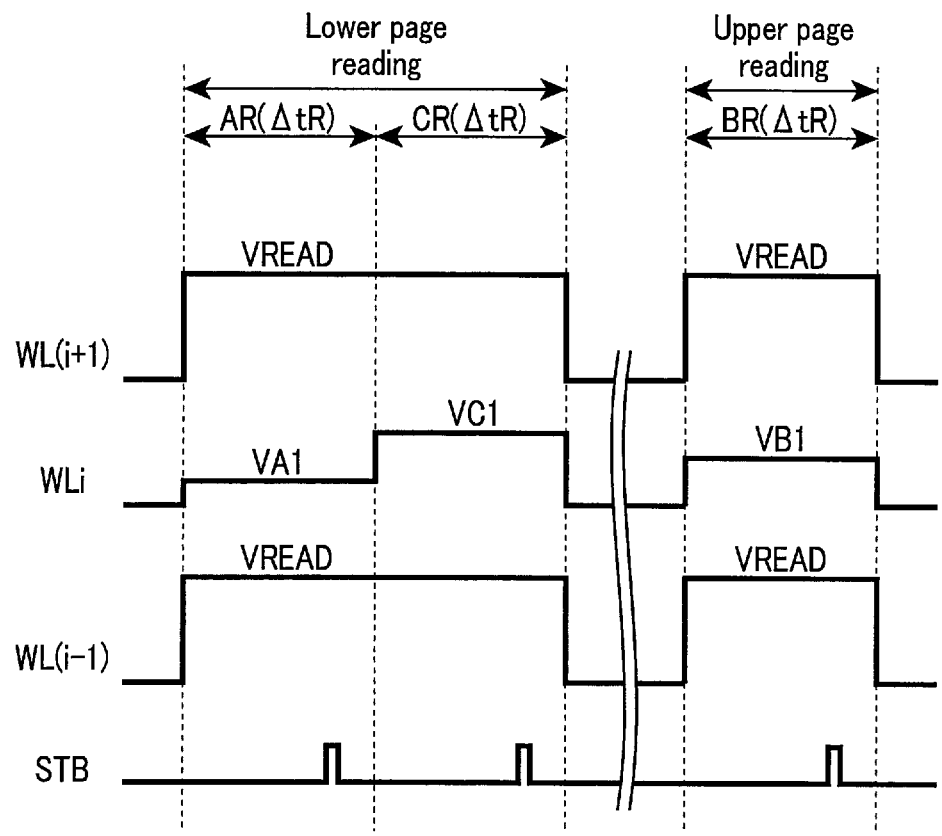
F I G. 8

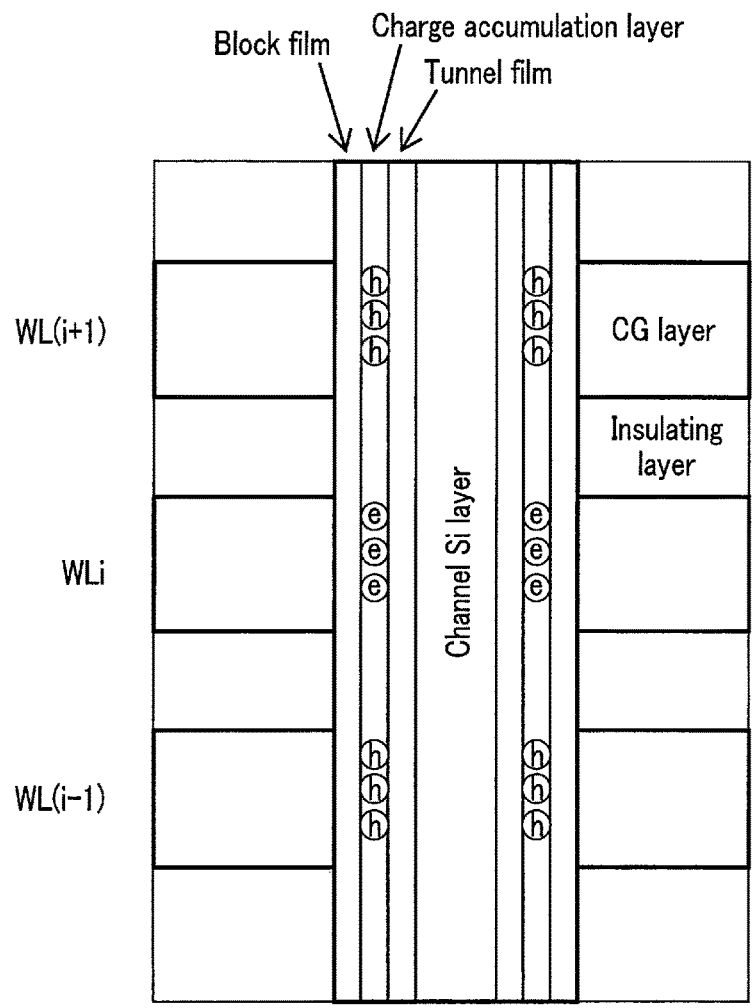
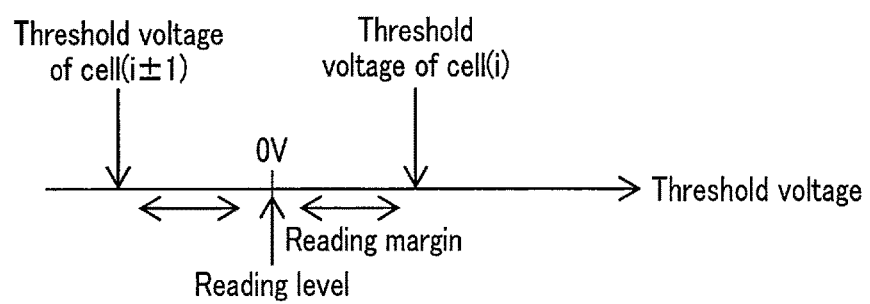
FIG. 14

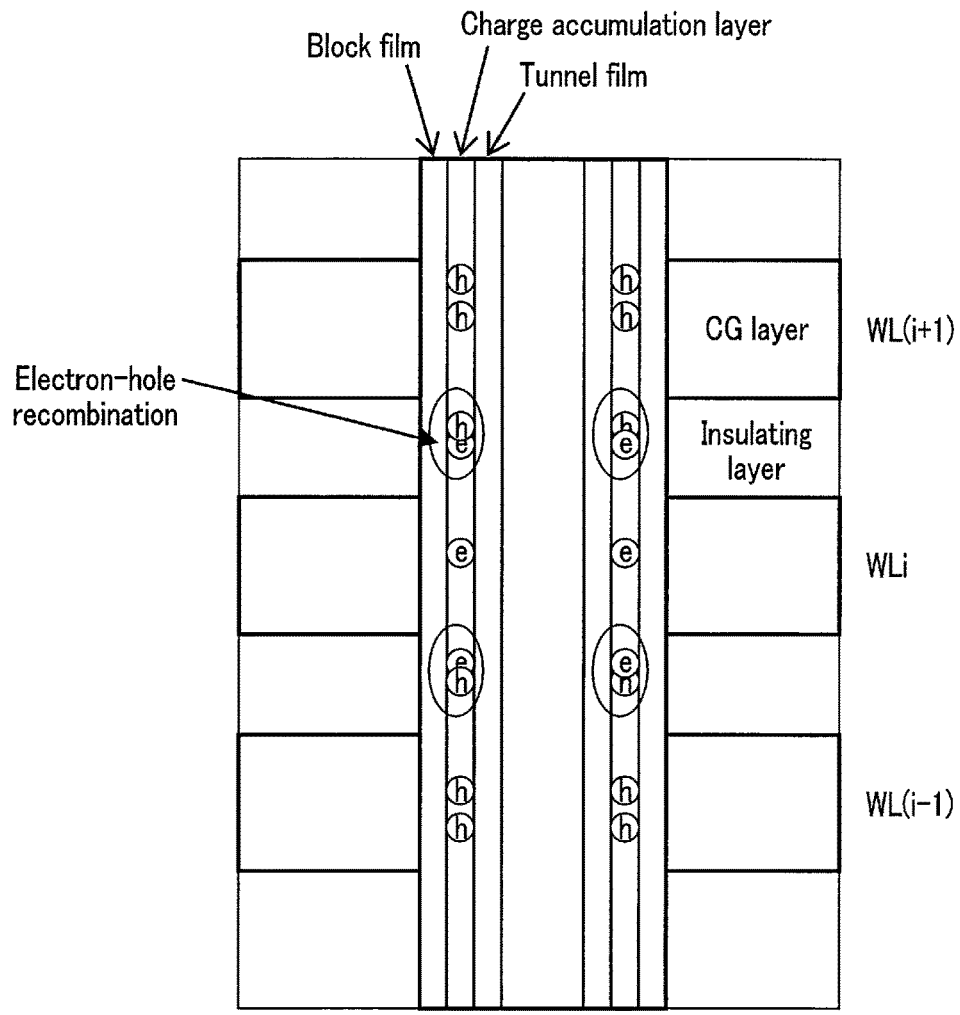
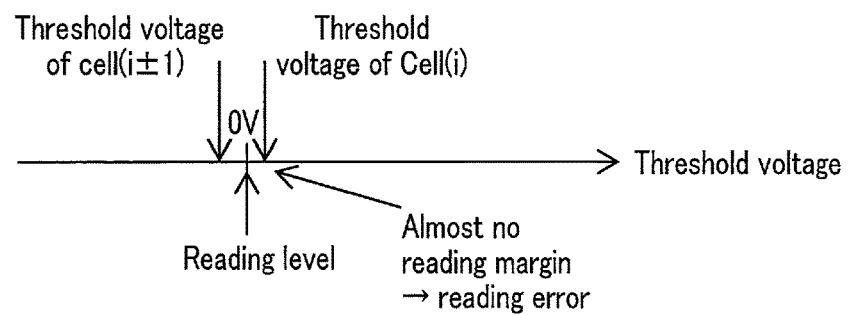
FIG. 15

| Group | Prior-read data of WL(i−1) and WL(i+1) |
|---|---|
| N1 | Er/Er |
| N2 | Er/A, A/Er |
| N3 | Er/B, B/Er, A/A |
| N4 | Er/C, C/Er, A/B, B/A |
| N5 | A/C, C/A, B/B |
| N6 | B/C, C/B |
| N7 | C/C |

FIG. 16

| Group | Prior-read data of WL(i+1) |
|---|---|
| Nf1 | Er, A, or B |
| Nf2 | C |

FIG. 17

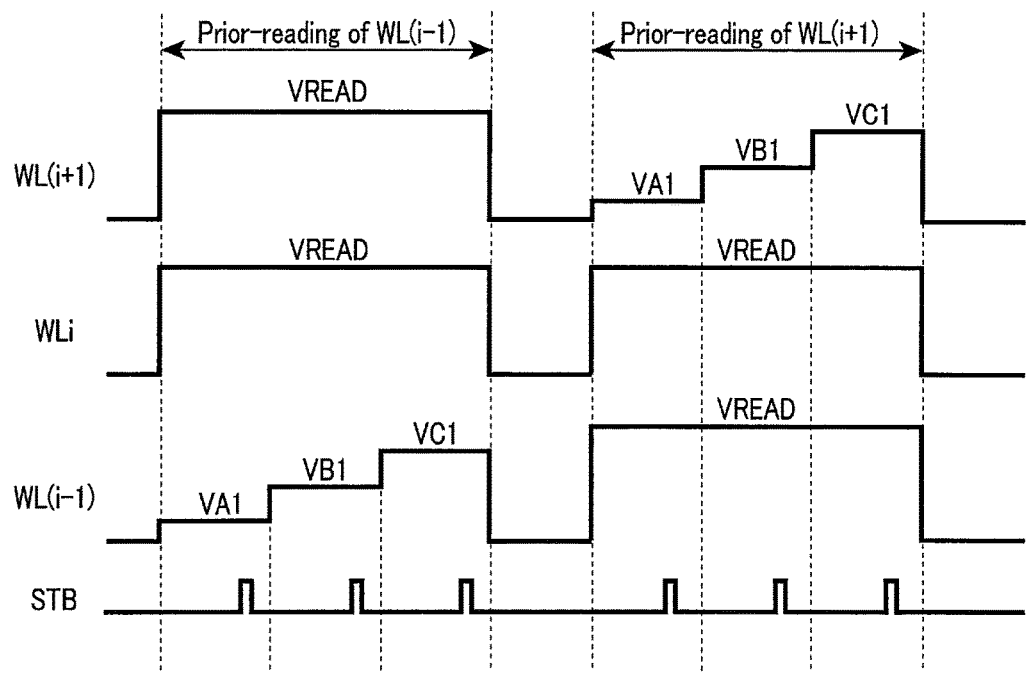
F I G. 18

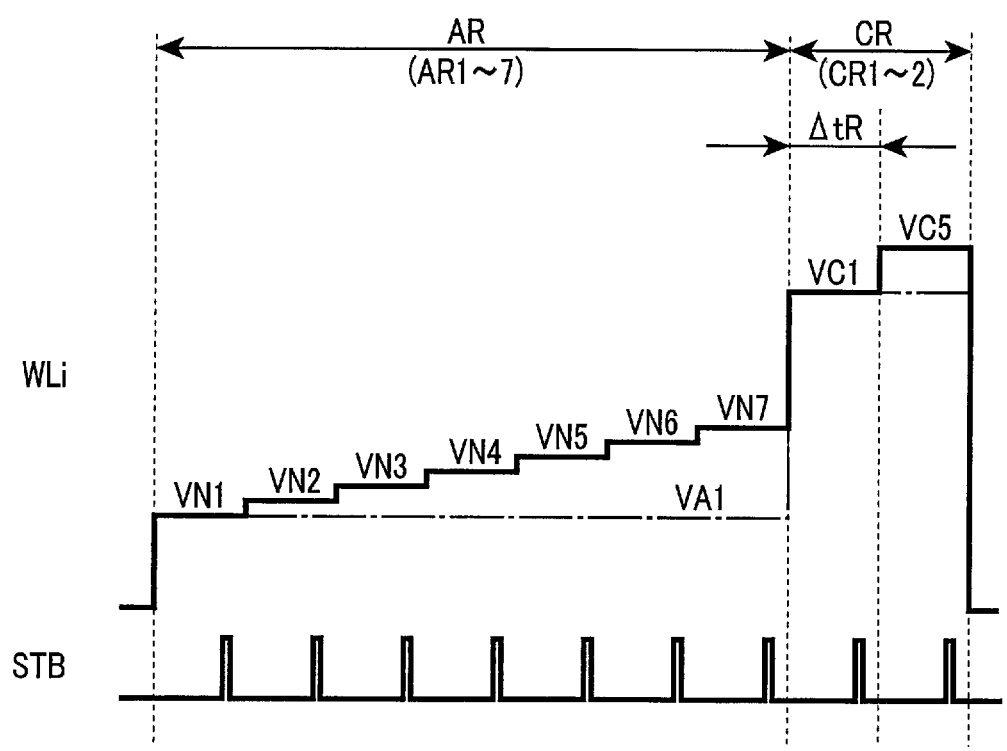
F I G. 19

| Group | Prior-read data of WL(i−1) and WL(i+1) |
|---|---|
| Sfa1 | C/C |
| Sfa2 | Er/C, A/C, B/C, C/A, C/B, C/Er |
| Sfa3 | Other combinations |

F I G. 21

| Group | Prior-read data of WL(i−1) and WL(i+1) |
|---|---|
| Sfc1 | Er/C, A/C, B/C, C/C |
| Sfc2 | Other combinations |

F I G. 22

| Group | Prior-read data of WL(i−1) and WL(i+1) |
|---|---|
| Sr1 | Er/Er |
| Sr2 | Er/A, Er/B, Er/C, A/Er, B/Er, C/Er |
| Sr3 | Other combinations |

F I G. 23

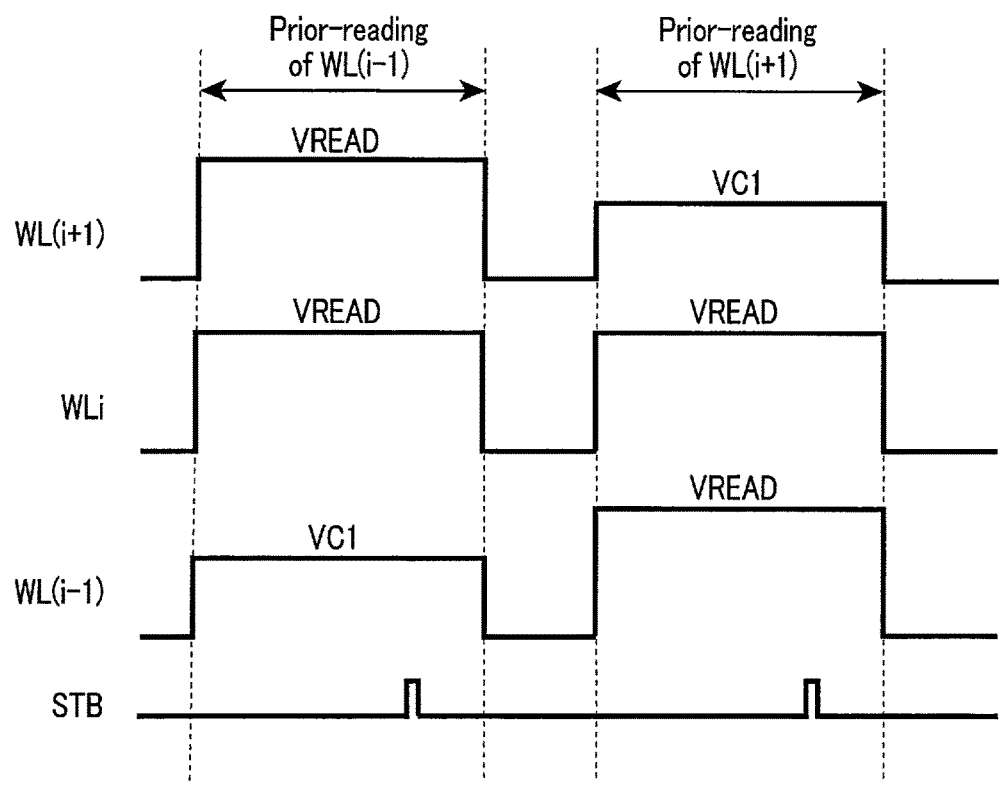
F I G. 24

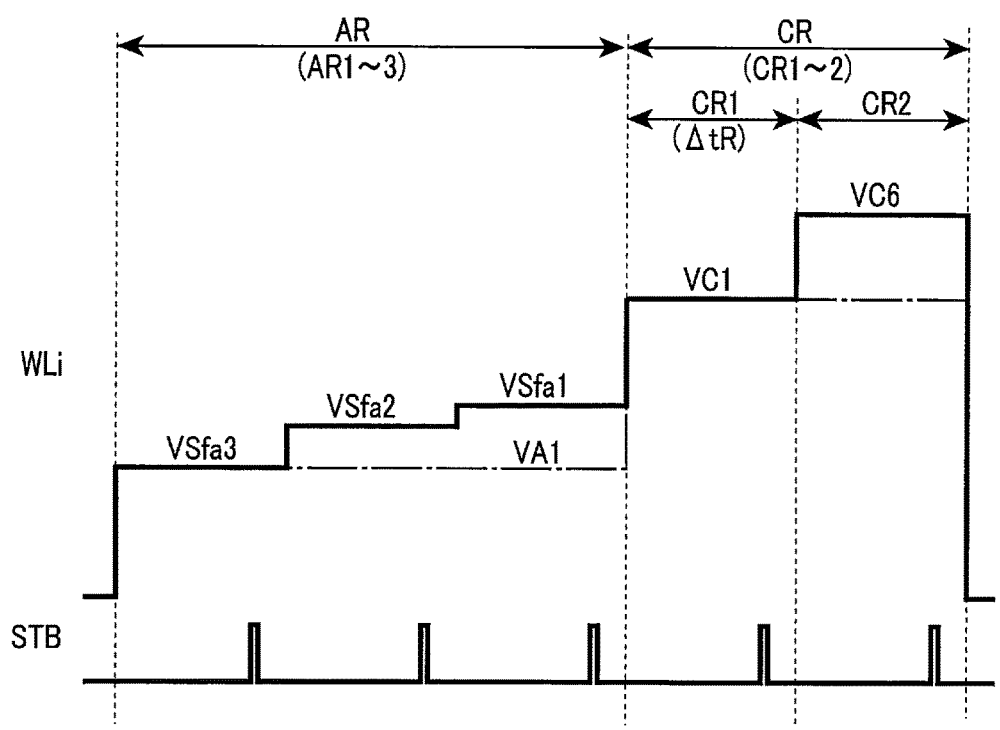
F I G. 25

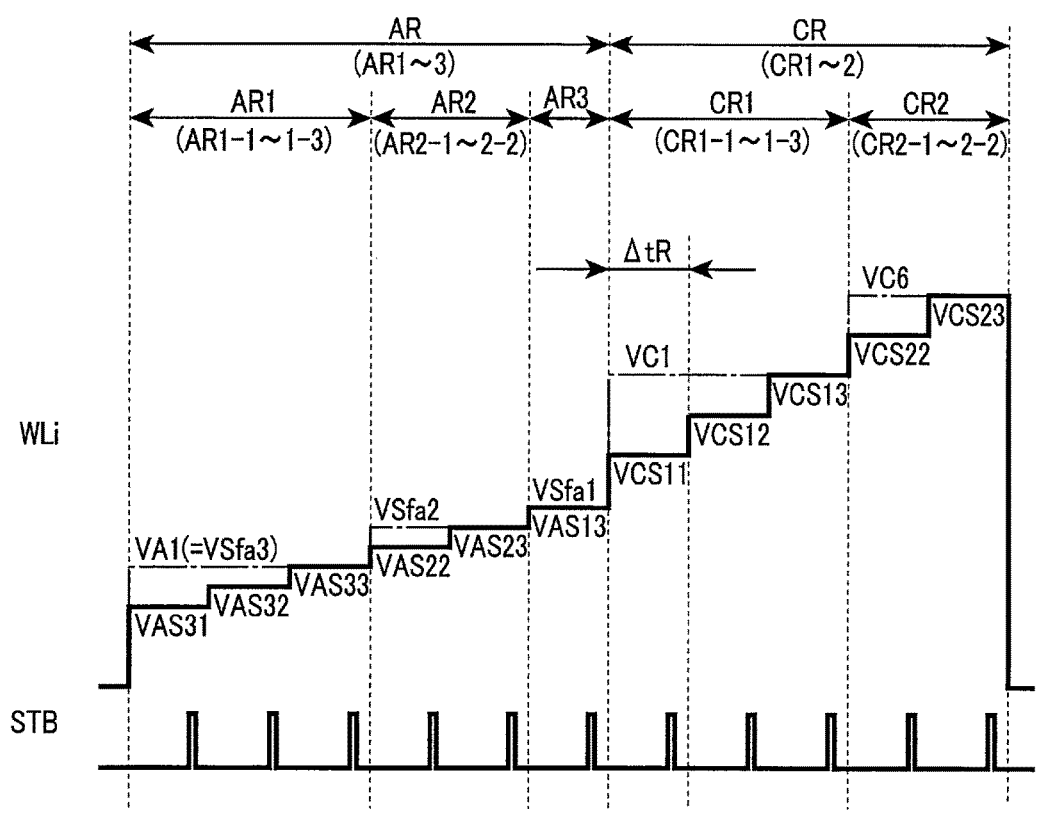
F I G. 27

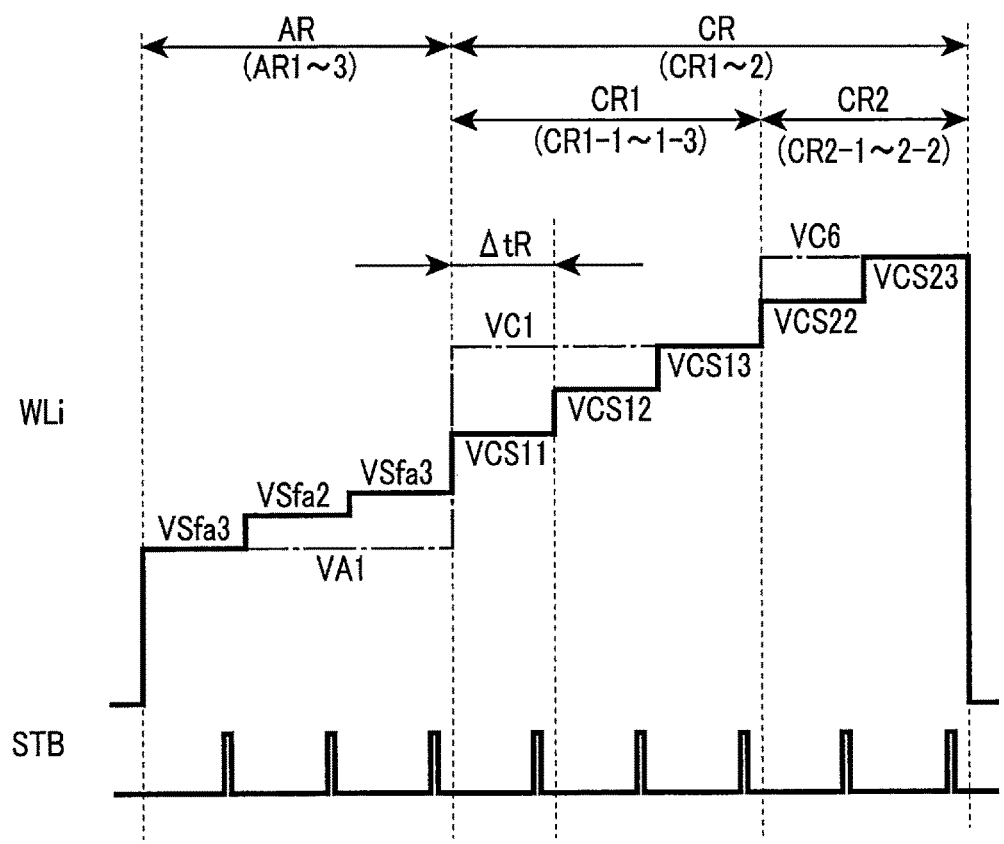
F I G. 28

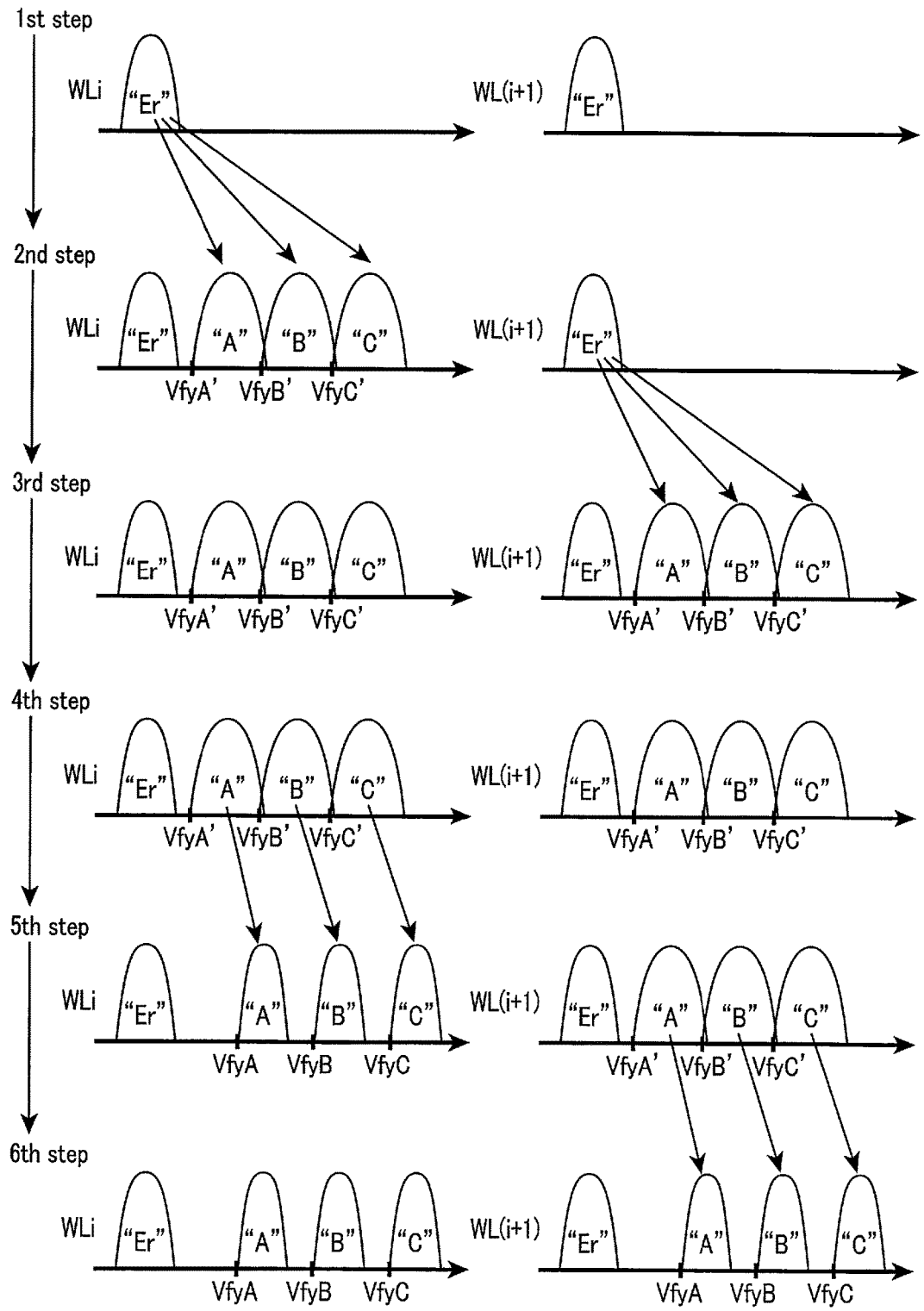
F I G. 29

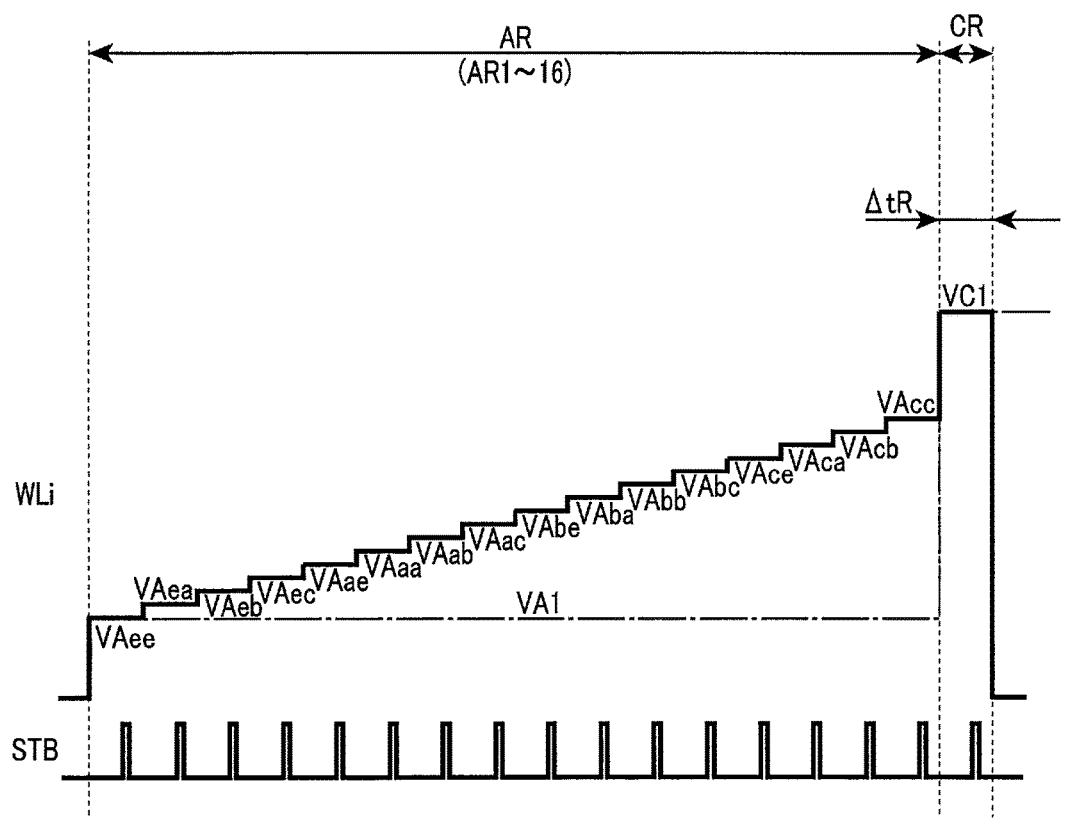
F I G. 30

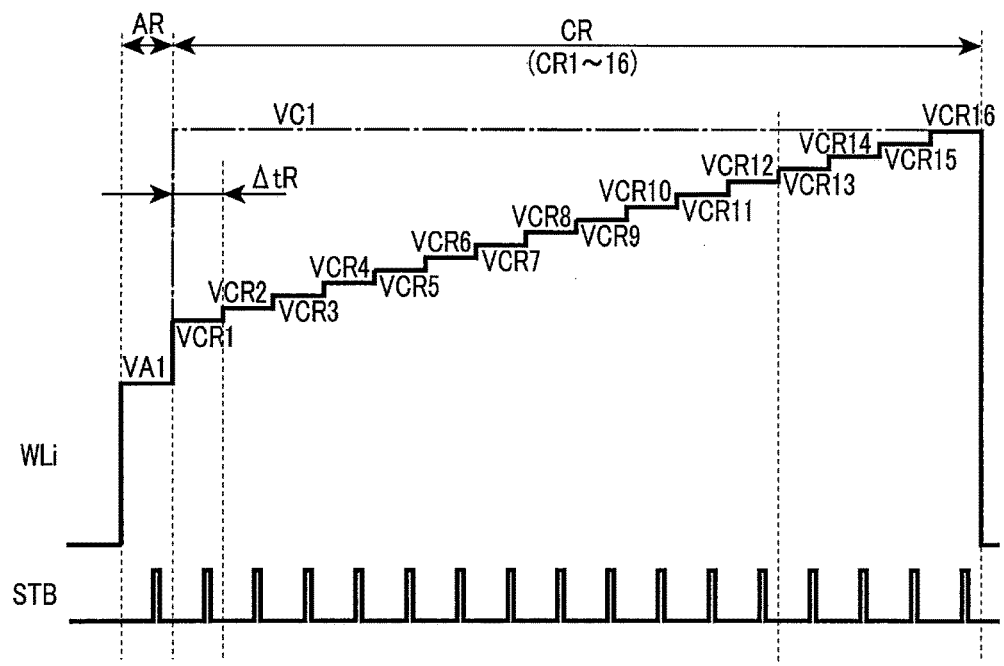
F I G. 32

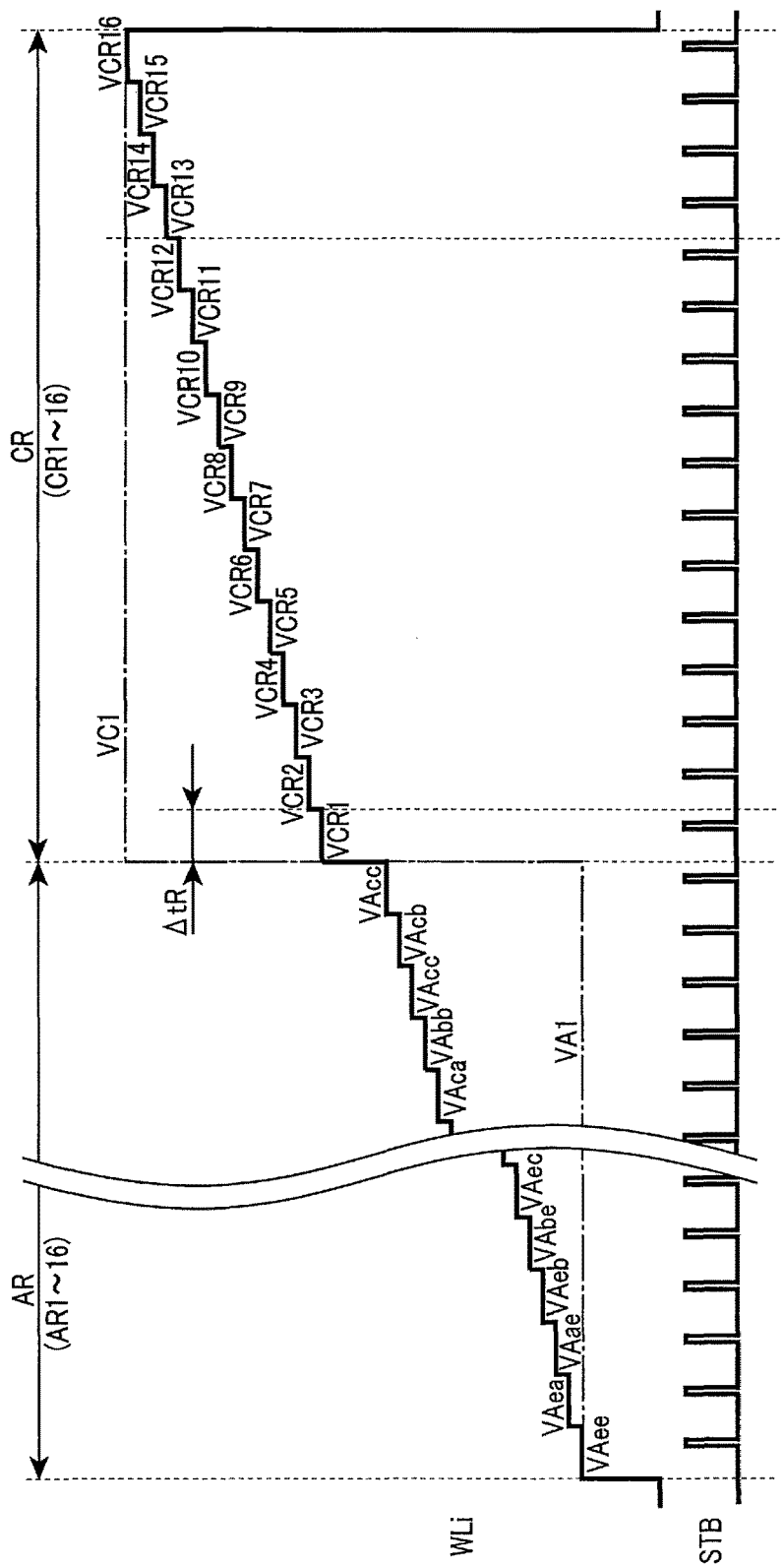
F I G. 33

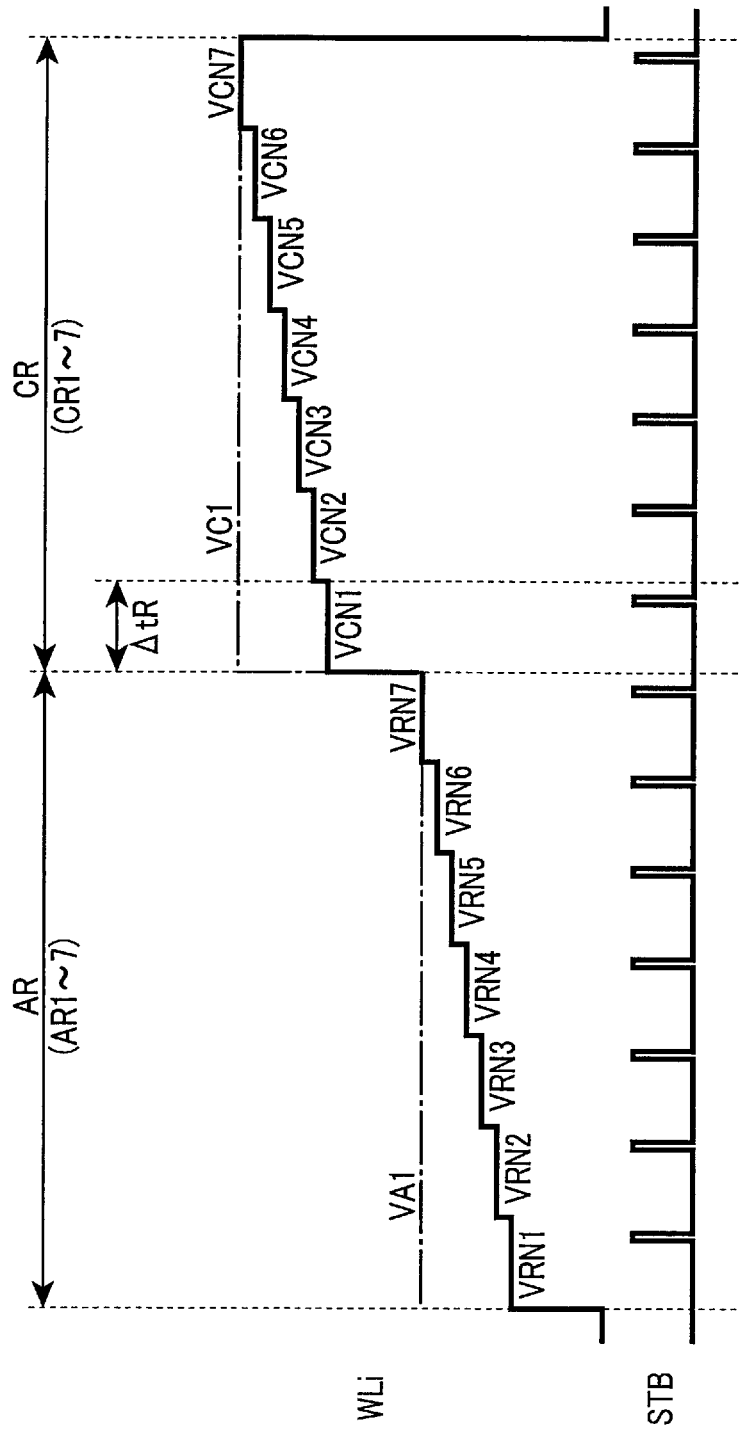
F I G. 35

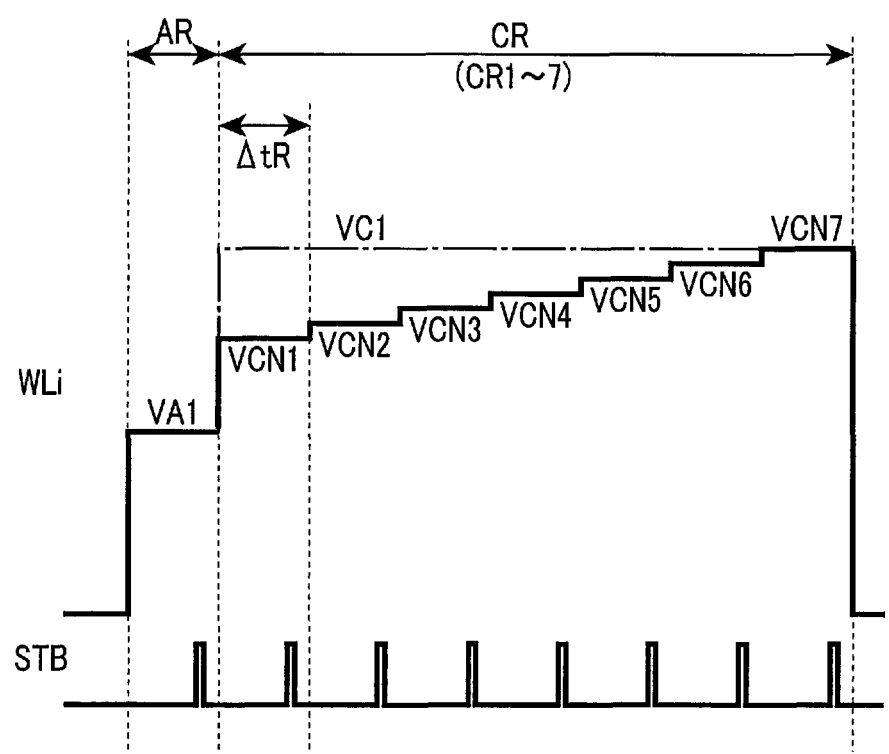
F I G. 36

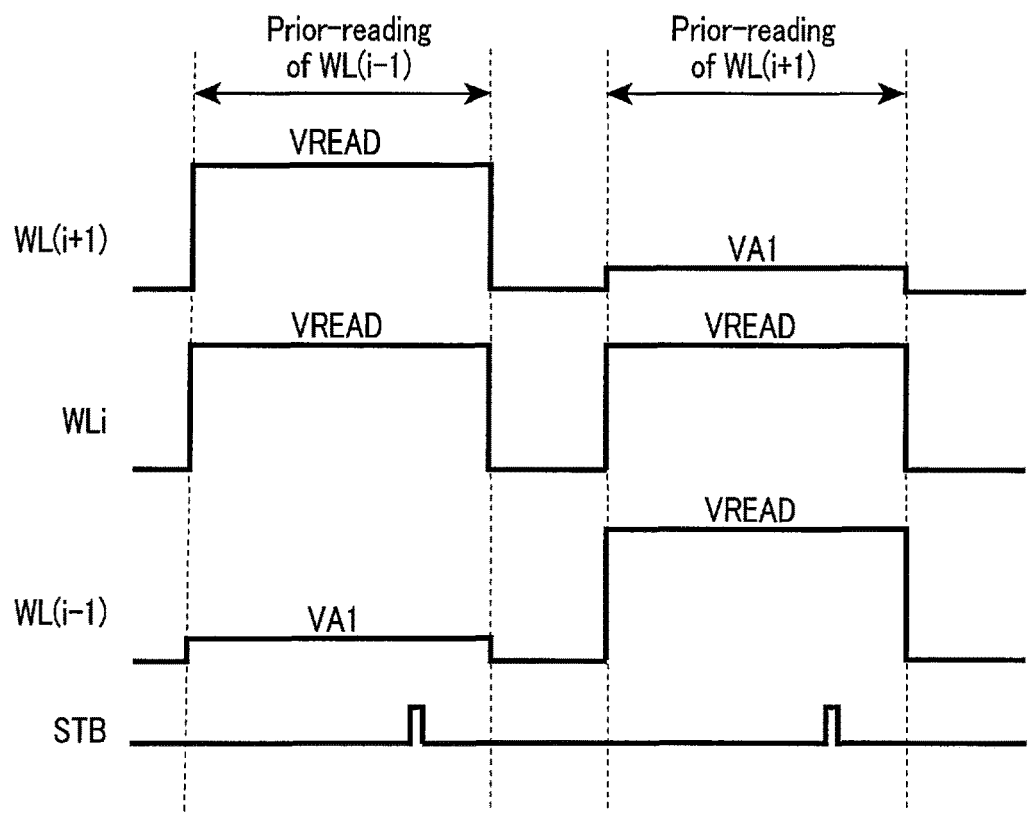
F I G. 39

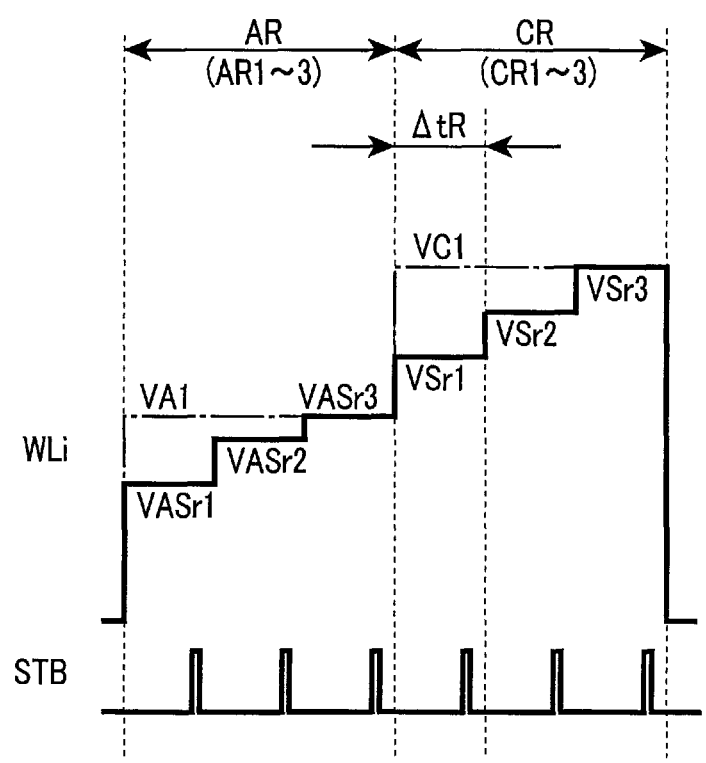
F I G. 40

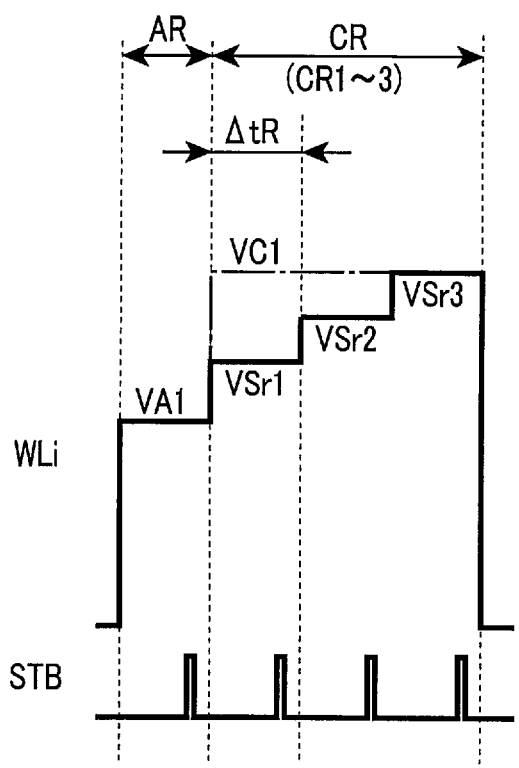
F I G. 41

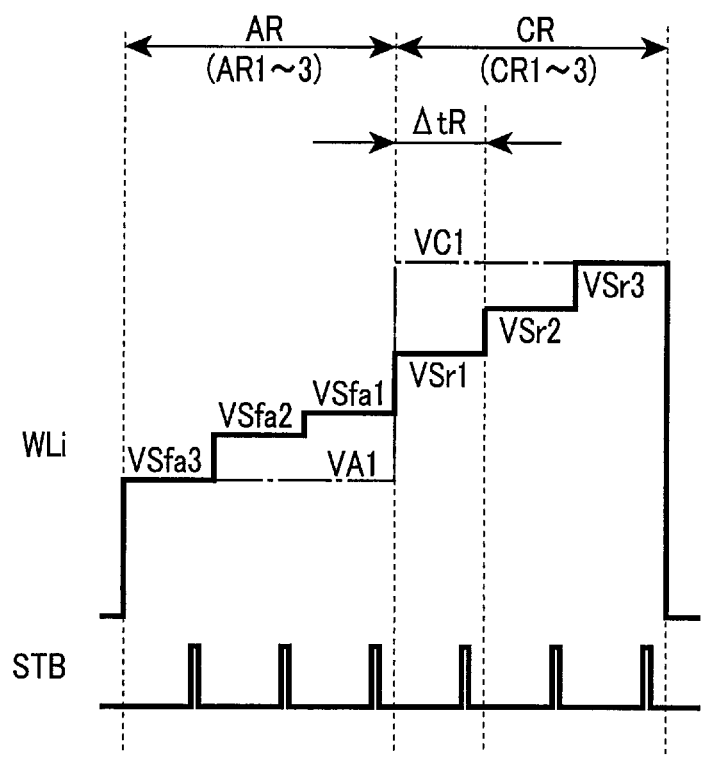
F I G. 42

| Group | Prior-read data of WL(i−1) and WL(i+1) |
|---|---|
| Sfa1 | F/F, F/G, G/G, G/F |
| Sfa2 | (F or G)/(Er, A, B, C, D, or E), (Er, A, B, C, D, or E)/(F or G) |
| Sfa3 | Other combinations |

FIG. 46

| Group | Prior-read data of WL(i+1) |
|---|---|
| Sfe1 | F or G |
| Sfe2 | Others |

FIG. 47

| Group | Prior-read data of WL(i−1) and WL(i+1) |
|---|---|
| Srel1 | Er/Er |
| Srel2 | Er/(A, B, C, D, or E), (A, B, C, D, E, F, or G)/Er |
| Srel3 | Other combinations |

FIG. 48

| Group | Prior-read data of WL(i−1) and WL(i+1) |
|---|---|
| Sreh1 | Er/F, Er/G |
| Sreh2 | Other combinations |

FIG. 49

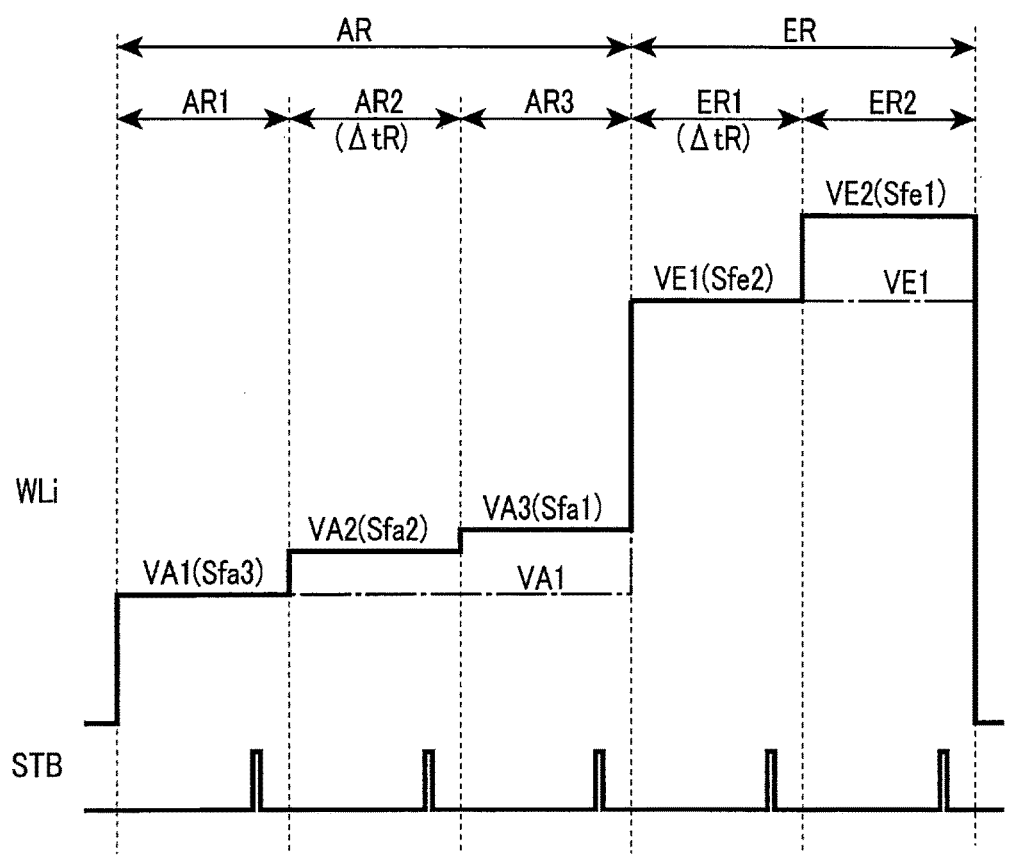
F I G. 50

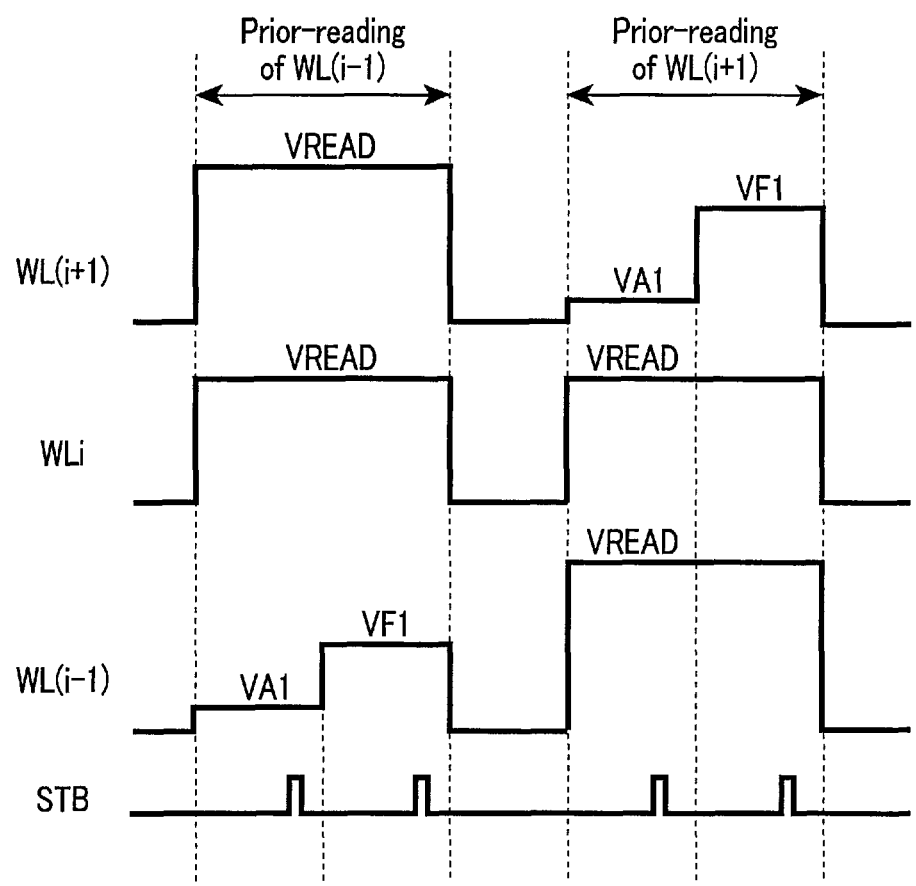
F I G. 51

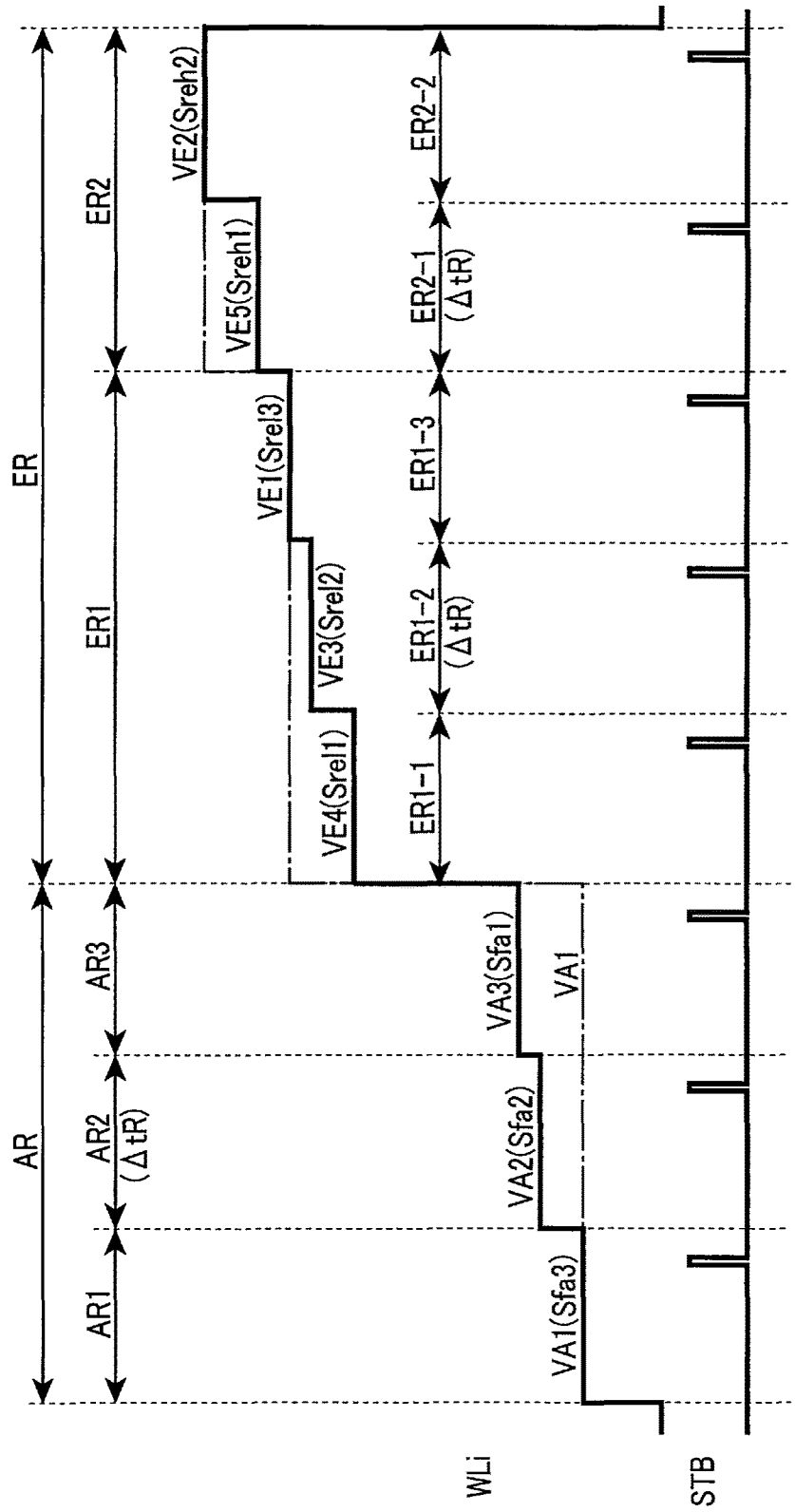
F I G. 52

| Group | Prior-read data of WL(i+1) |
|---|---|
| Sfcg1 | F or G |
| Sfcg2 | Er, A, B, C, D, or E |

F I G. 53

| Group | Prior-read data of WL(i−1) and WL(i+1) |
|---|---|
| Srgl1 | Er/Er |
| Srgl2 | Er/(A, B, C, D, or E), (A, B, C, D, E, F, or G)/Er |
| Srgl3 | Other combinations |

F I G. 54

| Group | Prior-read data of WL(i−1) and WL(i+1) |
|---|---|
| Srgh1 | Er/F, Er/G |
| Srgh2 | Other combinations |

F I G. 55

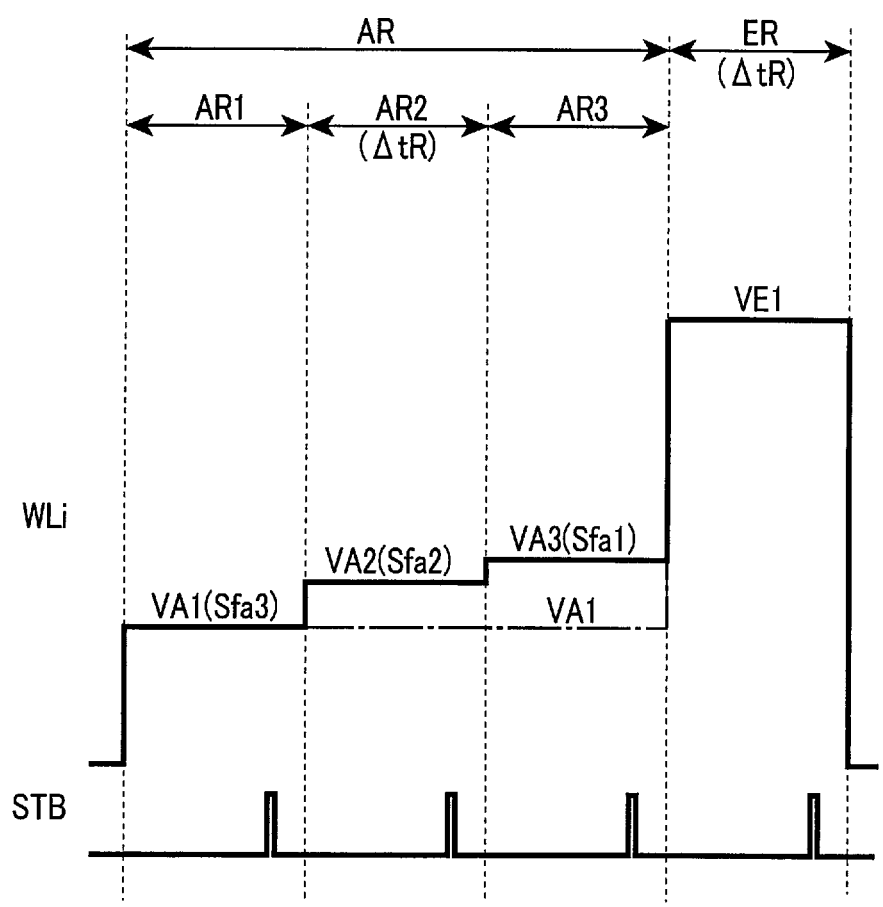
F I G. 58

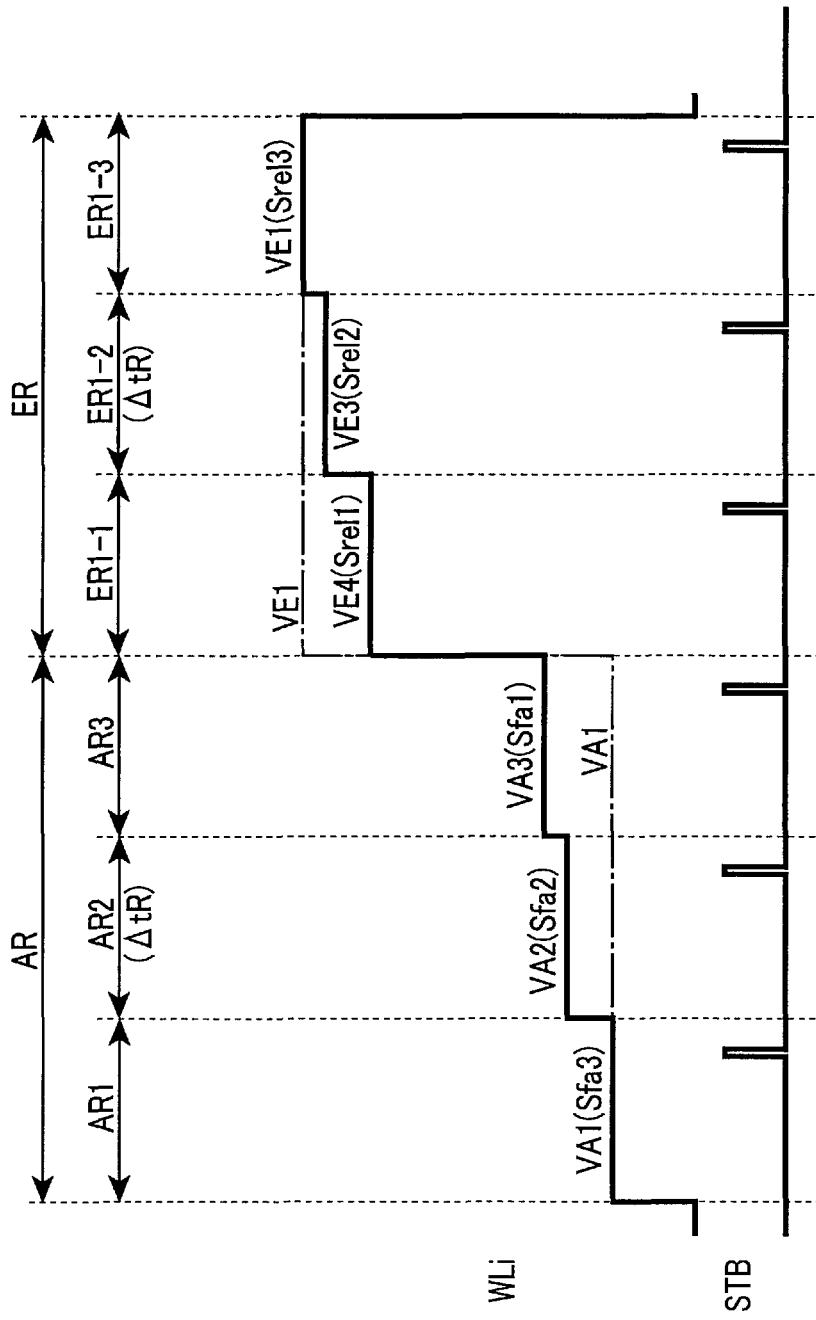
F I G. 59

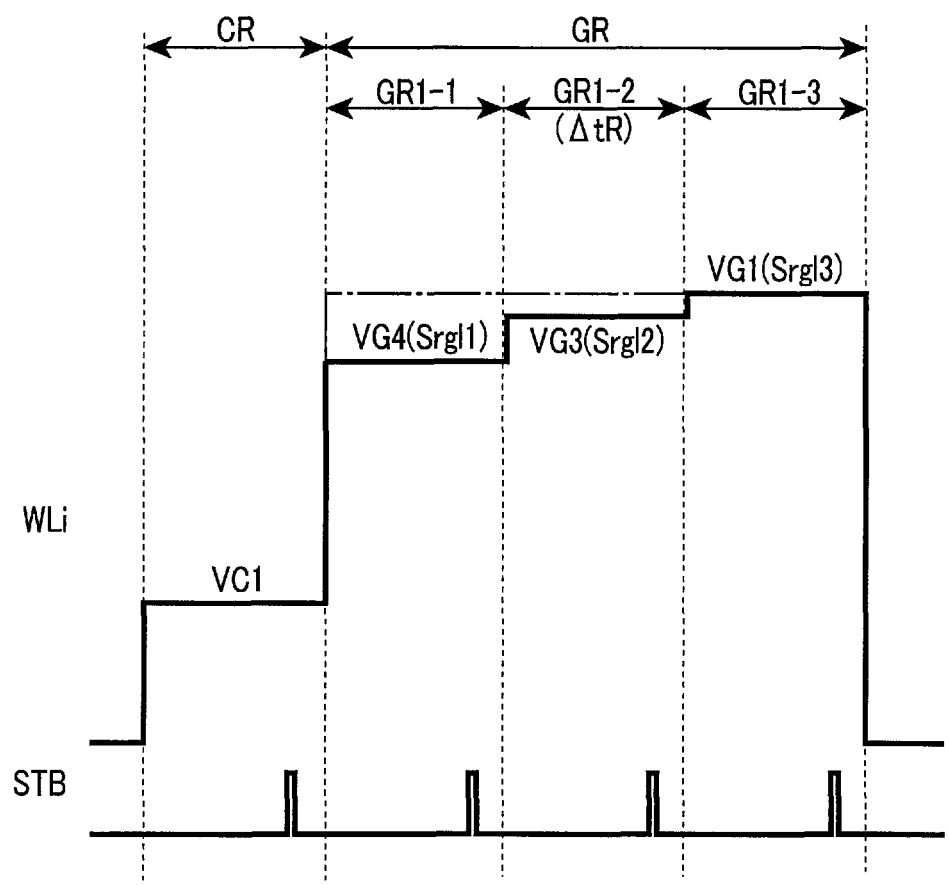
F I G. 60

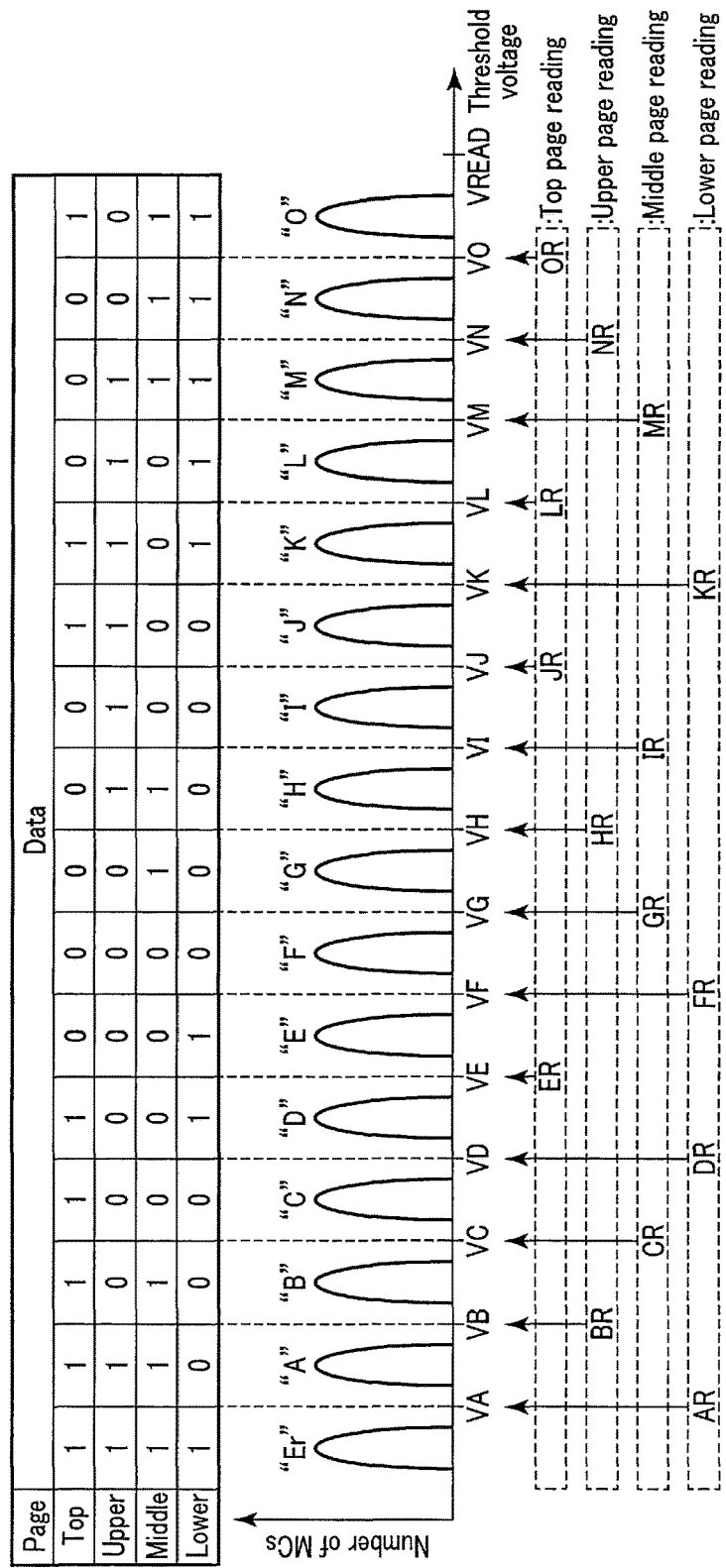
F I G. 61

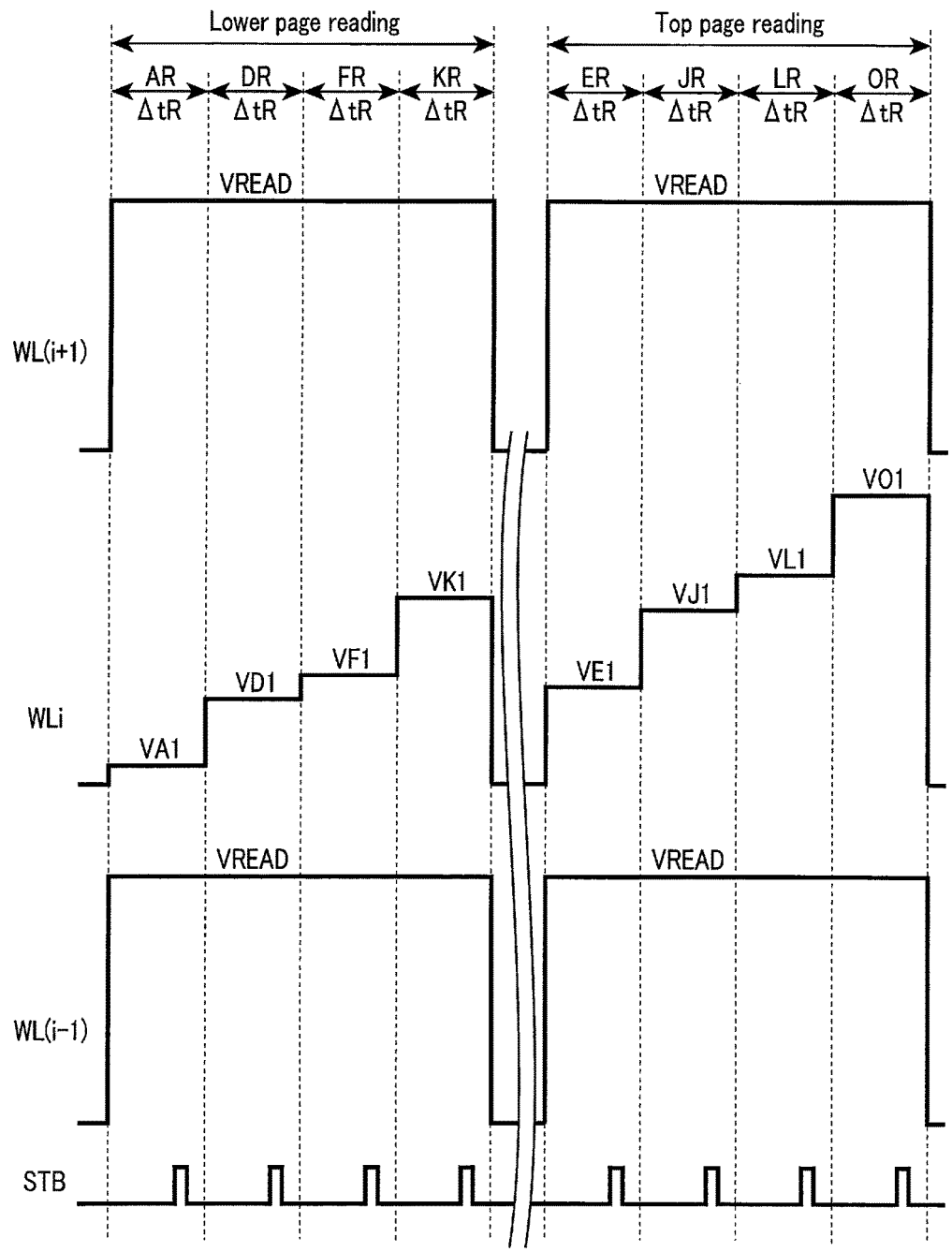
F I G. 62

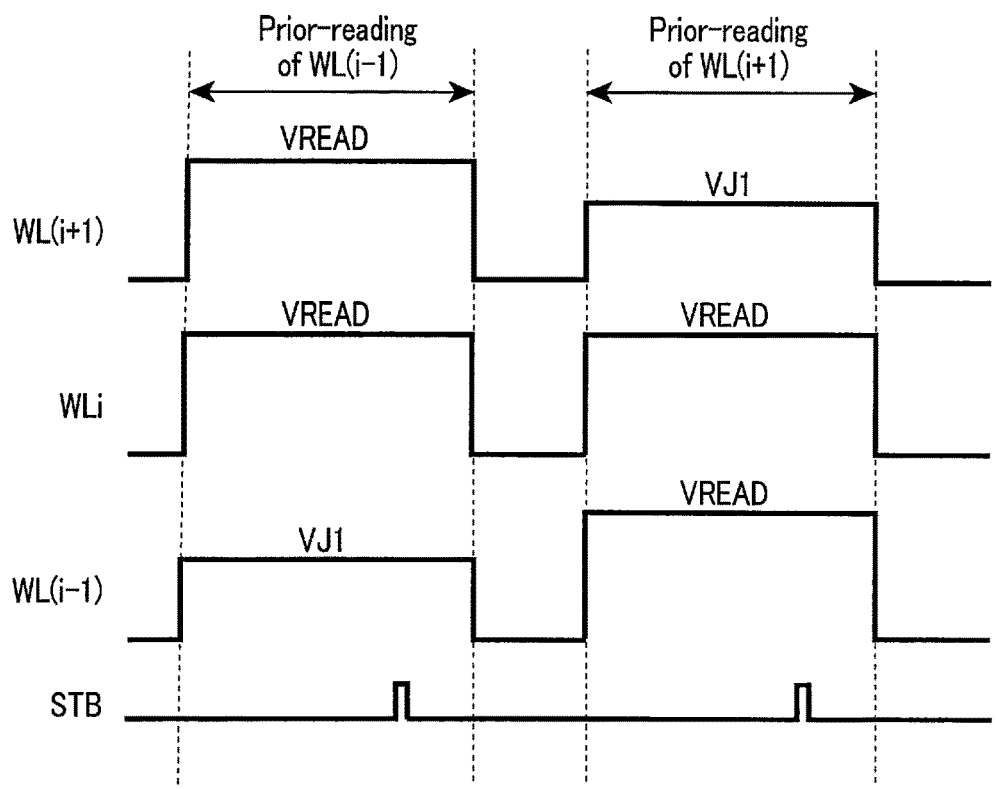
F I G. 63

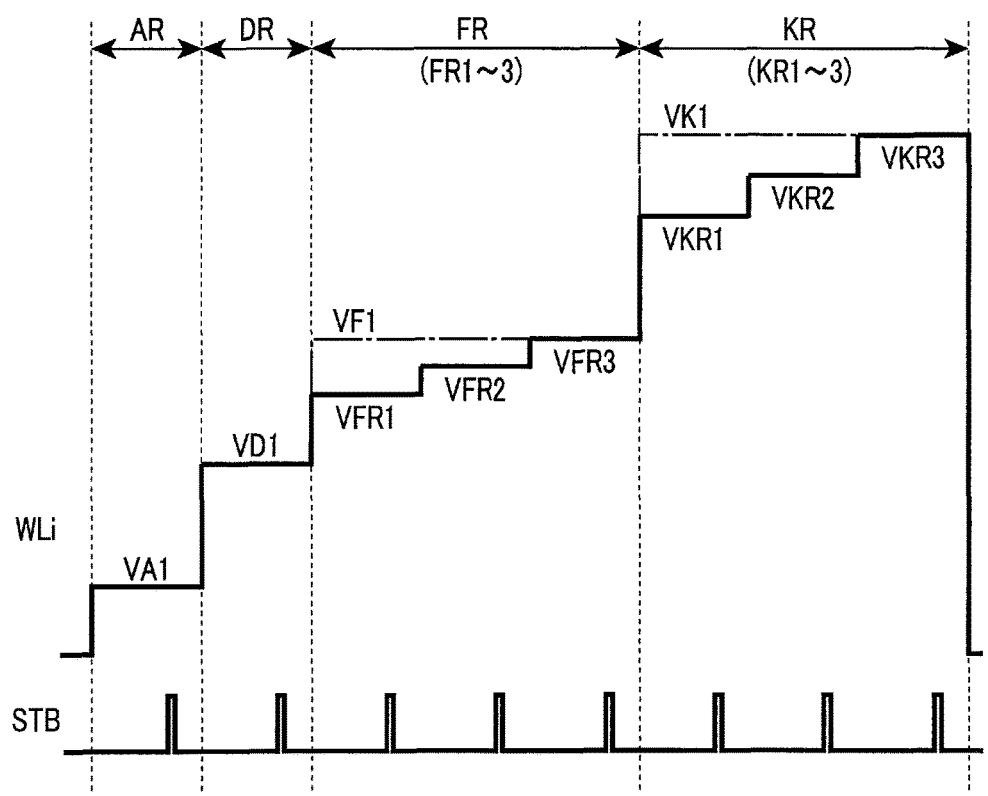
F I G. 67

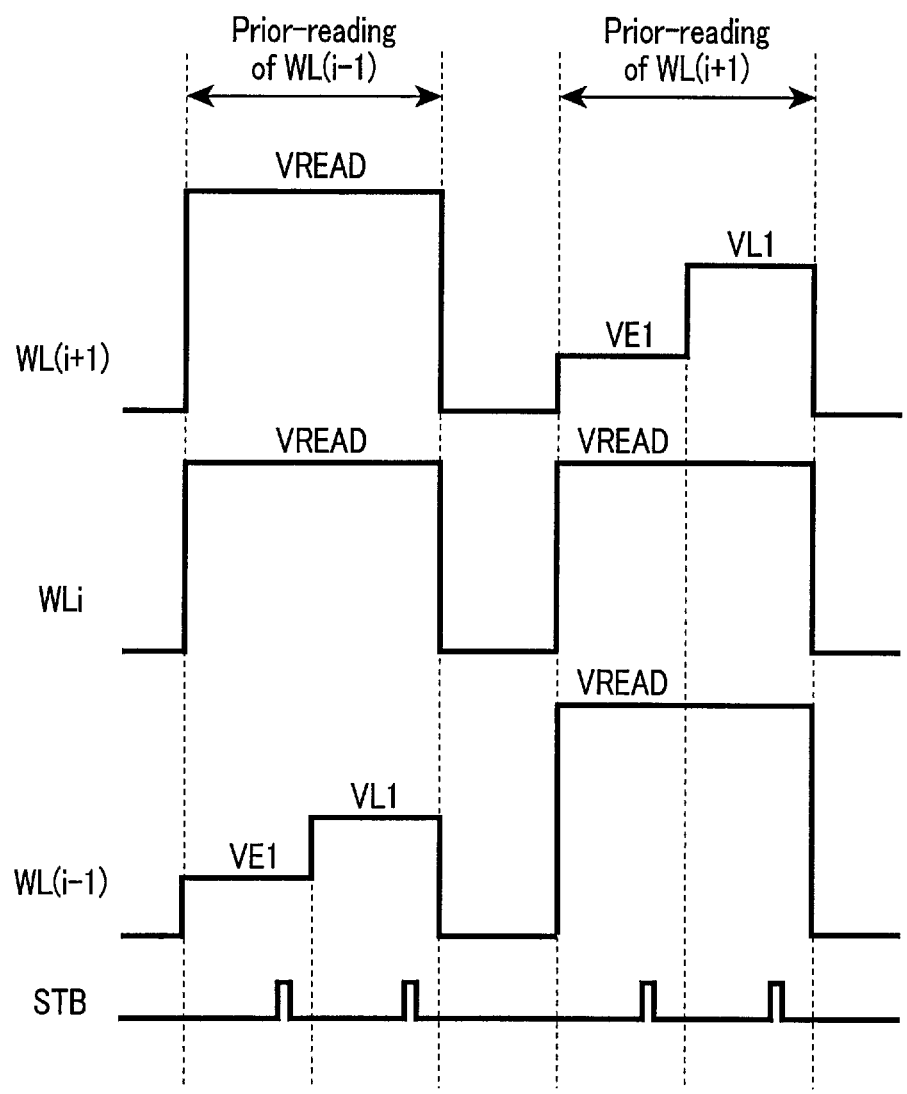
F I G. 72

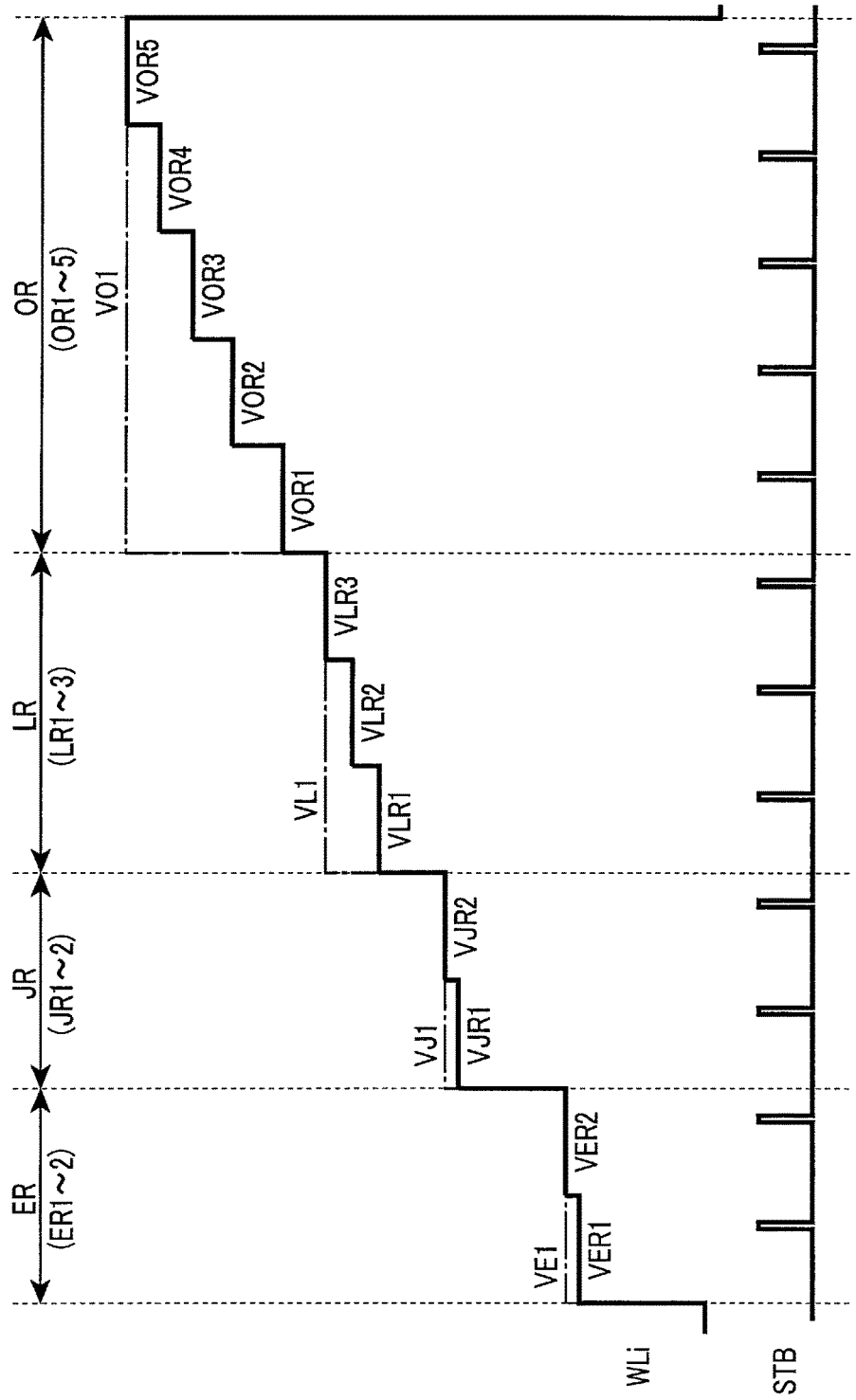
F I G. 73

MEMORY SYSTEM

CROSS-REFERENCE TO RELATED APPLICATIONS

This application is based upon and claims the benefit of priority from Japanese Patent Application No. 2017-059244, filed Mar. 24, 2017, the entire contents of which are incorporated herein by reference.

FIELD

Embodiments described herein relate generally to a memory system.

BACKGROUND

There is known a semiconductor memory in which memory cells are three-dimensionally arranged.

BRIEF DESCRIPTION OF THE DRAWINGS

FIG. 1 is a block diagram of a memory system according to the first embodiment;

FIGS. 2 and 3 are a circuit diagram and a sectional view, respectively, showing a block according to the first embodiment;

FIG. 5 is a schematic view of a shift table according to the first embodiment;

FIG. 6 is a schematic view of a writing method according to the first embodiment;

FIG. 8 is a timing chart of various signals in normal reading according to the first embodiment;

FIGS. 14 and 15 are schematic views showing the relationship between threshold voltages and a sectional view of a string unit;

FIGS. 16 and 17 are schematic views of grouping according to the second embodiment;

FIGS. 18 and 19 are timing charts of various signals in first calibrating reading according to the second embodiment;

FIGS. 21 to 23 are schematic views of grouping according to the third embodiment;

FIGS. 24 and 25 are timing charts of various signals in first calibrating reading according to the third embodiment;

FIGS. 26 to 28 are timing charts of various signals in second calibrating reading according to the third embodiment;

FIG. 29 is a schematic view of a writing method according to the fourth embodiment;

FIG. 30 is a timing chart of various signals in first calibrating reading according to the fourth embodiment;

FIGS. 31 and 32 are timing charts of various signals when the influence of a second inter-cell interference effect according to the fourth embodiment is taken into consideration;

FIG. 33 is a timing chart of various signals in second calibrating reading according to the fourth embodiment;

FIGS. 35 and 36 are timing charts of various signals when the influence of a second inter-cell interference effect according to the fifth embodiment is taken into consideration;

FIG. 39 is a timing chart of various signals in second calibrating reading according to the sixth embodiment;

FIGS. 40 and 41 are timing charts of various signals when the influence of a second inter-cell interference effect according to the sixth embodiment is taken into consideration;

FIGS. 42 and 43 are timing charts of various signals in second calibrating reading according to the sixth embodiment;

FIGS. 46 to 49 are schematic views of grouping according to the seventh embodiment;

FIG. 50 is a timing chart of various signals in first calibrating reading according to the seventh embodiment;

FIGS. 51 and 52 are timing charts of various signals in second calibrating reading according to the seventh embodiment;

FIGS. 53 to 55 are schematic views of grouping according to the seventh embodiment;

FIG. 58 is a timing chart of various signals in first calibrating reading according to the eighth embodiment;

FIGS. 59 and 60 are timing charts of various signals in second calibrating reading according to the eighth embodiment;

FIG. 61 is a graph showing the threshold distributions of a memory cell according to the ninth embodiment;

FIG. 62 is a timing chart of various signals in normal reading according to the ninth embodiment;

FIGS. 63 and 64 are timing charts of various signals in first calibrating reading according to the ninth embodiment;

FIGS. 66 and 67 are timing charts of various signals when the influence of a second inter-cell interference effect according to the ninth embodiment is taken into consideration;

FIGS. 72 and 73 are timing charts of various signals in second calibrating reading according to the ninth embodiment.

DETAILED DESCRIPTION

Figure 4:
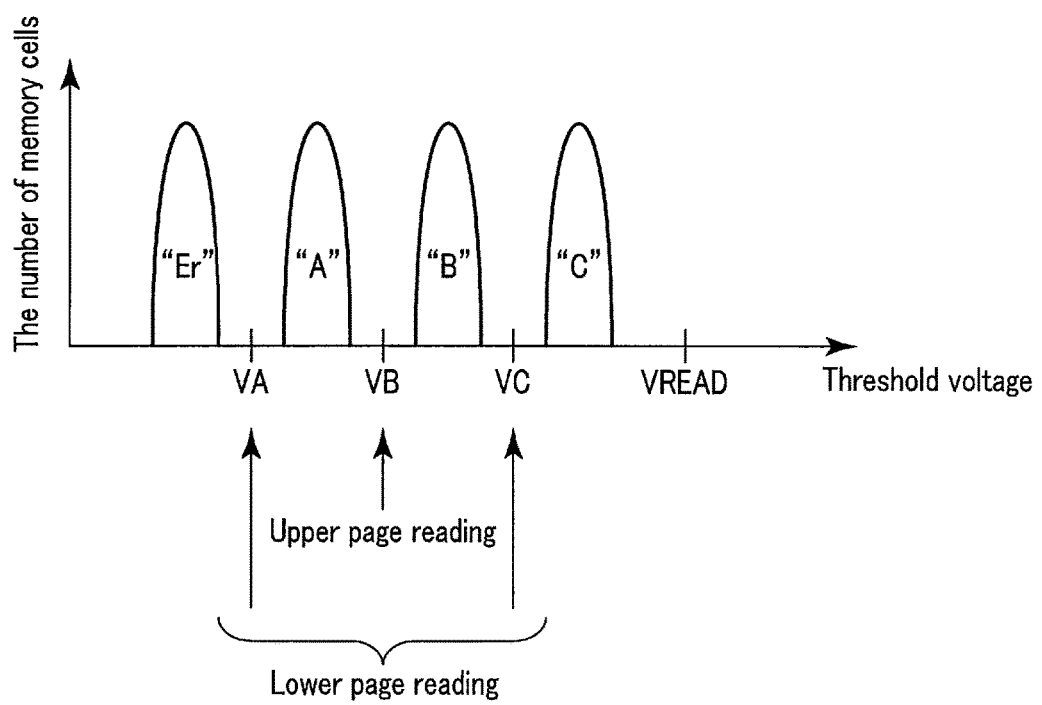
FIG. 4 is a graph showing the threshold distributions of a memory cell according to the first embodiment.

In general, according to one embodiment, a memory system includes: a semiconductor memory capable of reading data in units of page from memory cells; and a controller configured to control the semiconductor memory. The semiconductor memory is configured to execute a first reading operation, a second reading operation, and a third reading operation. The second reading operation is executed when the first reading operation is failed. The third reading operation is executed when the second reading operation is failed. In the first reading operation, a first voltage is applied to a selected word line of the semiconductor memory. In the second reading operation, a second voltage and a third voltage are applied sequentially. The second voltage is different from the first voltage. In the third reading operation, a fourth voltage and a fifth voltage are applied sequentially. The fourth voltage is different from the first to third voltages. An absolute value of difference between the second voltage and the fourth voltage is different from an absolute value of difference between the third voltage and the fifth voltage.

1. First Embodiment

A memory system according to the first embodiment will be described. A memory system including a NAND flash memory as a semiconductor storage device will be exemplified below.

1.1 Configuration 1.1.1 Overall Configuration of Memory System

An overall configuration of the memory system according to this embodiment will be described first with reference to FIG. 1.

As shown in FIG. 1, a memory system 1 includes a NAND flash memory 100 and a controller 200. The NAND flash memory 100 and the controller 200 may form one semiconductor device by, for example, a combination. Examples of the device may be a memory card such as an SD™ card and an SSD (Solid State Drive).

The NAND flash memory 100 includes a plurality of memory cells and nonvolatilely stores data. The controller 200 is connected to the NAND flash memory 100 by a NAND bus and connected to a host device 300 by a host bus. The controller 200 controls the NAND flash memory 100, and accesses the NAND flash memory 100 in response to instructions received from the host device 300. The host device 300 is, for example, a digital camera or a personal computer, and the host bus is, for example, a bus conforming to an SD™ interface. The NAND bus transmits/receives a signal according to the NAND interface.

1.1.2 Configuration of Controller 200

Details of the configuration of the controller 200 will be further described with reference to FIG. 1. As shown in FIG. 1, the controller 200 includes a host interface circuit 210, an internal memory (RAM) 220, a processor (CPU) 230, a buffer memory 240, a NAND interface circuit 250, and an ECC (Error Checking and Correcting) circuit 260.

The host interface circuit 210 is connected to the host device 300 via the host bus, and transfers instructions and data received from the host device 300 to the processor 230 and the buffer memory 240. The host interface circuit 210 also transfers data in the buffer memory 240 to the host device 300 in response to instructions from the processor 230.

The processor 230 controls the entire operations of the controller 200. For example, if a writing instruction is received from the host device 300, in response to the instruction, the processor 230 issues a writing instruction to the NAND interface circuit 250. Similar operations are performed in reading and erasing. The processor 230 also executes various kinds of processes such as wear leveling to manage the NAND flash memory 100.

The NAND interface circuit 250 is connected to the NAND flash memory 100 via the NAND bus, and controls communication with the NAND flash memory 100. Based on instructions received from the processor 230, the NAND interface circuit 250 transmits various signals to the NAND flash memory 100 and receives various signals from the NAND flash memory 100.

The buffer memory 240 temporarily holds write data or read data.

The internal memory 220 is, for example, a semiconductor memory such as a DRAM or an SRAM, and is used as the work space of the processor 230. The internal memory 220 holds firmware configured to manage the NAND flash memory 100 and various kinds of management tables.

The ECC circuit 260 performs error detection and error correction processes for data stored in the NAND flash memory 100. That is, at the time of data writing, the ECC circuit 260 generates an error-correcting code and adds it to the write data. At the time of data reading, the ECC circuit 260 decodes the read data.

1.1.3 Configuration of NAND Flash Memory 100

The configuration of the NAND flash memory 100 will be described next. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes a plurality of blocks BLK each including a plurality of nonvolatile memory cells associated with rows and columns. FIG. 1 shows four blocks BLK0 to BLK3 as an example. The memory cell array 110 stores data given by the controller 200.

The row decoder 120 selects one of the blocks BLK0 to BLK3, and further selects a row in the selected block BLK.

The driver circuit 130 applies voltages to the selected block BLK via the row decoder 120.

At the time of data reading, the sense amplifier 140 senses data read from the memory cell array 110 and performs necessary operations. The sense amplifier 140 outputs data DAT to the controller 200. At the time of data writing, the sense amplifier 140 transfers the write data DAT received from the controller 200 to the memory cell array 110.

The address register 150 holds an address ADD received from the controller 200. The command register 160 holds a command CMD received from the controller 200.

The sequencer 170 controls the entire operations of the NAND flash memory 100 based on the command CMD held by the command register 160.

The configuration of the block BLK will be described next with reference to FIG. 2. As shown in FIG. 2, the block BLK includes, for example, four string units SU (SU0 to SU3). Each string unit SU includes a plurality of NAND strings 10.

Each NAND string 10 includes, for example, eight memory cell transistors MT (MT0 to MT7) and select transistors ST1 and ST2. Each memory cell transistor MT includes a control gate and a charge accumulation layer, and nonvolatilely holds data. The memory cell transistors MT are connected in series between the source of the select transistor ST1 and the drain of the select transistor ST2.

The gates of the select transistors ST1 in the string units SU0 to SU3 are connected to select gate lines SGD0 to SGD3, respectively. On the other hand, the gates of the select transistors ST2 in the string units SU0 to SU3 are commonly connected to, for example, a select gate line SGS. The gates of the select transistors ST2 may be connected to different select gate lines SGS0 to SGS3 in each string unit, as a matter of course. The control gates of the memory cell transistors MT0 to MT7 in the same block BLK are commonly connected to word lines WL0 to WL7, respectively.

The drains of the select transistors ST1 of the NAND strings 10 on the same column in the memory cell array 110 are commonly connected to a bit line BL (one of BL0 to BL(L−1), where (L−1) is a natural number of 2 or more). That is, the bit lines BL commonly connect the NAND strings 10 across the plurality of blocks BLK. The sources of the select transistors ST2 are commonly connected to a source line SL.

That is, the string unit SU includes a plurality of NAND strings 10 connected to different bit lines BL and connected to the same select gate line SGD. The block BLK includes a plurality of string units SU that share the word lines WL. The memory cell array 110 includes a plurality of blocks BLK that share the bit lines BL.

FIG. 3 is a sectional view of a partial region of the block BLK. As shown in FIG. 3, the plurality of NAND strings 10 are formed on a p-type well region 20. That is, for example, four interconnect layers 27 functioning as the select gate lines SGS, eight interconnect layers 23 functioning as the word lines WL0 to WL7, and, four, for example, interconnect layers 25 functioning as the select gate lines SGD are stacked over the well region 20 in turn. Insulating films (not shown) are formed between the stacked interconnect layers.

Pillar-shaped conductors 31 extending through the interconnect layers 25, 23, and 27 and reaching the well region 20 are formed. Gate insulating films 30, charge accumulation layers (insulating films) 29, and block insulating films 28 are formed in turn on the side surfaces of the conductors 31. The memory cell transistors MT and the select transistors ST1 and ST2 are thus formed. Each conductor 31 is a region which functions as a current path of the NAND string 10 and in which the channels of the transistors are formed. The upper ends of the conductors 31 are connected to a metal interconnect layer 32 functioning as the bit line BL.

An n$^+$-type impurity diffusion layer 33 is formed in the surface region of the well region 20. A contact plug 35 is formed on the diffusion layer 33. The contact plug 35 is connected to a metal interconnect layer 36 functioning as the source line SL. In addition, a p$^+$-type impurity diffusion layer 34 is formed in the surface region of the well region 20. A contact plug 37 is formed on the diffusion layer 34. The contact plug 37 is connected to a metal interconnect layer 38 functioning as a well interconnect CPWELL. The well interconnect CPWELL is an interconnect used to apply a potential to the conductors 31 via the well region 20.

A plurality of configurations described above are arranged in the depth direction of the sheet of FIG. 3. Each string unit SU is formed as a group of the plurality of NAND strings 10 arranged in the depth direction.

In this example, one memory cell transistor MT may hold, for example, 2-bit data. The bits of the 2-bit data will be referred to as a lower bit and an upper bit from the lower side. As held by memory cells connected to the same word line in the same selected string unit SU, a group of lower bits will be referred to as a lower page, and a group of upper bits will be referred to as an upper page. That is, two pages are assigned to one word line WL, and one block BLK including eight word lines WL has a capacity of 16 pages. In other words, "page" may be defined as a part of a memory space formed by memory cells connected to the same word line. Writing and reading of data is done on a page basis.

FIG. 4 is a graph showing threshold distributions that the memory cell transistor MT may take and voltages used at the time of reading.

As described above, the memory cell transistor MT may take 2-bit data in accordance with the threshold voltage. Data expressed by 2 bits will be referred to as "Er" level, "A" level, "B" level, and "C" level sequentially in ascending order of threshold voltage.

The threshold voltage of the memory cell transistor MT that holds the "Er" level is lower than a voltage VA, and this state corresponds to a data erasing state. The threshold voltage of the memory cell transistor MT that holds the "A" level is higher than the voltage VA and lower than VB (>VA). The threshold voltage of the memory cell transistor MT that holds the "B" level is higher than the voltage VB and lower than VC (>VB). The threshold voltage of the memory cell transistor MT that holds the "C" level is higher than the voltage VC and is lower than VREAD. Of the 2-bit data, the "C" level corresponds to data of the highest threshold voltage.

The above-described lower page is read using, for example, the voltages VA and VC as reading voltages. Operations of reading data by applying the voltages VA and VC will be referred to as reading operations AR and CR, respectively. That is, by the reading operation AR, whether held data is the "Er" level or one of the "A" to the "C" levels is specified. In addition, by the reading operation CR, whether held data is the "C" level or one of the "Er" to the "B" levels is specified. The upper page is read using the voltage VB. This will be referred to as a reading operation BR. By the reading operation BR, which of the "Er" to the "A" levels or the "B" to the "C" levels are levels holding data is specified.

Note that data erasing may be done for each block BLK or in a unit smaller than the block BLK. An erasing method is described in, for example, U.S. patent application Ser. No. 13/235,389 "NONVOLATILE SEMICONDUCTOR MEMORY DEVICE" filed on Sep. 18, 2011. An erasing method is also described in, for example, U.S. patent application Ser. No. 12/694,690 "NON-VOLATILE SEMICONDUCTOR STORAGE DEVICE" filed on Jan. 27, 2010. An erasing method is also described in, for example, U.S. patent application Ser. No. 13/483,610 "NONVOLATILE SEMICONDUCTOR MEMORY DEVICE AND DATA ERASE METHOD THEREOF" filed on May 30, 2012. These patent applications are incorporated by reference in this specification in their entirety.

The memory cell array 110 may have another configuration. That is, a configuration of the memory cell array 110 is described in, for example, U.S. patent application Ser. No. 12/407,403 "THREE DIMENSIONAL STACKED NONVOLATILE SEMICONDUCTOR MEMORY" filed on Mar. 19, 2009. Configurations are also described in U.S. patent application Ser. No. 12/406,524 "THREE DIMENSIONAL STACKED NONVOLATILE SEMICONDUCTOR MEMORY" filed on Mar. 18, 2009, U.S. patent application Ser. No. 12/679,991 "NON-VOLATILE SEMICONDUCTOR STORAGE DEVICE AND METHOD OF MANUFACTURING THE SAME" filed on Mar. 25, 2010, and U.S. patent application Ser. No. 12/532,030 "SEMICONDUCTOR MEMORY AND METHOD FOR MANUFACTURING SAME" filed on Mar. 23, 2009. These patent applications are incorporated by reference in this specification in their entirety.

1.1.4 Shift Table

The controller 200 holds a shift table. The schematic structure of the shift table will be described with reference to FIG. 5. As shown in FIG. 5, the shift table includes a 1-month lapse table, 2-month lapse table, . . . , m-month lapse table. Here, m is a natural number of 2 or more.

Each table holds a shift amount from a default voltage applied to a selected word line in repeating the reading operations AR, CR and/or BR a plurality of times. For example, in the example of FIG. 5, if data may not properly be read by a reading operation AR1, a reading operation AR2 is executed, and so on. This also applies to the reading operations BR and CR.

The 1-month lapse table holds information representing that the voltage applied to the selected word line in the reading operation AR1 has a value shifted from the default reading voltage (for example, VA1) by a voltage S1_A1. The shift amount from the default voltage in the reading operation AR2 is a voltage S1_A2. Similar information is held for the reading operations CR and BR. The shift amount is information representing a voltage considered to be appropriate in reading data written in the memory cell transistor MT one month ago.

Hence, the 2-month lapse table holds information representing a voltage considered to be appropriate in reading data written in the memory cell transistor MT two months ago, and the m-month lapse table holds information representing a voltage considered to be appropriate in reading data written in the memory cell transistor MT m months ago. Here, m is a natural number of 2 or more.

Note that the shift amounts held by the shift table may be either a positive value or a negative value. Optimum shift amounts are held depending on situations. In addition, the information held by the shift table may include at least information representing a voltage to be applied to the selected word line. This information may include not only a shift amount from a default value used in normal reading but also a shift amount from a voltage value used in, for example, first calibrating reading to be described later. Alternatively, it may include information representing the very value of a voltage to be applied to the selected word line in each reading operation.

The shift table is held in, for example, the memory cell array 110 of the NAND flash memory 100. At the time of reading operation, the shift table is read from the memory cell array 110 and transferred to the controller 200, as needed. The controller 200 holds the received shift table in, for example, the internal memory 220. In read-accessing of the NAND flash memory 100, an instruction is issued referring to the shift table. The information of the shift table may be updated in accordance with an instruction from the host device 300 or autonomously by the controller 200.

1.2 Writing Operation

A data writing operation according to this embodiment will be described briefly with reference to FIG. 6. FIG. 6 shows a variation in the threshold voltage in data writing according to this embodiment. Data writing includes a programming operation of changing the threshold using a voltage VPGM to the selected word line, and a program-verifying operation of confirming whether the threshold has risen to a target level.

In this example, program-verifying levels used when writing the "A" level, the "B" level, and the "C" level are regularly VfyA, VfyB, and VfyC, respectively. On this point, when writing data, a method using, for example, two program-verifying levels for each write data may also be considered. That is, as the first writing operation, a level lower than the target level is used first. After the threshold voltage reaches that level, the target level is then used.

In this example, however, a plurality of program-verifying levels are not used for each write data. Instead, data is written using one program-verifying level. This method will be referred to as a batch writing method or a first writing method. On the other hand, the method using two program-verifying levels will be referred to as a two-step writing method or a second writing method. The second writing method will be described in detail in the fourth embodiment.

1.3 Reading operation

Figure 7:
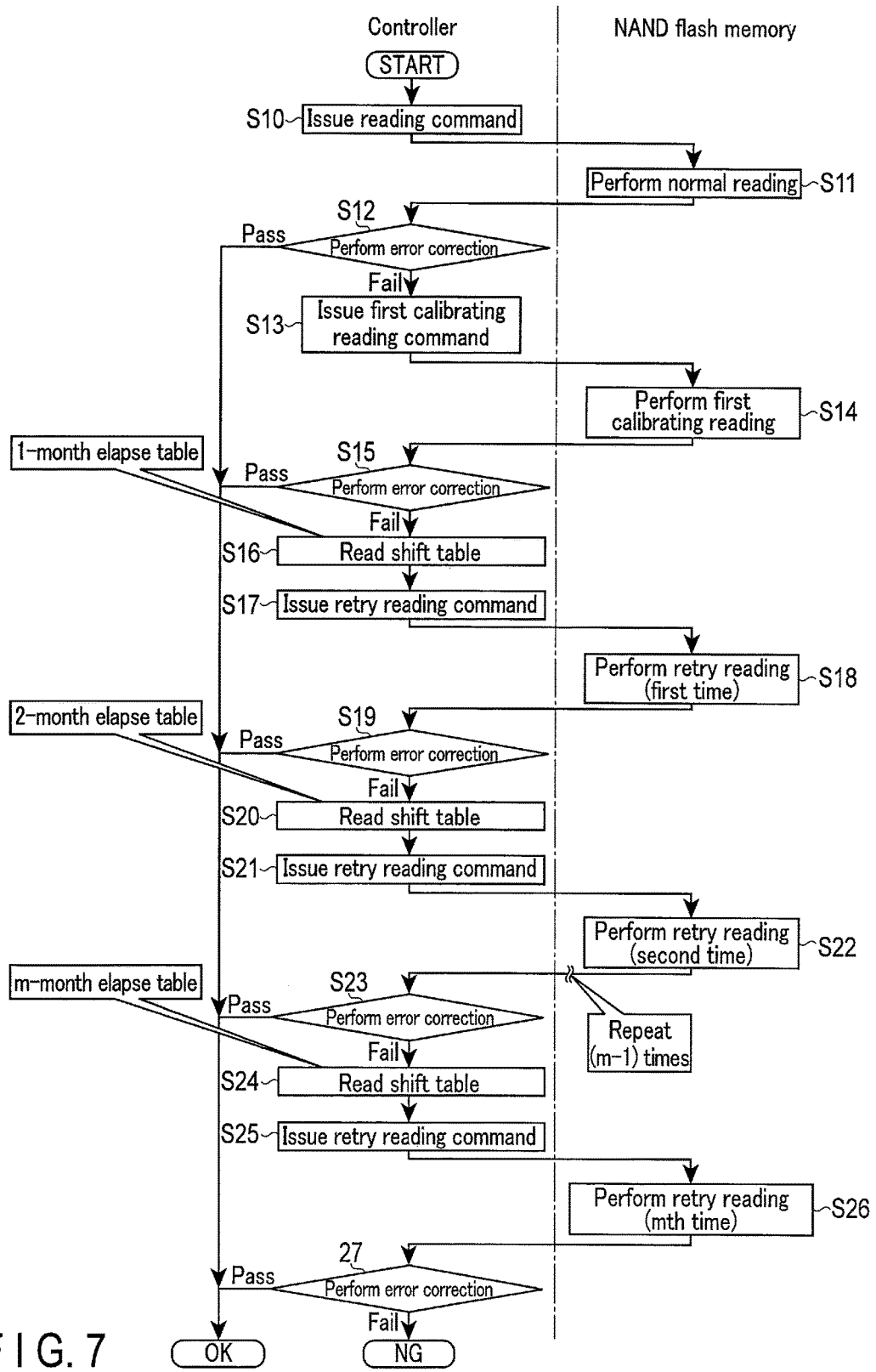
FIG. 7 is a flowchart showing a reading method according to the first embodiment.

A data reading operation according to this embodiment will be described next. FIG. 7 is a flowchart of a reading operation. Note that in FIG. 7, the operation of the NAND flash memory 100 is executed by, for example, control of the sequencer 170, and the operation of the controller 200 is executed by, for example, control of processor 230.

<First Step>

First, the processor 230 of the controller 200 issues a reading command in response to an instruction from the host device 300, and transmits the command to the NAND flash memory 100 (step S10).

The reading command is stored in, for example, the address register 150 of the NAND flash memory 100. In response to this, the sequencer 170 executes normal reading (step S11). That is, the sequencer 170 controls the driver circuit 130, the row decoder 120, the sense amplifier 140, and the like and applies voltages shown in FIG. 8 to the selected word line and unselected word lines. FIG. 8 shows changes of a voltage applied to a selected word line WLi (i is a natural number), voltages applied to an unselected word line WL(i−1) adjacent on the source side and an unselected word line WL(i+1) adjacent on the drain side, and a signal STB applied to the sense amplifier 140 over time. The signal STB is a strobe signal used to cause the sense amplifier 140 to sample data read from the memory cell transistor MT to the bit line BL.

As shown in FIG. 8, in the lower page reading, the voltage of the selected word line WLi is stepped up to a voltage VA1 and a voltage VC1. The voltage VA1 is applied in the reading operation AR, and the voltage VC1 is applied in the reading operation CR. The voltages VA1 and VC1 are default values of the reading voltages in the reading operations AR and CR. The voltage VREAD is applied to the unselected word lines. The voltage VREAD is a voltage that turns on the memory cell transistor MT independently of held data.

In the upper page reading, a voltage VB1 is applied to the selected word line WLi. The voltage VB1 is a default value of a reading voltage in the reading operation BR. The voltage VREAD is applied to the unselected word lines.

The data read in step S11 is held by, for example, the buffer memory 240 of the controller 200 via the NAND interface. The ECC circuit 260 checks the presence/absence of errors in the read data, and if any error exists, attempts to correct it (step S12). If the error may be corrected (pass in step S12), the data reading operation from the page ends.

On the other hand, if the number of errors is large, and the errors may not be corrected (fail in step S12), the processor 230 of the controller 200 issues a first calibrating reading command (step S13). The first calibrating reading command is stored in, for example, the address register 150 of the NAND flash memory 100. In response to this, the sequencer 170 executes first calibrating reading (step S14). The first calibrating reading is at the second step of the reading operation.

<Second Step>

The first calibrating reading will briefly be described. The first calibrating reading is a reading method that considers the influence of a first inter-cell interference effect and aims at canceling this. The first inter-cell interference effect is an effect caused by an amount of a threshold variation of a memory cell transistor MT(i−1) and/or MT(i+1) adjacent to a certain memory cell transistor MTi after the memory cell transistor MTi passes program verifying. As a result, the threshold voltage of the memory cell transistor MTi will shift in a higher-voltage direction.

More specifically, for example, the threshold voltage of the memory cell transistor MTi to which the "Er" level is written will not substantially change before and after passing program verifying. For this reason, it is influenced by the threshold variations of both the word lines WL(i−1) and WL(i+1). That is, as a result of writing to the word line WL(i−1), the threshold voltage of the memory cell transistor MT(i−1) varies, and thereby, the threshold voltage of the memory cell transistor MTi rises. In addition, as a result of writing to the word line WL(i+1), the threshold voltage of the memory cell transistor MT(i+1) varies, and the threshold voltage of the memory cell transistor MTi further rises.

On the other hand, in the first writing method explained with reference to FIG. 6, the effect from the word line WL(i−1) to the memory cell transistor MTi that passes program verifying of "A" level or higher may be neglected. This is because the memory cell transistor MTi is programmed in a state in which its threshold voltage has risen due to the effect of the word line WL(i−1), and programmed up to the threshold voltage of the "A" level or higher. However, the memory cell transistor MTi is effected by the word line WL(i+1).

A reading operation of calibrating the effect on the threshold variation as described above is first calibrating reading. Note that the amount of the threshold variation of the memory cell transistor MTi that is going to read data changes depending on the relationship between the held data of the memory cell transistor MTi and the held data of the memory cell transistors MT(i−1) and MT(i+1) adjacent on the source and drain sides. For example, the lower the threshold voltage of the memory cell transistor MTi of the reading target is (the "Er" level), or the higher the threshold voltage of the adjacent memory cell transistor MT(i−1) and/or MT(i+1) is, the larger the amount of the threshold voltage variation of the memory cell transistor MTi tends to be.

In the first calibrating reading, data are read from the memory cell transistors MT(i−1) and MT(i+1) connected to the two unselected word lines WL(i−1) and WL(i+1) adjacent to the selected word line WLi. This reading will be referred to as pre-reading or prior-reading. According to the held data of the memory cell transistors MT(i−1) and MT(i+1) connected to the unselected word lines WL(i−1) and WL(i+1), a voltage appropriate to the reading voltage to be applied to the selected word line WLi is used. The data reading operation using such a reading voltage will be referred to as main-reading.

Figure 9:
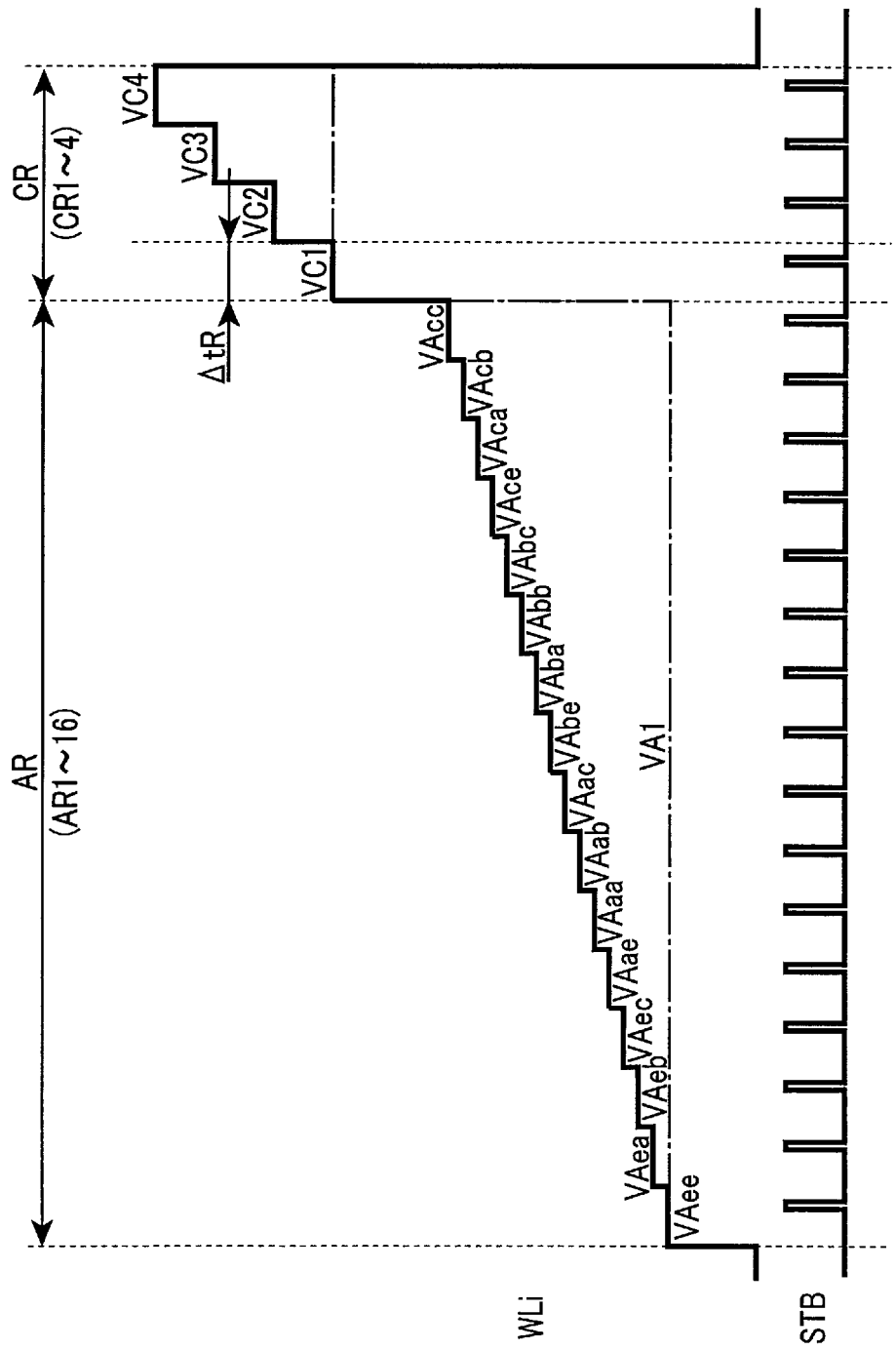
FIG. 9 is a timing chart of various signals in first calibrating reading according to the first embodiment.

FIG. 9 is a timing chart of the voltage applied to the selected word line WLi in the main-reading of the first calibrating reading and the signal STB. FIG. 9 shows the lower page reading, and the voltages VA1 and VC1 to be used in the normal reading are shown for reference by one-dot dashed lines.

The reading operation AR will be described first. As shown in FIG. 9, in the reading operation AR, the voltage applied to the selected word line WLi is stepped up to 16 steps. Data is sampled by means of the strobe signal for each of the voltages with 16 steps, and the operations will be referred to as reading operations AR1 to AR16.

In the reading operation AR1 executed first, a voltage VAee is applied to the selected word line WLi. In the reading operation AR1, data is sampled by means of the strobe signal on a bit line in which both of the memory cell transistors MT connected to the word lines WL(i−1) and WL(i+1) have the threshold of the "Er" level by the prior reading.

In the reading operation AR2 executed next, a voltage VAea is applied to the selected word line WLi. In the reading operation AR2, data is sampled by means of the strobe signal on a bit line in which the memory cell transistors MT connected to the word lines WL(i−1) and WL(i+1) have the thresholds of the "Er" level and the "A" level by the prior reading, respectively.

In this way, 16 different combinations exist depending on the data held by the memory cell transistors MT connected to the word lines WL(i−1) and WL(i+1). Hence, in the first calibrating reading, data is sampled by means of the strobe signal in a state in which an appropriate voltage is applied to the selected word line WLi in each operation. The voltage applied to the selected word line WLi in each operation and the conditions of the memory cell transistor that is an object of the strobe signal at that time are as follows.

AR3=voltage VAeb: WL(i−1)="Er", WL(i+1)="B"
AR4=voltage VAec: WL(i−1)="Er", WL(i+1)="C"
AR5=voltage VAae: WL(i−1)="A", WL(i+1)="Er"
AR6=voltage VAaa: WL(i−1)="A", WL(i+1)="A"
AR7=voltage VAab: WL(i−1)="A", WL(i+1)="B"
AR8=voltage VAac: WL(i−1)="A", WL(i+1)="C"
AR9=voltage VAbe: WL(i−1)="B", WL(i+1)="Er"
AR10=voltage VAba: WL(i−1)="B", WL(i+1)="A"
AR11=voltage VAbb: WL(i−1)="B", WL(i+1)="B"
AR12=voltage VAbc: WL(i−1)="B", WL(i+1)="C"
AR13=voltage VAce: WL(i−1)="C", WL(i+1)="Er"
AR14=voltage VAca: WL(i−1)="C", WL(i+1)="A"
AR15=voltage VAcb: WL(i−1)="C", WL(i+1)="B"
AR16=voltage VAcc: WL(i−1)="C", WL(i+1)="C"

In the example of FIG. 9, assuming as follows: VAee<VAea<VAeb<VAec<VAae<VAaa<VAab<VAac< VAbe<VAba<VAbb<VAbc<VAce<VAca<VAcb<VAcc.

VAee is the minimum, and VAcc is the maximum. This is because if both the memory cell transistors MT(i−1) and MT(i+1) adjacent to the memory cell transistors MT(i) have the "Er" level, the memory cell transistor MTi is not substantially effected by the first inter-cell interference effect, and a threshold variation unlikely occurs. Hence, VAee may equal VA1. This is also because if both the adjacent memory cell transistors MT(i−1) and MT(i+1) have the "C" level, the first inter-cell interference effect is very large, and the threshold voltage is considered to largely vary to the high voltage side.

Note that the magnitudes of the voltages other than VAee and VAcc are not limited to the above-described example, and may appropriately be selected. For example, the voltage VAac may be higher than the voltage VAbe, or the voltage VAbc may be higher than the voltage VAce.

The reading operation CR will be described next. As shown in FIG. 9, in the reading operation CR, the voltage applied to the selected word line WLi is stepped up with four steps. Data is sampled by means of the strobe signal for each of the voltages of four steps, and the operations will be referred to as reading operations CR1 to CR4. As described above, the first inter-cell interference effect from the word line WL(i−1) is taken into consideration only when the memory cell transistor MTi holds the "Er" level. Hence, in the reading operation CR, it is sufficient to consider the effect from the word line WL(i+1) on the drain side. Hence, the number of voltage variation steps may be 4.

The voltage applied to the selected word line WLi in each operation and the conditions of the memory cell transistor that is an object of the strobe signal at that time is as follows.

CR1=voltage VC1: WL(i−1)="*", WL(i+1)="Er"
CR2=voltage VC2: WL(i−1)="*", WL(i+1)="A"
CR3=voltage VC3: WL(i−1)="*", WL(i+1)="B"
CR4=voltage VC4: WL(i−1)="*", WL(i+1)="C"

Additionally, provided that VC1<VC2<VC3<VC4. In the reading operation CR1, the default voltage VC1 is used because the memory cell transistor MT(i+1) adjacent on the drain side holds the "Er" level, and therefore, the memory cell transistor MTi is not substantially effected by the first inter-cell interference effect. In addition, the symbol "*" used above denotes that the threshold of the memory cell transistor MT(i−1) adjacent on the source side may be any of the "Er", "A", "B", and "C" levels.

As such, the data read by the first calibrating reading is transferred to the controller 200, and an attempt of error correction is made (step S15). If the first calibrating reading cannot correct the error(s) (fail in step S15), the processor 230 of the controller 200 executes retry reading using the shift table. This is the third step.

<Third Step>

In the third step, the processor 230 of the controller 200 reads the shift table described with reference to FIG. 5 from the NAND flash memory 100 (step S16). The 1-month lapse table is read first. The processor 230 issues a retry reading command to read data by shifting the reading voltage in accordance with the shift amount in the 1-month lapse table (step S17). The retry reading command is stored in, for example, the address register 150 of the NAND flash memory 100. In response to this, the sequencer 170 executes the retry reading (step S18). The retry reading is the third step.

The retry reading according to this embodiment will briefly be described. The retry reading according to this example is a reading method considering a second inter-cell interference effect in addition in the first inter-cell interference effect described concerning the second step, and may be referred to as second calibrating reading.

In the NAND flash memory that uses an insulating film as the charge accumulation layer, the adjacent memory cell transistors MT and the charge accumulation layer may be connected (see FIG. 3). In this case, as a long time elapses after data is written, electrons injected into the charge accumulation layer diffuse or move to the channel, and as a result, the threshold voltage may lower, unlike the first inter-cell interference effect. This is called the second inter-cell interference effect. The degree of the effect, which changes depending on held data, is larger for the memory cell transistor MT having a higher threshold voltage. That is, since the threshold voltage of the memory cell transistor of the "C" level is high, it tends to shift to the negative voltage side. Hence, in the second calibrating reading (main-reading), a voltage taken in consideration of the second inter-cell interference effect in addition to the first inter-cell interference effect is used as a reading voltage.

Figure 10:
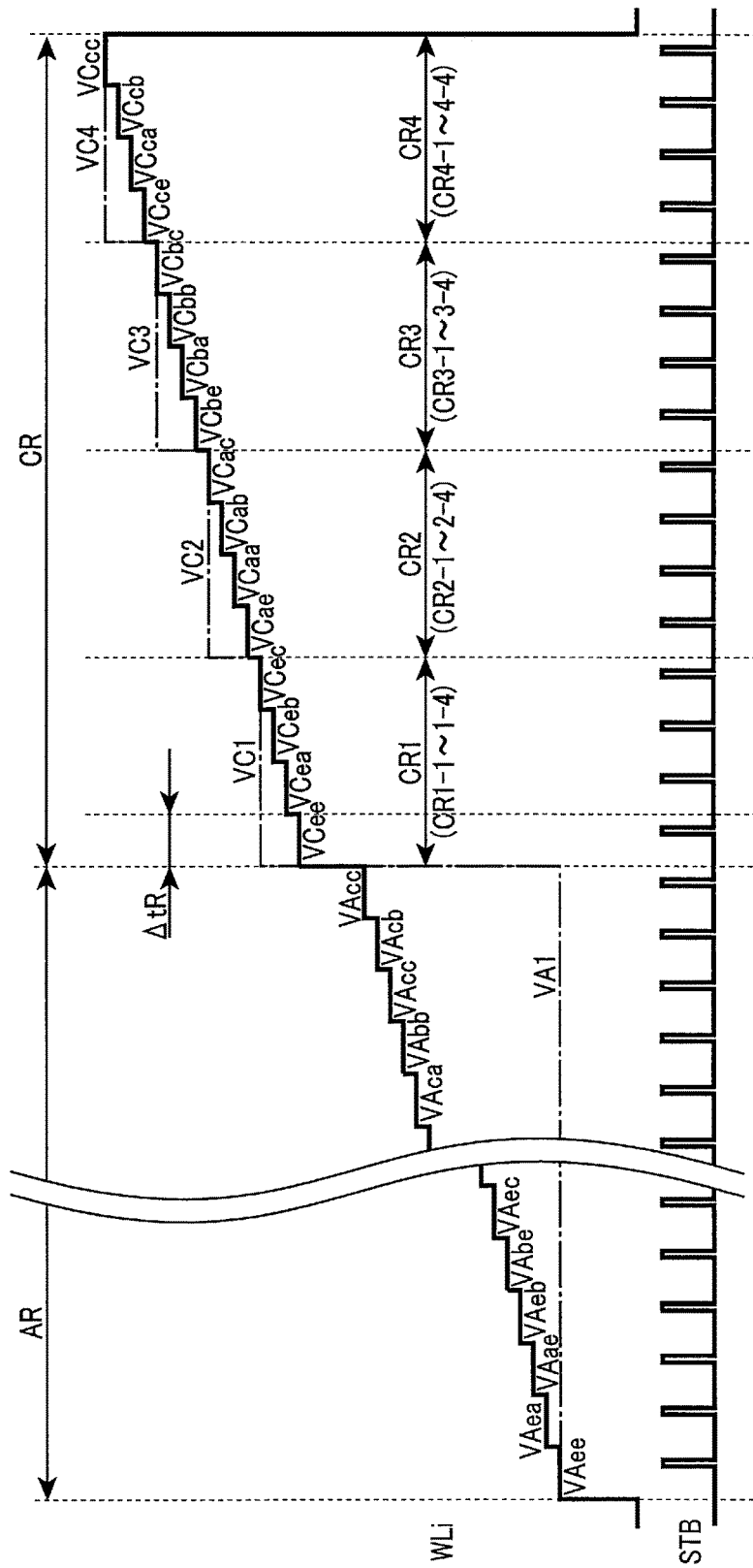
FIGS. 10 and 11 are timing charts of various signals in second calibrating reading according to the first embodiment.

FIG. 10 is a timing chart of the signal STB and the voltage applied to the selected word line WLi in the main-reading of the second calibrating reading. FIG. 10 shows the lower page reading, and the voltages VA1 and VC1 to VC4 to be used in the first calibrating reading are shown for reference by one-dot dashed lines.

The reading operation AR will be described first. As shown in FIG. 10, the reading operation AR is the same as in the first calibrating reading. This is because since the memory cell transistor MT of the "Er" level is specified, the memory cell transistor MT is considered to be insignificantly effected by the second inter-cell interference effect.

The reading operation CR will be described next. As shown in FIG. 10, each of the reading voltages VC1 to VC4 in the first calibrating reading is stepped down in a stepwise fashion of four steps. Hence, in the entire reading operation CR, the reading voltages are stepped up with 16 steps. Data is sampled by means of the strobe signal at each of the 16 steps of the reading voltages. Operations of applying the voltages in the four steps in the reading operation CR1 of the second calibrating reading will be referred to as reading operations CR1-1 to CR1-4 hereinafter. In addition, operations of applying the voltages in four steps in the reading operation CR2 of the second calibrating reading will be referred to as reading operations CR2-1 to CR2-4. Similarly, the reading operation CR3 includes CR3-1 to CR3-4, and the reading operation CR4 includes CR4-1 to CR4-4.

In the reading operation CR1-1 executed first, a voltage VCee is applied to the selected word line WLi. The voltage VCee has a value shifted from, for example, the default voltage VC1 by a shift amount S1_C1 designated in the 1-month lapse table shown in FIG. 5. In the reading operation CR1-1, data is sampled by means of the strobe signal on a bit line in which both of the memory cell transistors MT(i−1) and MT(i+1) connected respectively to the word lines WL(i−1) and WL(i+1) have the threshold of the "Er" level by the prior reading.

In the reading operation CR1-2 executed next, a voltage VCea is applied to the selected word line WLi. In the reading operation CR1-2, data is sampled by means of the strobe signal on a bit line in which the memory cell transistors MT(i−1) and MT(i+1) connected to the word lines WL(i−1) and WL(i+1) have the thresholds of the "A" level and the "Er" level by the prior reading, respectively.

In this way, 16 different combinations exist depending on the held data of the memory cell transistors MT(i−1) and MT(i+1) connected to the word lines WL(i−1) and WL(i+1). Hence, in the second calibrating reading, data is sampled by means of the strobe signal in a state in which an appropriate voltage is applied to the selected word line WLi in each combination. The voltage applied to the selected word line WLi in each operation and the conditions in which the memory cell transistor that is an object of the strobe signal at that time is as follows.

CR1-3=voltage VCeb: WL(i−1)="B", WL(i+1)="Er"
CR1-4=voltage VCec: WL(i−1)="C", WL(i+1)="Er"
CR2-1=voltage VCae: WL(i−1)="Er", WL(i+1)="A"
CR2-2=voltage VCaa: WL(i−1)="A", WL(i+1)="A"
CR2-3=voltage VCab: WL(i−1)="B", WL(i+1)="A"
CR2-4=voltage VCac: WL(i−1)="C", WL(i+1)="A"
CR3-1=voltage VCbe: WL(i−1)="Er", WL(i+1)="B"
CR3-2=voltage VCba: WL(i−1)="A", WL(i+1)="B"
CR3-3=voltage VCbb: WL(i−1)="B", WL(i+1)="B"

CR3-4=voltage VCbc: WL(i−1)="C", WL(i+1)="B"
CR4-1=voltage VCce: WL(i−1)="Er", WL(i+1)="C"
CR4-2=voltage VCca: WL(i−1)="A", WL(i+1)="C"
CR4-3=voltage VCcb: WL(i−1)="B", WL(i+1)="C"
CR4-4=voltage VCcc: WL(i−1)="C", WL(i+1)="C"

In the example of FIG. 10, assuming as follows: VCee<VCea<VCeb<VCec<VCae<VCaa<VCab<VCac<VCbe<VCba<VCbb<VCbc<VCce<VCca<VCcb<VCcc.

Note that information representing the values of voltages VCae, VCaa, VCab, and VCac applied in the reading operation CR2 may be given by the shift table as shift amounts from the voltage VC1 or as shift amounts from the voltage VC2, or may be given as information representing the very values of the voltages. This also applies to the other voltages.

As described above, the second inter-cell interference effect has an effect in a direction of lowering the threshold voltage. Hence, the voltages in the reading operations CR1 to CR4 are stepped down in stepwise fashions in the case of the second calibrating reading. However, for example, if the threshold of the memory cell transistor MT(i+1) adjacent on the drain side is a higher level (for example, "C" level), the second inter-cell interference effect is smaller. In the example of FIG. 10, the second inter-cell interference effect is neglected. Hence, in the reading operation CR1-4, VCec=VC1. In the reading operation CR2-4, VCac=VC2. In the reading operation CR3-4, VCbc=VC3. In the reading operation CR4-4, VCcc=VC4.

Additionally, the lower the threshold voltage of an adjacent memory cell transistor is, the larger the second inter-cell interference effect is. Hence, for example, the following relationships become true.

$$(VC4-VCce) \le (VC1-VCee)$$

$$(VC4-VCca) \le (VC1-VCea)$$

$$(VC4-VCcb) \le (VC1-VCeb)$$

$$(VC4-VCcc) \le (VC1-VCec)$$

Only the relationships between the reading operations CR1 and CR4 have been described above. The reading operations CR2 and CR3 may have the same relationships. However, in the reading operations CR2 and CR3, the memory cell transistor MT adjacent on the drain side has an intermediate threshold level (the "A" level or the "B" level), the different shift widths may not be required.

Figure 11:
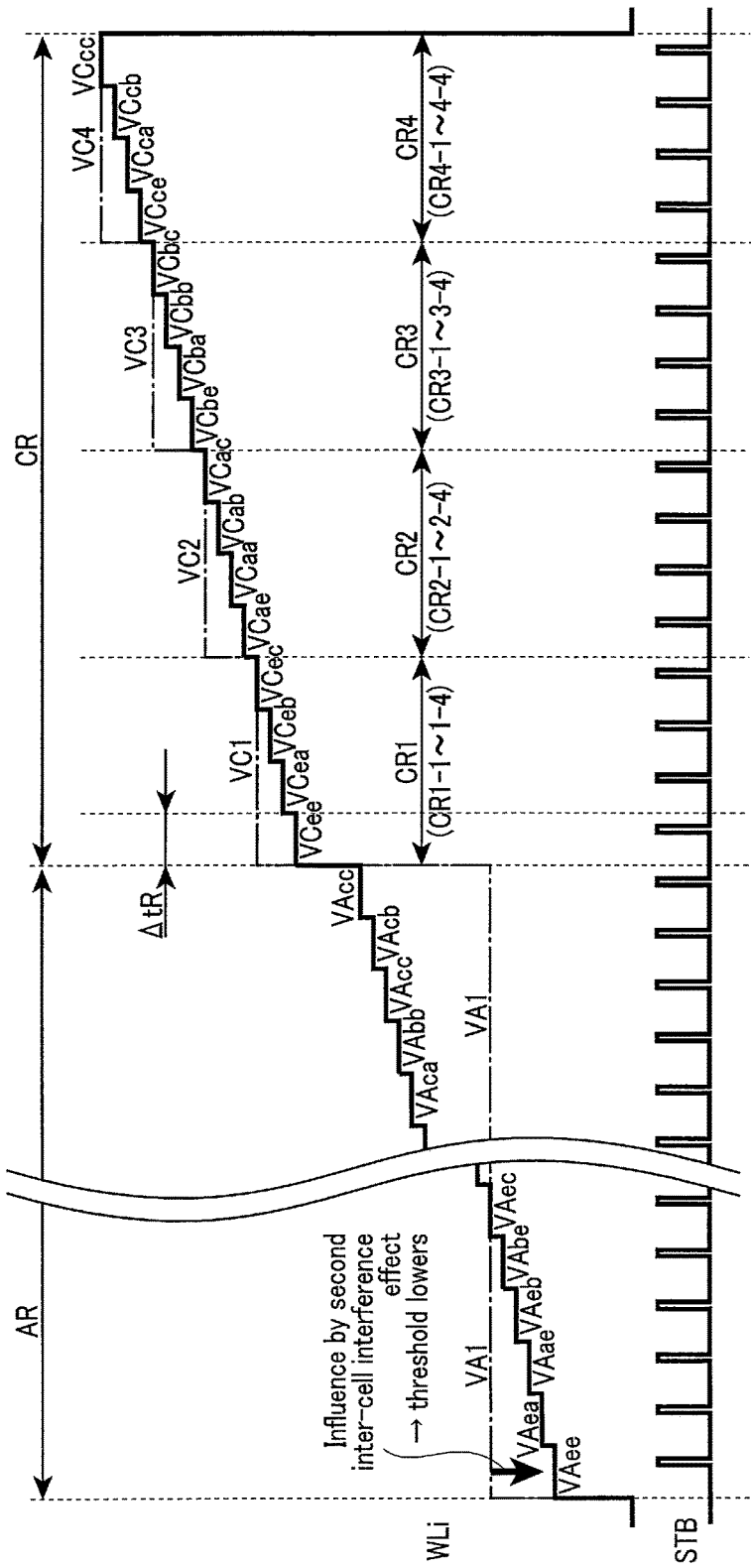

As an example different from FIG. 10, FIG. 11 shows an example in which the second inter-cell interference effect is taken into consideration even in the reading operation AR. In some cases, even if the threshold voltage is the "Er" level, the influence of the second inter-cell interference effect may not be neglected if the threshold voltage of the memory cell transistor(s) MT adjacent on the source side and/or drain side is(are) low. In the example of FIG. 11, the voltages VAee, VAea, VAae, VAeb, and VAbe in the reading operations AR1 to AR5 become lower than the voltage VA1 due to the second inter-cell interference effect. In addition, VAec equals VA1. That is, in the example of FIG. 11, in the reading operation AR, if the memory cell transistor MT(i−1) adjacent on the source side holds the "Er" level, and the memory cell transistor MT(i+1) adjacent on the drain side holds the "C" level, the first inter-cell interference effect and the second inter-cell interference effect (one month) cancel each other, and the default voltage VA1 is considered to be an appropriate value.

Data read in step S18 is transferred to the controller 200, and an attempt of error correction is made (step S19). If errors cannot be corrected (fail in step S19), the controller 200 reads the 2-month lapse table next (step S20). The processor 230 issues a retry reading command to read data by shifting the reading voltage in accordance with the shift amount in the 2-month lapse table (step S21). In response to this, the sequencer 170 executes the second retry reading (step S22).

In the second retry reading (second calibrating reading), the degree of calibration of the second inter-cell interference effect is larger. That is, in the reading operations AR and CR, the voltages applied to the selected word line WLi are made lower than the voltages in the first retry reading almost throughout the voltages. This is shown in FIG. 12.

Figure 12:
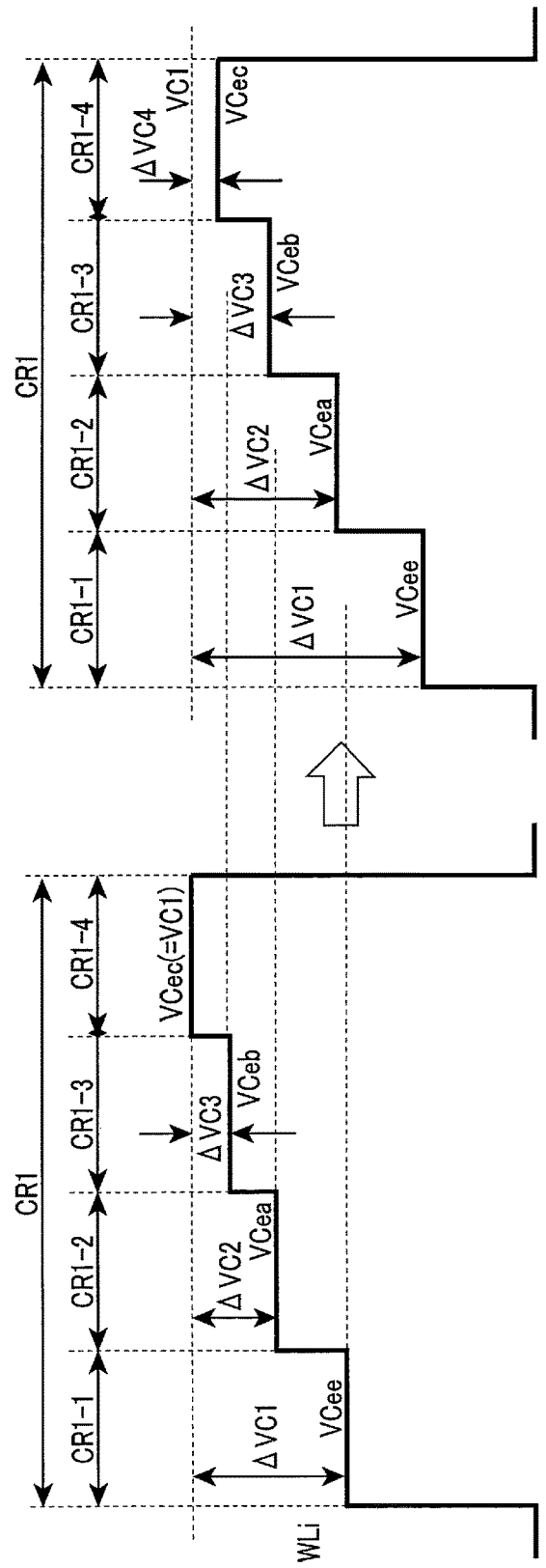
FIG. 12 is a timing chart showing a time-rate change in a word line voltage according to the first embodiment.
Figure 13:
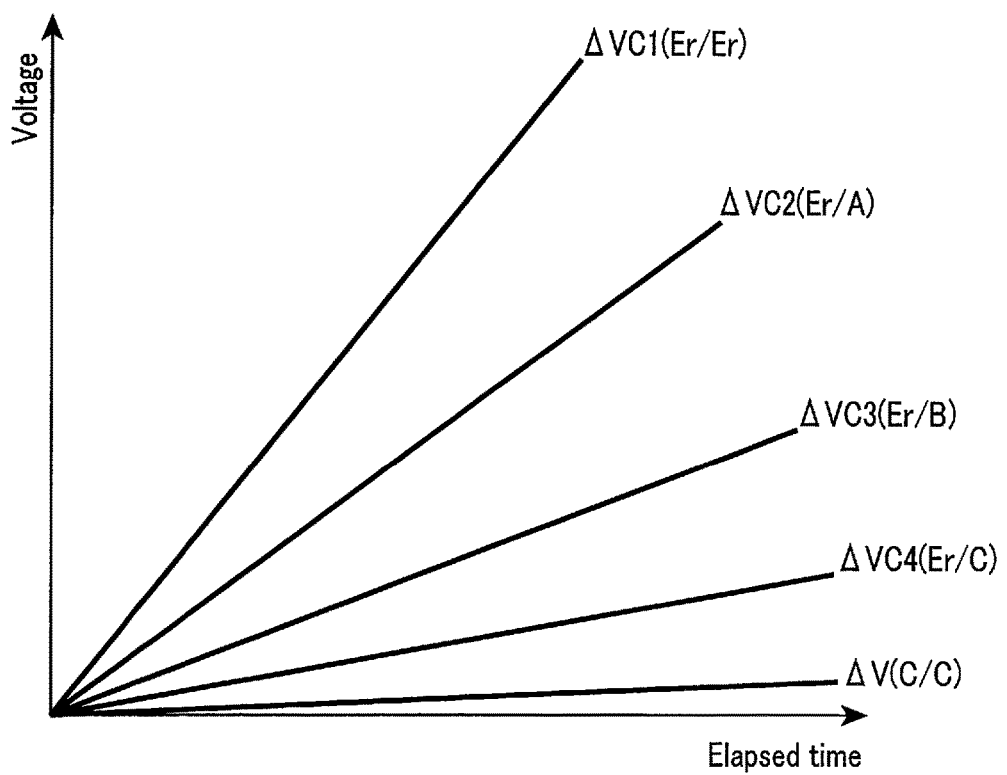
FIG. 13 is a graph showing the relationship between the word line voltage and an elapsed time according to the first embodiment.

FIG. 12 shows the changes of the voltages applied to the selected word line WLi in the reading operation CR1 (CR1-1 to CR1-4). As shown in FIG. 12, $\Delta VC1$ to $\Delta VC4$ denote differences between the default voltage VC1 and the respective voltages VCee, VCea, VCeb, and VCec. $\Delta VC1$ to $\Delta VC4$ in a case of using the 2-month lapse table are made larger than $\Delta VC1$ to $\Delta VC4$ in a case of using the 1-month lapse table. The degree of increase is larger toward $\Delta VC1$ and smaller toward $\Delta VC4$. This is shown in FIG. 13. FIG. 13 shows the magnitudes of $\Delta VC1$ to $\Delta VC4$ over the lapsed time. As shown in FIG. 13, the lower the threshold voltage of the adjacent memory cell transistor MT is, the larger the second inter-cell interference effect is. Hence, the shift amounts are increased. In the reading operation CR, the shift amount $\Delta VC1$ in the reading operation CR1-1 in a case where both of the memory cell transistors MT(i−1) and MT(i+1) on the source and drain sides hold the "Er" level is maximum. Note that $\Delta V$ in FIG. 13 represents a change in the shift amount in the reading operation CR4-4. Both of the memory cell transistors MT(i−1) and MT(i+1) adjacent to the memory cell transistor that is a target for sampling data by means of the strobe signal in the reading operation CR4-4 hold the "C" level. Hence, they are most insignificantly influenced by the second inter-cell interference effect. Hence, the shift amount is minimized in the reading operation CR.

From then on, the retry reading is repeated until error correction may be performed. If data may not properly be read even by the m-th retry reading, the reading operation fails.

1.4 Effect According to this Embodiment

As described above, according to the memory system of this embodiment, it is possible to suppress occurrence of read errors and improve the operation reliability of the memory system. This effect will be described below.

According to this embodiment, if data may not be read by the normal reading, the prior-reading of data is performed first to read data from the memory cell transistors MT connected to unselected word lines that are adjacent to the selected word line on the soured and drain sides. Based on the prior-reading result, the first calibrating reading in consideration of the first inter-cell interference effect is executed.

If data may not properly be read even by the first calibrating reading, the second calibrating readings are repeated a plurality of times. In the second calibrating reading, the reading voltage is shifted in consideration of the second inter-cell interference effect in addition to the first inter-cell interference effect. The second inter-cell interference effect will be described with reference to FIGS. 14 and 15.

FIG. 14 shows the sectional structure of a partial region of the NAND string and a threshold distribution, and particularly shows the state immediately after data is written. As shown in FIG. 14, in the example of FIG. 14, electrons are injected into the charge accumulation layer of the memory cell transistor MTi connected to the selected word line WLi, and the threshold voltage is shifted in the positive direction. On the other hand, holes are injected into the charge accumulation layers of the memory cell transistors MT(i−1) and MT(i+1) connected to the unselected word lines WL(i−1) and WL(i+1) to set threshold voltages having negative values (erased state). Immediately after the writing, the electrons injected into the charge accumulation layer remain in the memory cell transistor MTi. Hence, the threshold voltage of the memory cell transistor MTi connected to the word line WLi falls within a predetermined range, and sufficient margins exist between the threshold voltage and those of the adjacent memory cell transistors MT(i−1) and MT(i+1). For this reason, a read error may unlikely occur.

FIG. 15 shows a state after the lapse of a predetermined time from the state shown in FIG. 14. As shown in FIG. 15, if the charge accumulation layer is commonly connected to the adjacent memory cell transistors, electrons and holes in the memory cell transistors may move in the NAND string freely to some extent. As a result, as shown in FIG. 15, the electron in the memory cell transistor MTi connected to the word line WLi may recombine with the holes in the memory cell transistor MT(i−1) and/or MT(i+1). In addition, along with the lapse of time, the electrons injected into the charge accumulation layer of the memory cell transistor MTi may move to the channel. This is the second inter-cell interference effect.

The second inter-cell interference effect lowers the threshold voltage of the memory cell transistor MTi. Hence, the margins between the threshold voltage and those of the adjacent memory cell transistors may become small, and read errors may tend to occur.

In this embodiment, the shift table explained with reference to FIG. 5 is used in the second calibrating reading. The shift table stores information representing appropriate voltages set in consideration of not only the first inter-cell interference effect but also the second inter-cell interference effect. However, the threshold variation caused by the second inter-cell interference effect becomes larger along with the lapse of time. For this reason, a plurality of shift tables are provided for each elapsed time, and information of appropriate voltages corresponding to each elapsed time is stored.

More specifically, the first inter-cell interference effect raises the threshold voltage, and the second inter-cell interference effect lowers the threshold voltage. Hence, in a region where the first inter-cell interference effect is dominant, the reading voltage is shifted in the positive voltage direction. On the other hand, in a region where the second inter-cell interference effect is dominant, the reading voltage is shifted in the negative voltage direction. As described with reference to FIG. 12, the lower the threshold voltage of the adjacent memory cell transistor MT is, the larger the second inter-cell interference effect is. Hence, as shown in the graph of FIG. 13, the relationships between the elapsed time and the shift amount change depending on the threshold voltages of the adjacent memory cell transistor MT. In other words, concerning the example of FIG. 12, the reading voltages based on the 2-month lapse table in the reading operation CR1 may not be obtained by parallelly shifting the reading voltages based on the 1-month lapse table toward the low voltage side. The reading voltage may be more largely lowered in the reading operation CR1-1, but may not substantially vary in the reading operation CR1-4.

In addition, a higher threshold voltage is more largely influenced by the second inter-cell interference effect. For this reason, the shift amounts used to calibrate the second inter-cell interference effect are increased for a reading operation of determining a higher threshold level. For example, the shift amount used when performing the second calibrating reading for the reading operation BR is smaller than the shift amount used when performing the second calibrating reading for the reading operation CR.

As described above, the reading voltage is set in consideration of not only the first inter-cell interference effect but also the second inter-cell interference effect, thereby suppressing occurrence of read errors. Note that a description of the upper page reading has been omitted above. As in the reading operation CR, the first inter-cell interference effect from WL(i+1) may exist, but the effect from WL(i−1) may lack. Hence, when the second inter-cell interference effect is taken into consideration, the waveforms of the reading voltages may be the same as in the reading operation CR shown in FIG. 10.

2. Second Embodiment

A memory system according to the second embodiment will be described next. In this embodiment, grouping of word lines WL(i−1) and WL(i+1) is performed in accordance with threshold levels. Differences from the first embodiment will be described below.

2.1 Grouping

In the first embodiment, a case in which all combinations of the threshold levels of the word lines WL(i−1) and WL(i+1) are considered has been described. Hence, as described with reference to FIGS. 10 and 11, the reading voltage is stepped up in 16 steps in each of the reading operations AR and CR (ditto for BR).

However, among certain combinations, the degrees of the first inter-cell interference effect may be the same or substantially the same, or the degrees of the second inter-cell interference effect may be the same or substantially the same. Such combinations are put into a group.

FIG. 16 shows grouping concerning the first inter-cell interference effect for the "Er" level and the second inter-cell interference effect. This will be described below.

Group N1

The group N1 includes a combination in which both of WL(i−1) and WL(i+1) are the "Er" level. The word lines WLi corresponding to the group N1 may be insignificantly influenced by the first inter-cell interference effect but most likely influenced by the second inter-cell interference effect.

Group N2

The group N2 includes a combination in which one of WL(i−1) and WL(i+1) is the "Er" level, and the other is the "A" level. The expression "Er/A" in FIG. 16 represents that WL(i−1) is the "Er" level, and WL(i+1) is the "A" level. The expression "A/Er" represents that WL(i−1) is the "A" level, and WL(i+1) is the "Er" level, and so on.

Group N3

The group N3 includes a combination in which one of WL(i−1) and WL(i+1) is the "Er" level, and the other is the "B" level and a combination in which both are the "A" level.

Group N4

The group N4 includes a combination in which one of WL(i−1) and WL(i+1) is the "Er" level, and the other is the "C" level and a combination in which one of WL(i−1) and WL(i+1) is the "A" level, and the other is the "B" level.

Group N5

The group N5 includes a combination in which one of WL(i−1) and WL(i+1) is the "A" level, and the other is the "C" level and a combination in which both are the "B" level.

Group N6

The group N6 includes a combination in which one of WL(i−1) and WL(i+1) is the "B" level, and the other is the "C" level.

Group N7

The group N7 includes a combination in which both WL(i−1) and WL(i+1) are the "C" level. The word lines WLi corresponding to the group N7 may be insignificantly influenced by the second inter-cell interference effect but most likely influenced by the first inter-cell interference effect.

FIG. 17 shows grouping concerning the first inter-cell interference effect except for the case of the "Er" level. A memory cell transistor of a level other than the "Er" level may not be influenced by the word line WL(i−1). Hence, the combinations are divided into two groups depending on the threshold levels of WL(i+1).

Group Nf1: a word line WL(i+1) is the "Er", "A", or "B" level

Group Nf2: a word line WL(i+1) is the "C" level

Of the two groups, the second inter-cell interference effect is smaller in the group Nf1 than in the group Nf2.

2.2 First Calibrating Reading

The first calibrating reading (step S14) according to this embodiment will be described next. The normal reading (step S11) is the same as described in the first embodiment.

FIG. 18 is a timing chart of voltages applied to the selected word line WLi and the unselected word lines WL(i−1) and WL(i+1) in the prior-reading of the first calibrating reading and the signal STB. This prior-reading operation may also apply to the first calibrating reading according to the first embodiment.

As shown in FIG. 18, when reading data from the word line WL(i−1), a voltage VREAD is applied to the word lines WLi and WL(i+1), and voltages VA1, VB1, and VC1 are applied to the word line WL(i−1) in turn. As a result, memory cell transistors MT(i−1) that hold the "Er" level, "A" level, "B" level, or "C" level are specified for the word line WL(i−1).

Next, data is read from the word line WL(i+1). That is, the voltage VREAD is applied to the word lines WLi and WL(i−1), and the voltages VA1, VB1, and VC1 are applied to the word line WL(i+1) in turn. As a result, memory cell transistors MT(i+1) that hold the "Er" level, "A" level, "B" level, or "C" level are specified for the word line WL(i+1).

These prior-reading results are held by, for example, a sense amplifier 140.

The main-reading operation will be described next. FIG. 19 is a timing chart of voltages applied to the selected word line WLi in the main-reading of the first calibrating reading and the signal STB. FIG. 19 shows the lower page reading, and the voltages VA1 and VC1 to be used in the normal reading are shown for reference by one-dot dashed lines.

A reading operation AR will be described first. As shown in FIG. 19, in the reading operation AR, the voltage applied to the selected word line WLi is stepped up in seven steps. Data is sampled by means of the strobe signal for each of the voltages of seven steps, and the operations will be referred to as reading operations AR1 to AR7.

In the reading operation AR1 executed first, a voltage VN1 is applied to the selected word line WLi. In the reading operation AR1, data is sampled by means of the strobe signal on a bit line in which both of the memory cell transistors MT(i−1) and MT(i+1) connected to the word lines WL(i−1) and WL(i+1) have the threshold of "Er" level (to be expressed as "Er/Er").

The voltage applied to the selected word line WLi in each operation and the conditions of the memory cell transistor sampled by means of the strobe signal at that time are as follows.

AR2=voltage VN2: "Er/A", "A/Er"
AR3=voltage VN3: "Er/B", "B/Er", "A/A"
AR4=voltage VN4: "Er/C", "C/Er", "A/B", "B/A"
AR5=voltage VN5: "A/C", "C/A", "B/B"
AR6=voltage VN6: "B/C", "C/B"
AR7=voltage VN7: "C/C"

That is, in each of the reading operations AR1 to AR7, data read from the memory cell transistors MTi belonging to each of the groups N1 to N7 are sampled by means of the strobe signal. In the example of FIG. 19, assuming as follows: VN1<VN2<VN3<VN4<VN5<VN6<VN7. VN1 may be the same as VA1.

A reading operation CR will be described next. As shown in FIG. 19, in the reading operation CR, the voltage applied to the selected word line WLi is stepped up in two steps. Data is sampled by means of the strobe signal for each of the voltages of two steps, and the operations will be referred to as reading operations CR1 and CR2.

The voltage applied to the selected word line WLi in each operation and the conditions of the memory cell transistor sampled by means of the strobe signal at that time are as follows. The word line WL(i−1) may be any level, as in the first embodiment.

CR1=voltage VC1: WL(i+1)="Er", "A", or "B"
CR2=voltage VC5: WL(i+1)="C"
Additionally, VC1<VC5 is set.

2.3 Second Calibrating Reading

The second calibrating reading (steps S18, S22, and S26 and the retry reading) according to this embodiment will be described next.

Figure 20:
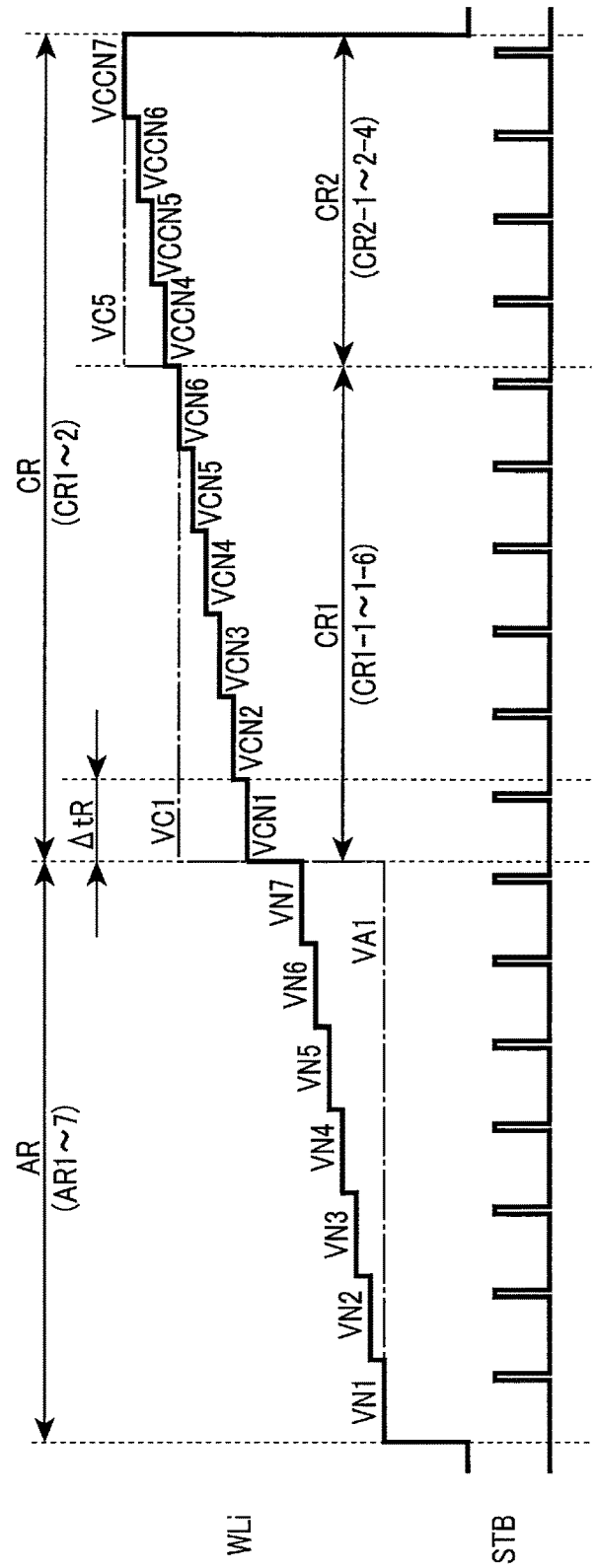
FIG. 20 is a timing chart of various signals in second calibrating reading according to the second embodiment.

FIG. 20 is a timing chart of voltages applied to the selected word line WLi in the main-reading of the second calibrating reading and the signal STB. FIG. 20 shows the lower page reading, and the voltages VA1, VC1, and VC5 to be used in the first calibrating reading are shown for reference by one-dot dashed lines.

The reading operation AR is the same as described concerning the first calibrating reading with reference to FIG. 19. It is because the second inter-cell interference may insignificantly effect on the reading operation AR, as described in the first embodiment.

The reading operation CR will be described next. As shown in FIG. 20, the reading voltages VC1 and VC5 in the first calibrating reading are stepped down from the voltages VC1 and VC5 in stepwise fashions of six steps and four steps, respectively. Hence, in the entire reading operation CR, the reading voltage is stepped up in 10 steps. Data is sampled by means of the strobe signal at each of the voltages of 10 steps. Operations of applying the voltages of six steps in the reading operation CR1 of the second calibrating reading will be referred to as reading operations CR1-1 to CR1-6 hereinafter. In addition, operations of applying the voltages of four steps in the reading operation CR2 of the second calibrating reading will be referred to as reading operations CR2-1 to CR2-4.

In the reading operation CR1-1 executed first, a voltage VCN1 is applied to the selected word line WLi. The voltage VCN1 has a value shifted from, for example, the default voltage VC1 by a shift amount S1_C1 designated in the 1-month lapse table shown in FIG. 5. In the reading operation CR1-1, data is sampled by means of the strobe signal on a bit line in which the word lines WL(i−1) and WL(i+1) are the "Er" level by the prior reading. That is, a selected word line WLi having a combination in the group N1 is a target for sampling data by means of the strobe signal.

In the reading operation CR1-2 executed next, a voltage VCN2 is applied to the selected word line WLi. In the reading operation CR1-2, data is sampled by means of the strobe signal on a bit line in which the word lines WL(i−1) and WL(i+1) are the "A/Er" level or the "Er/A" level by the prior reading. That is, a selected word line WLi having a combination in the group N2 is a target for sampling data by means of the strobe signal.

In the reading operation CR1-3 executed next, a voltage VCN3 is applied to the selected word line WLi. In the reading operation CR1-3, a selected word line WLi having the combination in the group N3 is a target for sampling data by means of the strobe signal.

In the reading operation CR1-4 executed next, a voltage VCN4 is applied to the selected word line WLi. In the reading operation CR1-4, a selected word line WLi having the combination in a part of the group N4 is a target for sampling data by means of the strobe signal. That is, data is sampled by means of the strobe signal on a bit line in which the word lines WL(i−1) and WL(i+1) are the "C/Er", "A/B", or "B/A" level.

In the reading operation CR1-5 executed next, a voltage VCN5 is applied to the selected word line WLi. In the reading operation CR1-5, a selected word line WLi having the combination in a part of the group N5 is a target for sampling data by means of the strobe signal. That is, data is sampled by means of the strobe signal on a bit line in which the word lines WL(i−1) and WL(i+1) are the "C/A" or "B/B" level.

In the reading operation CR1-6 executed next, a voltage VCN6 is applied to the selected word line WLi. In the reading operation CR1-6, a selected word line WLi having the combination in a part of the group N6 is a target for sampling data by means of the strobe signal. That is, data is sampled by means of the strobe signal on a bit line in which the word lines WL(i−1) and WL(i+1) are the "C/B" level.

In the reading operation CR2-1 executed next, a voltage VCCN4 is applied to the selected word line WLi. In the reading operation CR2-1, a selected word line WLi having the combination in the group N4, which is not applied for the target in the reading operation CR 1-4, is a target for sampling data by means of the strobe signal. That is, data is sampled by means of the strobe signal on a bit line in which the word lines WL(i−1) and WL(i+1) are the "Er/C" level.

In the reading operation CR2-2 executed next, a voltage VCCN5 is applied to the selected word line WLi. In the reading operation CR2-2, a selected word line WLi having the combination in the group N5, which is not applied for the target in the reading operation CR 1-5, is a target for sampling data by means of the strobe signal. That is, data is sampled on a bit line in which the word lines WL(i−1) and WL(i+1) are the "A/C" level.

In the reading operation CR2-3 executed next, a voltage VCCN6 is applied to the selected word line WLi. In the reading operation CR2-3, a selected word line WLi having the combination in the group N6, which is not applied for the target in the reading operation CR 1-6, is a target for sampling data by means of the strobe signal. That is, data is sampled by means of the strobe signal on a bit line in which the word lines WL(i−1) and WL(i+1) are the "B/C" level.

In the reading operation CR2-4 executed at last, a voltage VCCN7 is applied to the selected word line WLi. In the reading operation CR2-4, a selected word line WLi having the combination in the group N7 is a target for sampling data by means of the strobe signal. That is, data is sampled by means of the strobe signal on a bit line in which the word lines WL(i−1) and WL(i+1) are the "C/C" level.

As described in the first embodiment, the second inter-cell interference effect has an influence in a direction of lowering the threshold voltage. Hence, the voltages in the reading operations CR1 and CR2 are stepped down in stepwise fashions in the second calibrating reading. However, if the threshold of the memory cell transistor MT adjacent on the source side is a high level (for example, the "C" level), the second inter-cell interference effect is small. In the example of FIG. 20, the second inter-cell interference effect is neglected. Hence, in the reading operation CR1-6, VCN6=VC1 may be realized. In the reading operation CR2-4, VCCN7=VC5 may be realized.

Additionally, the lower the threshold voltage of an adjacent memory cell transistor is, the larger the second inter-cell interference effect is. Hence, for example, the following relationships may be realized.

$$(VC5-VCCN7) \le (VC1-VCN6)$$

$$(VC5-VCCN6) \le (VC1-VCN5)$$

$$(VC5-VCCN5) \le (VC1-VCN4)$$

$$(VC5-VCCN4) \le (VC1-VCN3)$$

The relationship between the reading operations CR1-3 to CR1-6 and the reading operations CR2-1 to CR2-4 has been described above. The reading operations CR1-1 and CR1-2 may have the same relationship to one of the reading operations CR.

Note that the second inter-cell interference effect may be taken into consideration even in the reading operation AR, as in FIG. 11 described in the first embodiment.

Subsequent processes are the same as those in the first embodiment. If error correction fails (fail in step S19), the controller 200 reads the 2-month lapse table next (step S20). A NAND flash memory 100 executes second retry reading in accordance with the shift amount in the 2-month lapse table (step S22). In the second retry reading (the second second calibrating reading), the degree of calibration against the second inter-cell interference effect is larger. That is, in the reading operations AR and CR, the voltages applied to the selected word line WLi are made lower than in the first retry reading almost throughout the operations. In addition, the lower the threshold voltage of the adjacent memory cell transistor MT is, the larger the second inter-cell interference effect is.

Hence, the shift amount is increased. This is the same as described with reference to FIGS. 12 and 13. That is, for example, the absolute value of the difference between (VC5−VCCN4) and (VC1−VCN1) becomes larger along with the lapse of time.

2.4 Effect According to this Embodiment

According to this embodiment, by grouping the combinations of the word lines WL(i−1) and WL(i+1) the number of reading operations is decreased, and higher-speed data reading is performed.

3. Third Embodiment

A memory system according to the third embodiment will be described next. This embodiment is directed to a grouping different from that of the second embodiment.

Differences from the first and second embodiments will be described below.

3.1 Grouping

In this embodiment, a simpler grouping is performed than in the second embodiment.

FIG. 21 shows a grouping in terms of the first inter-cell interference effect for the "Er" level. This will be described below.

Group Sfa1

The group Sfa1 includes a combination in which both of WL(i−1) and WL(i+1) are the "C" level. That is, a word line WLi having the combination in the group Sfa1 is most likely influenced by the first inter-cell interference effect.

Group Sfa2

The group Sfa2 includes combinations in which either one of WL(i−1) and WL(i+1) is the "C" level. That is, the combinations of WL(i−1) and WL(i+1) are "Er/C", "A/C", "B/C", "C/Er", "C/A", or "C/B". The group Sfa2 is a group including the combinations where a word line (WLi) is influenced by the first inter-cell interference effect to a predetermined degree but to a lesser degree than in the group Sfa1.

Group Sfa3

The group Sfa3 includes remaining combinations. The influence of the first inter-cell interference effect is smaller in the group Sfaf3 than in the remaining groups.

FIG. 22 shows a grouping in terms of the first inter-cell interference effect for the "C" level. This will be described below.

Group Sfc1

The group Sfc1 includes combinations in which WL(i+1) are the "C" level. That is, the word lines WLi having any of the combinations in the group Sfc1 is most likely influenced by the first inter-cell interference effect.

Group Sfc2

The group Sfc2 includes remaining combinations. That is, in the combinations, the word line WL(i+1) is the "Er", "A", or "B" level. The word line WL(i−1) may have any level. The first inter-cell interference effect is smaller in the group Sfc2 than in the group Sfc1. Note that the grouping is the same as in FIG. 17 described in the second embodiment while it is differently expressed.

FIG. 23 shows a grouping in terms of the second inter-cell interference effect. This will be described below.

Group Sr1

The group Sr1 includes a combination in which both of WL(i−1) and WL(i+1) are the "Er" level. That is, the word line WLi having the combination in the group Sr1 is most likely influenced by the second inter-cell interference effect.

Group Sr2

The group Sr2 includes combinations in which either one of WL(i−1) and WL(i+1) is the "Er" level. That is, the combinations of WL(i−1) and WL(i+1) may be "Er/A", "Er/B", "Er/C", "A/Er", "B/Er", or "C/Er". The group Sr2 includes the combinations where the word line WLi is influenced by the second inter-cell interference effect to a predetermined degree but to a lesser degree than in the group Sr1.

Group Sr3

The group Sr3 includes remaining combinations. The second inter-cell interference effect is smaller in the group Srf3 than in the remaining groups.

3.2 First Calibrating Reading

The first calibrating reading (step S14) according to this embodiment will be described next. The normal reading (step S11) is the same as that described in the first embodiment.

FIG. 24 is a timing chart of voltages applied to the selected word line WLi and the unselected word lines WL(i−1) and WL(i+1) in the prior-reading of the first calibrating reading and a signal STB.

As shown in FIG. 24, when reading data from the word line WL(i−1), a voltage VREAD is applied to the word lines WLi and WL(i+1), and a voltage VC1 is applied to the word line WL(i−1). As a result, a memory cell transistor MT(i−1) that holds the "C" level is specified for the word line WL(i−1). Next, data is read from the word line WL(i+1). That is, the voltage VREAD is applied to the word lines WLi and WL(i−1), and the voltage VC1 is applied to the word line WL(i+1). As a result, a memory cell transistor MT(i+1) that holds the "C" level is specified for the word line WL(i+1). These prior-reading results are held by, for example, a sense amplifier 140.

The reason why only VC1 is used as the reading voltage, and VA1 and VB1 are not used is that in the first calibrating reading according to this embodiment, specifying the memory cell transistors MT(i−1) and MT(i+1) of "C" level suffices, as described with reference to FIGS. 21 and 22.

The main-reading operation will be described next. FIG. 25 is a timing chart of voltages applied to the selected word line WLi in the main-reading of the first calibrating reading and the signal STB. FIG. 25 shows the lower page reading, and the voltages VA1 and VC1 to be used in the normal reading are shown for reference by one-dot dashed lines.

A reading operation AR will be described first. As shown in FIG. 25, in the reading operation AR, the voltage applied to the selected word line WLi is stepped up in three steps. Data is sampled by means of the strobe signal for each of the voltages of three steps, and the operations will be referred to as reading operations AR1 to AR3.

In the reading operation AR1 executed first, a voltage VSfa3 is applied to the selected word line WLi. In the reading operation AR1, a selected word line WLi having the combination in the group Sfa3 described with reference to FIG. 21 is a target for sampling data by means of the strobe signal.

In the reading operation AR2 executed next, a voltage VSfa2 is applied to the selected word line WLi. In the reading operation AR2, a selected word line WLi having the combination in the group Sfa2 described with reference to FIG. 21 is a target for sampling data by means of the strobe signal.

In the reading operation AR3 executed finally, a voltage VSfa1 is applied to the selected word line WLi. In the reading operation AR3, a selected word line WLi having a combination in the group Sfa1 described with reference to FIG. 21 is a target for sampling data by means of the strobe signal.

In the example of FIG. 21, VSfa3<VSfa2<VSfa1 is set. VSfa3 may be the same as VA1.

A reading operation CR will be described next. As shown in FIG. 25, in the reading operation CR, the voltage applied to the selected word line WLi is stepped up in two steps. Data is sampled by means of the strobe signal at each of the voltages of two steps, and the operations will be referred to as reading operations CR1 and CR2.

In the reading operation CR1 executed first, the voltage VC1 is applied to the selected word line WLi. In the reading operation CR1, a selected word line WLi having the combination in the group Sfc2 described with reference to FIG. 22 is a target for sampling data by means of the strobe signal.

In the reading operation CR2 executed next, a voltage VC6 is applied to the selected word line WLi. In the reading operation CR2, a selected word line WLi having the combination in the group Sfc1 described with reference to FIG. 22 is a target for sampling data by means of the data strobe signal.

In addition, VC1<VC6 is set.

3.3 Second Calibrating Reading

The second calibrating reading (steps S18, S22, and S26 and the retry reading) according to this embodiment will be described next.

Figure 26:
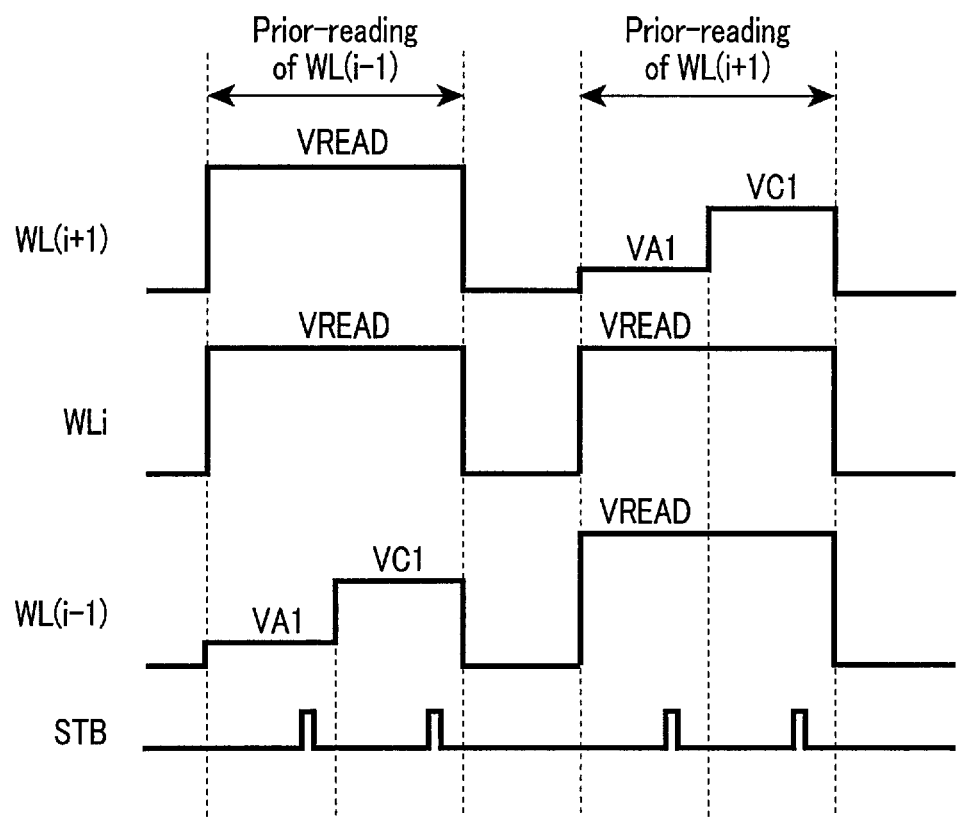

FIG. 26 is a timing chart of voltages applied to the selected word line WLi and the unselected word lines WL(i−1) and WL(i+1) in the prior-reading of the second calibrating reading and the signal STB.

As shown in FIG. 26, when reading data from the word line WL(i−1), the voltage VREAD is applied to the word lines WLi and WL(i+1), and the voltages VA1 and VC1 are applied to the word line WL(i−1) in turn. As a result, a memory cell transistor MT(i−1) that holds the "Er" level or "C" level is specified for the word line WL(i−1). Next, data is read from the word line WL(i+1). That is, the voltage VREAD is applied to the word lines WLi and WL(i−1), and the voltages VA1 and VC1 are applied to the word line WL(i+1) in turn. As a result, a memory cell transistor MT(i+1) that holds the "Er" level or the "C" level is specified for the word line WL(i+1). These prior-reading results are held by, for example, the sense amplifier 140.

The reason why only VA1 and VC1 are used as the reading voltage, and VB1 is not used is that specifying the memory cell transistors MT of the "Er" level or the "C" level suffices.

FIG. 27 is a timing chart of voltages applied to the selected word line WLi in the main-reading of the second calibrating reading and the signal STB. FIG. 27 shows the lower page reading, and the voltages VA1, VC1, and VC6 to be used in the first calibrating reading are shown for reference by one-dot dashed lines.

The reading operation AR will be described first. As shown in FIG. 27, the reading voltages VA1 and VA2 in the first calibrating reading are stepped down in stepwise fashions of three steps and two steps, respectively. Hence, in the entire reading operation AR, the reading voltage is stepped up in six steps. Data is sampled by means of the strobe signal at each of the voltages of six steps. Operations of applying the voltages in three steps in the reading operation AR1 of the second calibrating reading will be referred to as reading operations AR1-1 to AR1-3 hereinafter. In addition, operations of applying the voltages in two steps in the reading operation AR2 of the second calibrating reading will be referred to as reading operations AR2-1 and AR2-2.

In the reading operation AR1-1 executed first, a voltage VAS31 is applied to the selected word line WLi. The voltage VAS31 has a value shifted from, for example, the default voltage VA1 by a shift amount S1_A1 designated in the 1-month lapse table shown in FIG. 5. In the reading operation AR1-1, a selected word line WLi having the combination in the group Sr1, that is, the combination in which the word lines WL(i−1) and WL(i+1) are the "Er/Er" level is a target for sampling data by means of the strobe signal.

In the reading operation AR1-2 executed next, a voltage VAS32 is applied to the selected word line WLi. In the reading operation AR1-2, a selected word line WLi having the combination in a part of the group Sr2, that is, the combination in which the word lines WL(i−1) and WL(i+1) are the "Er/A", "Er/B", "A/Er", or "B/Er" level is a target for sampling data by means of the strobe signal.

In the reading operation AR1-3 executed next, a voltage VAS33 is applied to the selected word line WLi. In the reading operation AR1-3, a selected word line WLi having the combination in a part of the group Sr3, that is, the combination in which the word lines WL(i−1) and WL(i+1) are the "A/A", "A/B", "B/A", or "B/B" level is a target for sampling data by means of the strobe signal.

In the reading operation AR2-1 executed next, a voltage VAS22 is applied to the selected word line WLi. In the reading operation AR2-1, a selected word line WLi having the combination in a part of the group Sr2, that is, the combination in which the word lines WL(i−1) and WL(i+1) are the "Er/C" or "C/Er" level is a target for sampling data by means of the strobe signal.

In the reading operation AR2-2 executed next, a voltage VAS23 is applied to the selected word line WLi. In the reading operation AR2-2, a selected word line having the combination in a part of the group Sr3, that is, the combination in which the word lines WL(i−1) and WL(i+1) are the "C/A", "C/B", "A/C", or "B/C" level is a target for sampling data by means of the strobe signal.

In the reading operation AR3 executed finally, a voltage VAS13 is applied to the selected word line WLi. In the reading operation AR3, a selected word line WLi having the combination in a part of the group Sr3, that is, the combination in which the word lines WL(i−1) and WL(i+1) are the "C/C" level is a target for sampling data by means of the strobe signal.

The reading operation CR will be described next. As shown in FIG. 27, the reading voltages VC1 and VC6 in the first calibrating reading are stepped down in stepwise fashions of three steps and two steps, respectively. Hence, in the entire reading operation CR, the reading voltage is stepped up in five steps. Data is sampled by means of the strobe signal at each of the voltages of five steps. Operations of applying the voltages in three steps in the reading operation CR1 of the second calibrating reading will be referred to as reading operations CR1-1 to CR1-3 hereinafter. In addition, operations of applying the voltages in two steps in the reading operation CR2 of the second calibrating reading will be referred to as reading operations CR2-1 and CR2-2.

In the reading operation CR1-1 executed first, a voltage VCS11 is applied to the selected word line WLi. The voltage VCS11 has a value shifted from, for example, the default voltage VC1 by a shift amount S1_C1 designated in the 1-month lapse table shown in FIG. 5. In the reading operation CR1-1, a word line having the combination in the group Sr1, that is, the combination in which the word lines WL(i−1) and WL(i+1) are the "Er/Er" level is a target for sampling data by means of the strobe signal.

In the reading operation CR1-2 executed next, a voltage VCS12 is applied to the selected word line WLi. In the reading operation CR1-2, a selected word line WLi having the combination in a part of the group Sr2, that is, the combination in which the word lines WL(i−1) and WL(i+1) are the "Er/A", "Er/B", "A/Er", "B/Er", or "C/Er" level is a target for sampling data by means of the strobe signal.

In the reading operation CR1-3 executed next, a voltage VCS13 is applied to the selected word line WLi. In the reading operation CR1-3, a selected word line having the combination in a part of the group Sr3, that is, the combination in which the word lines WL(i−1) and WL(i+1) are the "A/A", "A/B", "B/A", "C/A", or "C/B" level is a target for sampling data by means of the strobe signal.

In the reading operation CR2-1 executed next, a voltage VCS22 is applied to the selected word line WLi. In the reading operation CR2-1, a selected word line having the combination in a part of the group Sr2, that is, the combination in which the word lines WL(i−1) and WL(i+1) are the "Er/C" level is a target for sampling data by means of the strobe signal.

In the reading operation CR2-2 executed finally, a voltage VCS23 is applied to the selected word line WLi. In the reading operation CR2-2, a selected word line having the combination in a part of the group Sr3, that is, the combination in which the word lines WL(i−1) and WL(i+1) are the "A/C", "B/C", or "C/C" level is a target for sampling data by means of the strobe signal.

As described in the first embodiment, the second inter-cell interference effect has an effect in a direction of lowering the threshold voltage. Hence, the voltages in the reading operations AR and CR are stepped down in stepwise fashions in the second calibrating reading. For example, VAS31<VAS32<VAS33<VAS22<VAS23<VAS13<VCS11<VCS12<VCS13<VCS22<VCS23 are set. However, VAS33=VA1 (=VSfa3), VAS23=VSfa2, or VAS13=VSfa3 may be applied. In addition, VCS13=VC1 or VCS23=VC6 may be applied. This is because the group for which data is sampled by means of the strobe signal at the above mentioned timing is influenced by the second inter-cell interference effect a little.

Furthermore, the influence of the second inter-cell interference effect is larger for a memory cell transistor having a higher threshold voltage. Hence, for example, the following relationships may be realized.

$$(VC6-VCS23) \geq (VSfa2-VAS23)$$

$$(VC6-VCS22) \geq (VSfa2-VAS22)$$

$$(VC1-VCS13) \geq (VA1-VAS33)$$

$$(VC1-VCS12) \geq (VA1-VAS32)$$

$$(VC1-VCS11) \geq (VA1-VAS31)$$

Additionally, as described in the first and second embodiments, the lower the threshold voltage of an adjacent memory cell transistor is, the larger the second inter-cell interference effect is. Hence, for example, the following relationships are realized.

$$(VC6-VCS23) \geq (VC1-VCS13)$$

$$(VC6-VCS22) \leq (VC1-VCS12)$$

$$(VSfa1-VAS13) \geq (VSfa2-VAS23) \leq (VSfa3-VAS33)$$

$$(VSfa2-VAS22) \geq (VSfa3-VAS32)$$

Note that for the reading operation AR, the second inter-cell interference effect may be neglected. FIG. 28 shows such an example. In FIG. 28, the reading operation AR is like the reading operations AR1 to AR3 of the first calibrating reading described with reference to FIG. 25, and the reading operation CR is like the reading operations CR1 and CR2 of the second calibrating reading described with reference to FIG. 27.

3.4 Effect According to this Embodiment

According to this embodiment, it may further decrease the number of times of data reading and further speed up the reading operation.

4. Fourth Embodiment

A memory system according to the fourth embodiment will be described next. In this embodiment, the first embodiment is applied to the second writing method (the two-step writing method). Differences from the first embodiment will be described below.

4.1 Writing Operation

A writing operation according to this embodiment will be described first with reference to FIG. 29. FIG. 29 is a graph showing the threshold distributions of memory cell transistors MT connected to word lines WLi and WL(i+1), and shows processing steps to be executed step-by-step when writing data to the word lines WLi and WL(i+1).

As shown in FIG. 29, in the first step, both of the word lines WLi and WL(i+1) are the "Er" level. In this state, the word line WLi is selected, and data is written. Verifying levels used at this time are VfyA', VfyB', and VfyC' lower than verifying levels VfyA, VfyB, and VfyC to be final targets. As a result, as shown in the second step, the "A" level, the "B" level, and the "C" level are roughly written to the word line WLi. This is called foggy writing.

Next, as shown in the third step, the word line WL(i+1) adjacent to the word line WLi on the drain side is selected, and foggy writing is executed in a similar manner. By the foggy writing to the word line WL(i+1), the word line WLi is significantly influenced by the first inter-cell interference effect, and the threshold distribution shifts to the positive voltage side.

After that, as shown in the fourth step, the word line WLi is selected, and data is written. Verifying levels used at this time are verifying levels VfyA, VfyB, and VfyC that are the final targets. Since the "A" level, the "B" level, and the "C" level have already been written roughly, the shift amounts of the threshold voltages in the fourth step are very small at this point of time. This is called fine writing.

Next, as shown in the fifth step, the word line WL(i+1) is selected, and fine writing is executed in a similar manner. However, since the shift amounts of the threshold voltages in the fine writing are very small, the word line WLi is insignificantly influenced by the first inter-cell interference effect.

After that, as shown in the sixth step, writing substantially neglecting the first inter-cell interference effect may be executed. However, if the write data is the "Er" level, like the first writing, the word line is influenced by the first inter-cell interference effect caused by the word lines WL(i−1) and WL(i+1).

4.2 Reading Operation.

The reading operation will be described next. The overall procedure of the reading operation is the same as in FIG. 7 described in the first embodiment, and likewise, deciding voltages used in second calibrating reading is performed based on a shift table. Normal reading may also be executed as described in the first embodiment.

4.2.1 First Calibrating Reading

First calibrating reading according to this embodiment will be described first. The prior-reading operation of the first calibrating reading according to this embodiment is performed as described in the second embodiment with reference to FIG. 18.

FIG. 30 is a timing chart of the word line WLi and a signal STB in the main-reading of the first calibrating reading according to this embodiment. FIG. 30 shows the lower page reading. FIG. 30 shows voltages VA1 and VC1 to be used in the normal reading for reference by one-dot dashed lines.

As shown in FIG. 30, a reading operation AR of the main-reading according to this embodiment may be the same as the reading operation AR (AR1 to AR16) described in the first embodiment with reference to FIG. 9. A reading operation CR according to this embodiment may be the same as normal reading.

4.2.2 Second Calibrating Reading

Figure 31:
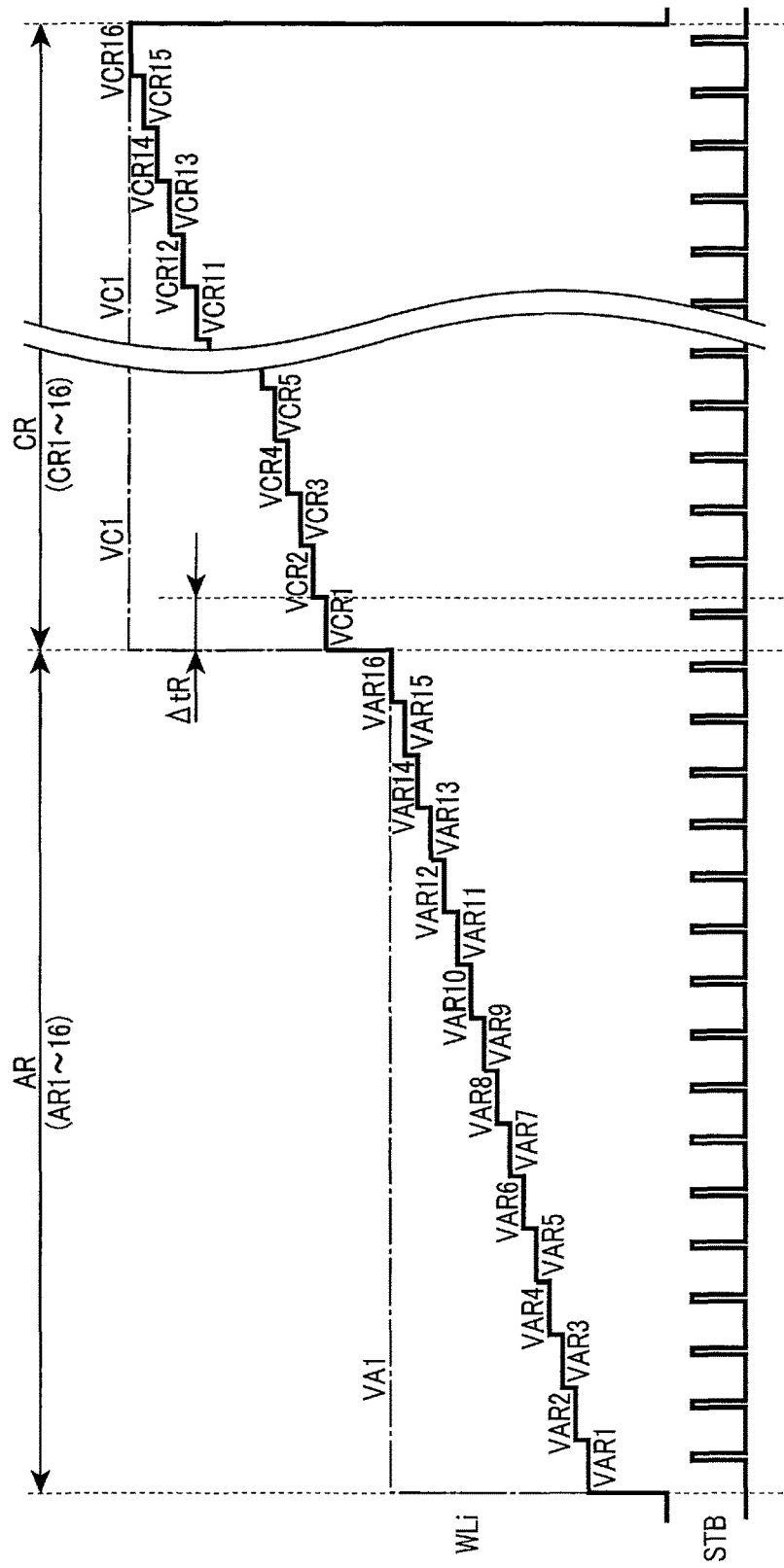

The second calibrating reading will be described next. The second calibrating reading calibrates the second inter-cell interference effect. The second inter-cell interference effect in employing the second writing method will be described first with reference to FIG. 31. FIG. 31 shows the waveforms of reading voltages when focusing on the second inter-cell interference effect in the lower page reading.

As shown in FIG. 31, each of the reading voltages in the reading operations AR and CR is stepped down in a stepwise fashion of 16 steps. According to the example of FIG. 31, in the reading operation AR, voltages VAR1 to VAR16 are applied to the word line WLi as set to VAR1<VAR2<VAR3< . . . <VAR16. The voltage VAR16 may equal the default voltage VA1.

A memory cell transistor targeted for data to be sampled by means of the strobe signal is a memory cell transistor on the word line WLi for which both of the word lines WL(i−1) and WL(i+1) are the "Er" level. This is because they are significantly influenced by the second inter-cell interference effect. From then on, data are sampled from among memory cell transistors in order from a memory cell transistor having a stronger likelihood of the second inter-cell interference effect. This is like the first embodiment.

This may also apply to the reading operation CR. In the reading operation CR, voltages VCR1 to VCR16 are applied to the word line WLi, and VCR1<VCR2<VCR3< . . . <VCR16 are set. The voltage VCR16 may equal the default voltage VC1.

Targets for sampling data by means of the strobe signal at the voltage VCR1 are memory cell transistors on a word line WLi for which both the word lines WL(i−1) and WL(i+1) are the "Er" level. From then on, data are sampled by means of the strobe signal from among memory cell transistors in order from a memory cell transistor having a stronger likelihood of the second inter-cell interference effect.

In FIG. 32, a way different from FIG. 31 is applied. That is, it may be considered that the second inter-cell interference effect is larger for a memory cell transistor MTi having a higher threshold voltage, and may be substantially neglected for the memory cell transistor MTi of, for example, the "Er" level. FIG. 32 shows a reading voltage used to calibrate the influence of the second inter-cell interference effect accordingly.

As shown in FIG. 32, the reading operation AR is like the normal reading. This is because the second inter-cell interference effect may be regarded as absent. The reading operation CR is performed as described with reference to FIG. 31.

FIG. 33 shows the waveforms of the reading voltages used in second calibrating reading considering calibration of the first inter-cell interference effect and the second inter-cell interference effect. In FIG. 33, the way shown in FIG. 32 is employed for the second inter-cell interference effect.

As shown in FIG. 33, the reading operation AR is like the reading operation AR of first calibrating reading, and the reading operation CR is like the reading operation CR shown in FIGS. 31 and 32. That is, in the reading operation AR, the first inter-cell interference effect is taken into consideration, and the second inter-cell interference effect is neglected. In contrast, in the reading operation CR, the second inter-cell interference effect is taken into consideration, and the first inter-cell interference effect is neglected.

Even in this example, as described in the first embodiment, the lower the threshold voltage of an adjacent memory cell transistor MT is, the larger the degree of lowering the reading voltage along with the lapse of time becomes. That is, for example, letting ΔVCR1 to ΔVCR16 be the absolute values of the differences between VCR1 to VCR16 and VC1, respectively, the following relationship is realized. That is, $$\Delta VCR1 > \Delta VCR2 > \Delta VCR3 > \Delta VCR4 > \ldots > \Delta VCR16$$

Further in the reading operation AR, the first inter-cell interference effect may be taken into consideration, as a matter of course. In this case, the waveform of the reading operation AR may be, for example, that of the reading operation AR shown in FIG. 11.

4.3 Effect According to this Embodiment

As described above, the reading operation according to the first embodiment may also be applied in a case in which the two-step writing method is employed. In the two-step writing method, the influence of the first inter-cell interference effect may be taken into consideration only when the memory cell transistor MTi holds the "Er" level. If the memory cell transistor MTi holds another level, the first inter-cell interference effect may be neglected, and considering the second inter-cell interference effect suffices.

5. Fifth Embodiment

A memory system according to the fifth embodiment will be described next. In this embodiment, the second embodiment is applied to the second writing method (the two-step writing method). Differences from the second and fourth embodiments will be described below.

5.1 First Calibrating Reading

The first calibrating reading according to this embodiment will be described first. Note that the normal reading is like that in the first embodiment.

Figure 34:
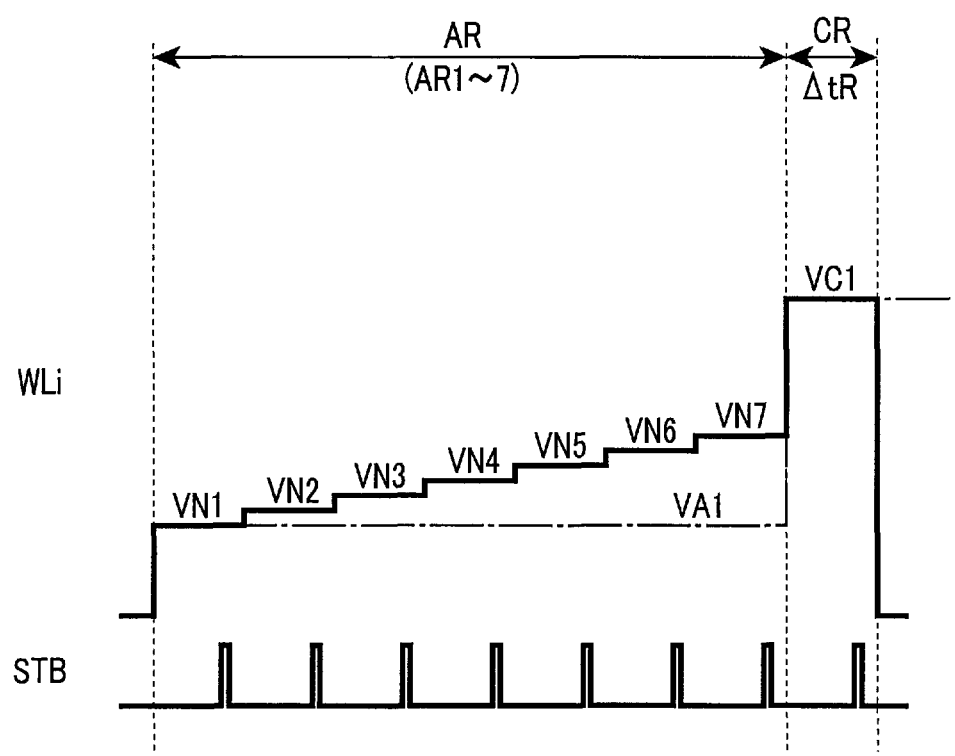
FIG. 34 is a timing chart of various signals in first calibrating reading according to the fifth embodiment.

FIG. 34 is a timing chart of a word line WLi and a signal STB in the main-reading of the first calibrating reading according to this embodiment. FIG. 34 shows the lower page reading. FIG. 34 shows voltages VA1 and VC1 to be used in the normal reading for reference by one-dot dashed lines.

As shown in FIG. 34, a reading operation AR of the main-reading according to this embodiment is like the reading operation AR (AR1 to AR7) described in the second embodiment with reference to FIG. 19. A reading operation CR according to this embodiment is like the normal reading.

Note that the prior-reading operation is also like that in FIG. 18 described in the second embodiment.

5.2 Second Calibrating Reading

The second calibrating reading will be described next. The second calibrating reading calibrates the second inter-cell interference effect. The second inter-cell interference effect when employing the second writing method will be described first with reference to FIG. 35. FIG. 35 shows the waveforms of reading voltages when focusing on the second inter-cell interference effect in the lower page reading.

As shown in FIG. 35, each of the reading voltages in the reading operations AR and CR is stepped down in a stepwise fashion of seven steps. According to the example of FIG. 35, the reading operation AR includes reading operations AR1 to AR7. In the reading operations, voltages VRN1 to VRN7 are applied to the word line WLi, as set to VRN1<VRN2<VRN3< . . . <VRN7. The voltage VRN7 may equal the default voltage VA1. Targets for sampling data by means of the strobe signal in the reading operations AR1 to AR7 are memory cell transistors MT having the combinations belonging to groups N1 to N7.

Similarly, the reading operation CR includes reading operations CR1 to CR7. In the reading operations, voltages VCN1 to VCN7 are applied to the word line WLi, as set to VCN1<VCN2<VCN3< . . . <VCN7. The voltage VCN7 may equal the default voltage VC1. Targets for sampling data by means of the strobe signal in the reading operations CR1 to CR7 are memory cell transistors MT having the combinations belonging to the groups N1 to N7.

In FIG. 36, a way different from FIG. 35 is applied. That is, as in FIG. 32 of the fourth embodiment, the second inter-cell interference effect is substantially neglected for, for example, the "Er" level. Hence, as shown in FIG. 36, the reading operation AR is like the normal reading. The reading operation CR is like that described with reference to FIG. 35.

Figure 37:
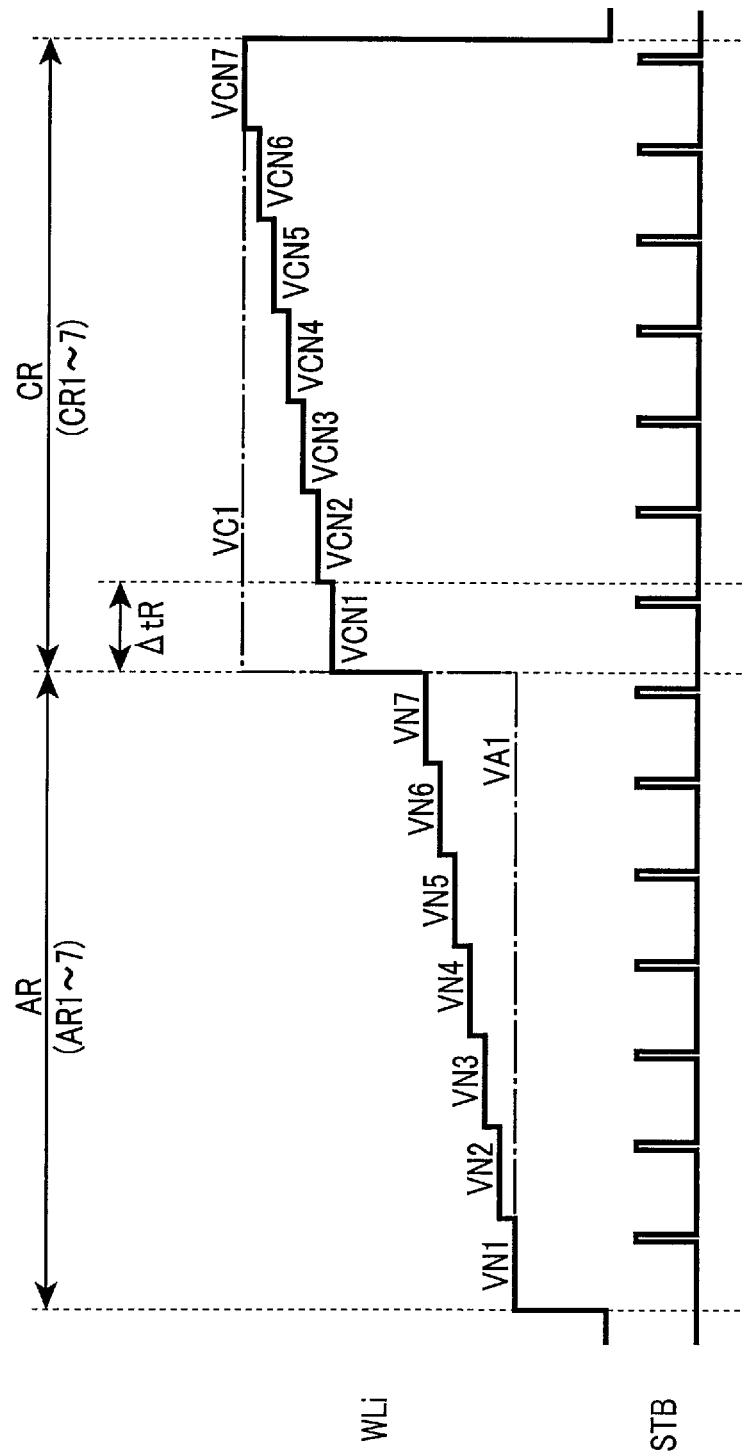
FIG. 37 is a timing chart of various signals in second calibrating reading according to the fifth embodiment.

FIG. 37 shows the waveforms of the reading voltages used in second calibrating reading considering calibration of the first inter-cell interference effect and the second inter-cell interference effect. In FIG. 37, the way shown in FIG. 36 is employed for the second inter-cell interference effect.

As shown in FIG. 37, the reading operation AR is like the reading operation AR of the first calibrating reading (see FIG. 34), and the reading operation CR is like the reading operation CR shown in FIGS. 35 and 36. That is, in the reading operation AR, the first inter-cell interference effect is taken into consideration, and the second inter-cell interference effect is neglected. In contrast, in the reading operation CR, the second inter-cell interference effect is taken into consideration, and the first inter-cell interference effect is neglected. Further in the reading operation AR, the influence of the first inter-cell interference effect may be taken into consideration, as a matter of course. In this case, the waveform of the reading operation AR may be like, for example, that of the reading operation AR shown in FIG. 11.

5.3 Effect According to this Embodiment

As described above, the grouping explained in the second embodiment may also be applied in a case in which the two-step writing method is employed.

6. Sixth Embodiment

A memory system according to the sixth embodiment will be described next. In this embodiment, the third embodiment is applied to the second writing method (the two-step writing method). Differences from the third and fourth embodiments will be described below.

6.1 First Calibrating Reading

The first calibrating reading according to this embodiment will be described first. Note that the normal reading is like that in the first embodiment.

Figure 38:
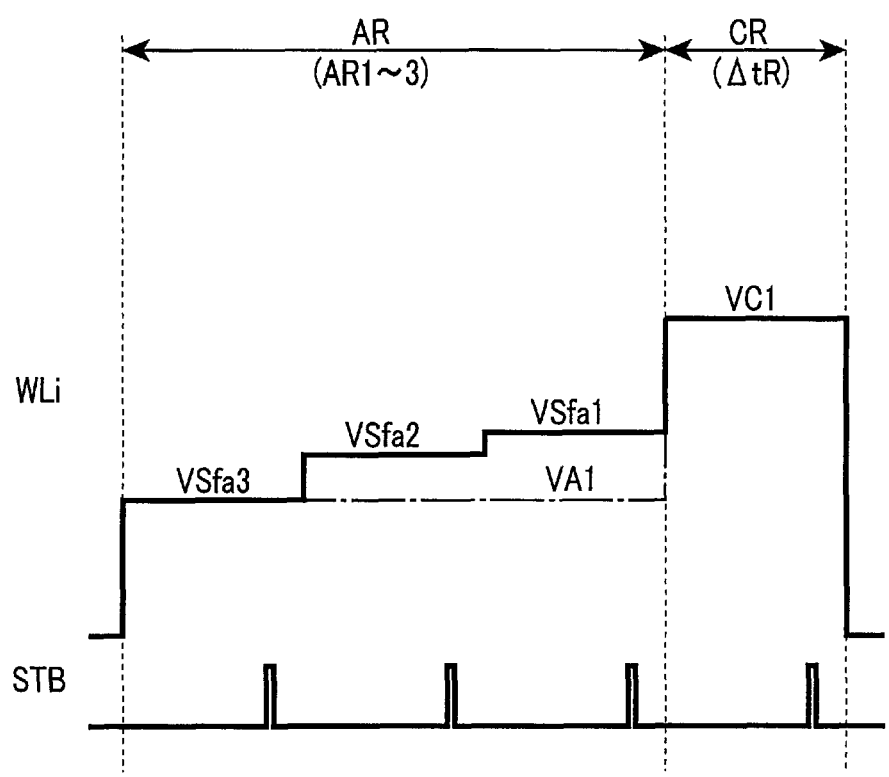
FIG. 38 is a timing chart of various signals in first calibrating reading according to the sixth embodiment.

FIG. 38 is a timing chart of a word line WLi and a signal STB in the main-reading of the first calibrating reading according to this embodiment. FIG. 38 shows the lower page reading. FIG. 38 shows voltages VA1 and VC1 to be used in the normal reading for reference by one-dot dashed lines.

As shown in FIG. 38, a reading operation AR of the main-reading according to this embodiment is like the reading operation AR (AR1 to AR3) described in the third embodiment with reference to FIG. 25. A reading operation CR according to this embodiment is like that of the normal reading. Note that the prior-reading operation is like that shown in FIG. 24 described in the third embodiment.

6.2 Second Calibrating Reading

The second calibrating reading will be described next. The second inter-cell interference effect when employing the second writing method will be described first with reference to FIGS. 39 and 40. FIG. 39 shows the waveforms of word lines WLi, WL(i−1), and WL(i+1) and a signal STB in the prior-reading operation. FIG. 40 shows the waveforms of the word line WLi and the signal STB in the lower page reading of the main-reading.

When considering only the second inter-cell interference effect, specifying memory cell transistors MT(i−1) and MT(i+1) of the "Er" level suffices, as is apparent from the grouping described with reference to FIG. 23. Hence, as shown in FIG. 39, in the prior-reading operation, the reading operation AR is performed, and the reading operations BR and CR are not necessary.

In the main-reading, as shown in FIG. 40, each of the reading voltages in the reading operations AR and CR is stepped down in a stepwise fashion of three steps. According to the example of FIG. 40, the reading operation AR includes reading operations AR1 to AR3. In the reading operations, voltages VASr1 to VASr3 are applied to the word line WLi, as set to VASr1<VASr2<VASr3. The voltage VASr3 may equal the default voltage VA1. Targets for sampling data by means of the strobe signal in the reading operations AR1 to AR3 are memory cell transistors MT having the combinations belonging to groups Sr1 to Sr3.

Similarly, the reading operation CR includes reading operations CR1 to CR3. In the reading operations, voltages VSr1 to VSr3 are applied to the word line WLi, as set to VSr1<VSr2<VSr3. The voltage VSr3 may equal the default voltage VC1. Targets for sampling data by means of the strobe signal in the reading operations CR1 to CR3 are the memory cell transistors MT having the combinations belonging to the groups Sr1 to Sr3.

In FIG. 41, a way different from FIG. 40 is applied. That is, the second inter-cell interference effect is substantially neglected for, for example, the "Er" level. Hence, as shown in FIG. 41, the reading operation AR is like the normal reading. The reading operation CR is like that described with reference to FIG. 40.

FIG. 42 shows the waveforms of the reading voltages used in the main-reading of the second calibrating reading considering calibration of the first inter-cell interference effect and the second inter-cell interference effect. In FIG. 42, the way shown in FIG. 41 is employed for the second inter-cell interference effect.

As shown in FIG. 42, the reading operation AR is like the reading operation AR of first calibrating reading (see FIG. 38), and the reading operation CR is like the reading operation CR shown in FIGS. 40 and 41. That is, in the reading operation AR, the first inter-cell interference effect is taken into consideration, and the second inter-cell interference effect is neglected. In contrast, in the reading operation CR, the second inter-cell interference effect is taken into consideration, and the first inter-cell interference effect is neglected. The prior-reading operation is like that described with reference to FIG. 26.

Figure 43:
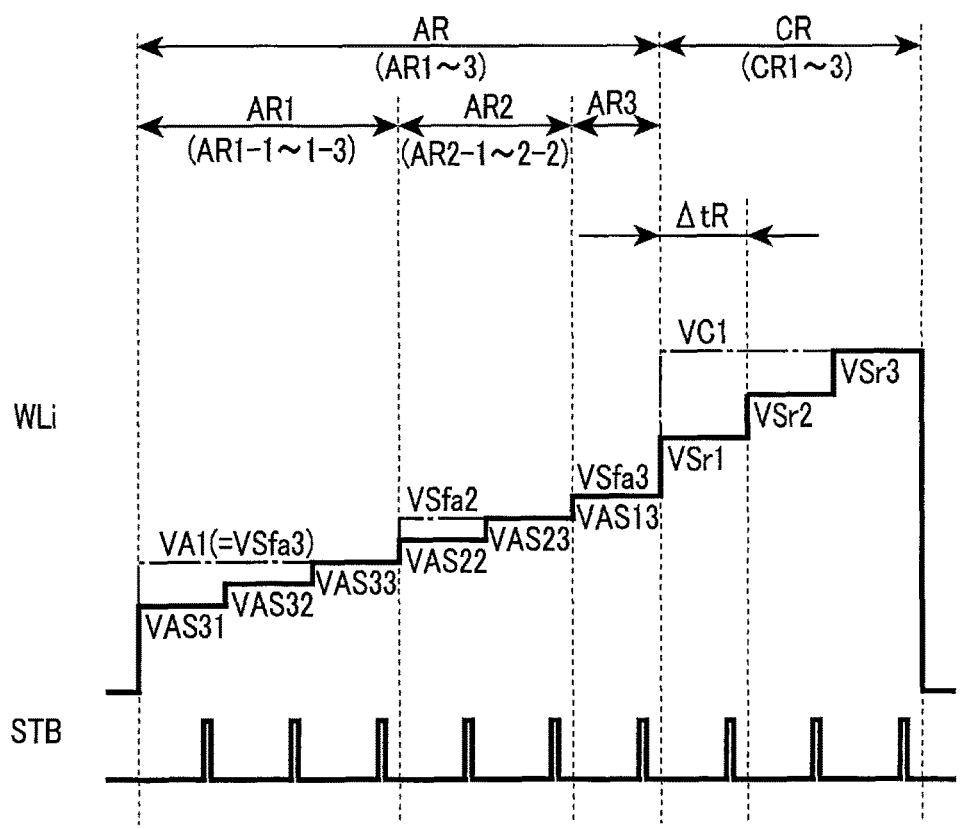

FIG. 43 shows the waveforms of the reading voltages used in the main-reading of the second calibrating reading considering the way shown in FIG. 42 concerning the second inter-cell interference effect. As shown in FIG. 43, the reading operation AR is like the reading operation AR shown in FIG. 27 described in the third embodiment, and the reading operation CR is like the reading operation CR shown in FIG. 42. Note that the prior-reading operation is like that described with reference to FIG. 26.

6.3 Effect According to this Embodiment

As described above, the grouping explained in the third embodiment may also be applied in a case in which the two-step writing method is employed.

7. Seventh Embodiment

A memory system according to the seventh embodiment will be described next. In this embodiment, the first to third embodiments are applied in a case in which each memory cell transistor may hold 3-bit data. That is, this is a case in which the first writing method may be employed as the writing method. Differences from the first to third embodiments will be described below.

7.1 Threshold Distribution

Figure 44:
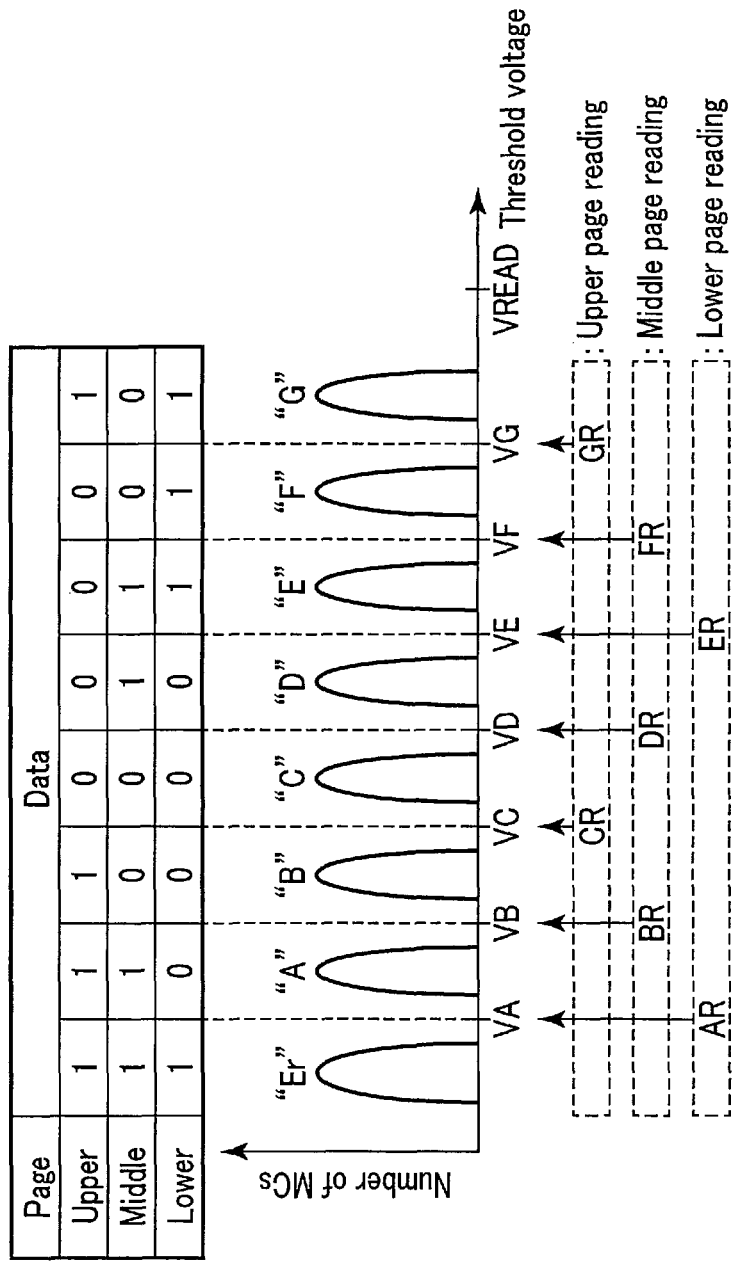
FIG. 44 is a graph showing the threshold distributions of a memory cell according to the seventh embodiment.

FIG. 44 is a diagram showing data that a memory cell transistor MT according to this embodiment may take, threshold distributions, and voltages used at the time of reading.

As described above, the memory cell transistor MT may hold 3-bit data in accordance with the threshold voltage. Data expressed by 3 bits will be referred to as "Er" level, "A" level, "B" level, "C" level, . . . , "G" level in ascending order of threshold voltage.

The threshold voltage of the memory cell transistor MT of the "Er" level is less than a voltage VA, and this state corresponds to an erased data state. The threshold voltage of the memory cell transistor MT of the "A" level is equal to or higher than the voltage VA and less than VB (>VA). The threshold voltage of the memory cell transistor MT of "B" level is equal to or higher than the voltage VB and less than VC (>VB). The threshold voltage of the memory cell transistor MT of "C" level is equal to or higher than the voltage VC and less than VD (>VC). The threshold voltage of the memory cell transistor MT of "D" level is equal to or higher than the voltage VD and less than VE (>VD). The threshold voltage of the memory cell transistor MT of "E" level is equal to or higher than the voltage VE and less than VF (>VE). The threshold voltage of the memory cell transistor MT of "F" level is equal to or higher than the voltage VF and less than VG (>VF). The threshold voltage of the memory cell transistor MT of "G" level is equal to or higher than the voltage VG and less than VREAD. Of the 3-bit data, the "G" level corresponds to data of the highest threshold voltage.

The threshold distributions are implemented by writing the above-described 3-bit data (the bits will be referred to as a lower bit, a middle bit, and an upper bit). That is, the relationship between the levels of "Er" to "G", and the lower, middle and upper bits may be as follows:

"Er" level: "111" (the bits are arranged in order of "upper/middle/lower")
"A" level: "110"
"B" level: "100"
"C" level: "000"
"D" level: "010"
"E" level: "011"
"F" level: "001"
"G" level: "101"

As such, one of the three bits changes between data corresponding to two adjacent states in the threshold distributions.

Hence, the reading of the lower bit may use a voltage corresponding to the boundary where the value ("0" or "1") of the lower bit changes. This may also apply to the reading of the middle bit and the upper bit.

That is, as shown in FIG. 44, in the lower page reading, the voltage VA that discriminates between the "Er" level and the "A" level and the voltage VE that discriminates between the "D" level and the "E" level are used as reading levels. The reading operations using the voltages VA and VE will be referred to as reading operations AR and ER, respectively.

The reading operation AR determines whether the threshold voltage of the memory cell transistor MT is less than the voltage VA. That is, the memory cell transistor MT in the erased state is specified by the reading operation AR. The reading operation ER determines whether the threshold voltage of the memory cell transistor MT is less than the voltage VE.

In the middle page reading, the voltage VB that discriminates between the "A" level and the "B" level, the voltage VD that discriminates between the "C" level and the "D" level, and the voltage VF that discriminates between the "E" level and the "F" level are used as reading levels. The reading operations using the voltages VB, VD, and VF will be referred to as reading operations BR, DR, and FR, respectively.

The reading operation BR determines whether the threshold voltage of the memory cell transistor MT is less than the voltage VB. The reading operation DR determines whether the threshold voltage of the memory cell transistor MT is less than the voltage VD. The reading operation FR determines whether the threshold voltage of the memory cell transistor MT is less than the voltage VF.

In the upper page reading, the voltage VC that discriminates between the "B" level and the "C" level and the voltage VG that discriminates between the "F" level and the "G" level are used as reading levels. The reading operations using the voltages VC and VG will be referred to as reading operations CR and GR, respectively.

The reading operation CR determines whether the threshold voltage of the memory cell transistor MT is less than the voltage VC. The reading operation GR determines whether the threshold voltage of the memory cell transistor MT is less than the voltage VG. That is, the memory cell transistor MT of "G" level is specified by the reading operation GR.

7.2 Normal Reading

Figure 45:
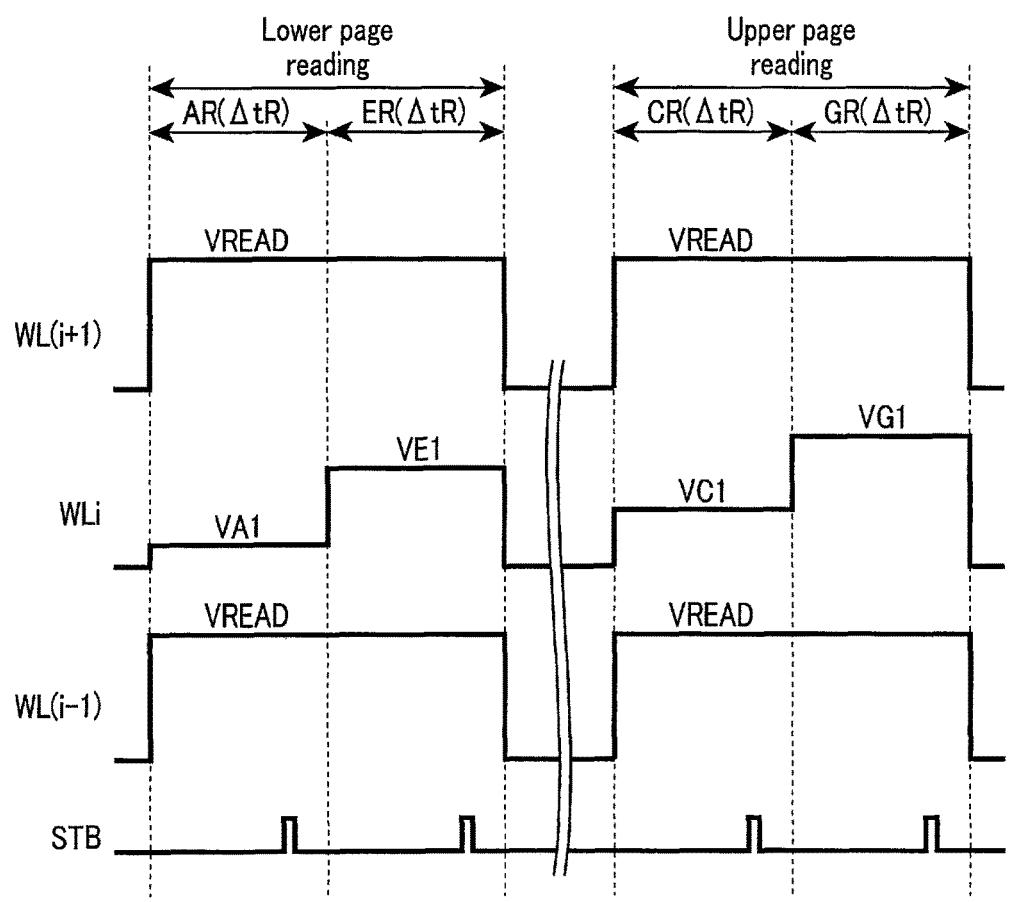
FIG. 45 is a timing chart of various signals in normal reading according to the seventh embodiment.

The normal reading (step S11) according to this embodiment will be described first with reference to FIG. 45 using the lower page reading and the upper page reading as an example. FIG. 45 is a timing chart of word lines WLi, WL(i−1), and WL(i+1) and a signal STB.

As shown in FIG. 45, in lower page reading, the voltage of the selected word line WLi is stepped up in the reading operation AR where a voltage VA1 is given to the selected word line WLi and in the reading operation ER where a voltage VE1 is given to the selected word line WLi. The voltages VA1 and VE1 are the default values of the reading voltages in the reading operations AR and ER. The voltage VREAD is applied to the unselected word lines.

In upper page reading, the voltage of the selected word line WLi is stepped up in the reading operation CR where a voltage VC1 is given to the selected word line WLi and in the reading operation GR where a voltage VG1 is given to the selected word line WLi. The voltages VC1 and VG1 are the default values of the reading voltages in the reading operations CR and GR. The voltage VREAD is applied to the unselected word lines.

7.3 Grouping in Lower Page Reading

An example of grouping applied in the lower page reading will be described next. The grouping method is not limited to this example, and grouping may be absent as in the first and fourth embodiments. This may also apply to the upper page reading to be described later.

FIG. 46 shows an example of the grouping applied to the reading operation AR in the first calibrating reading.

This will be described below.

Group Sfa1

The group Sfa1 includes combinations in which both of WL(i−1) and WL(i+1) are the "F" level or "G" level. That is, the combinations of WL(i−1) and WL(i+1) include "F/F", "F/G", "G/F", and "G/G". The group Sfa1 is a group that has the significant influence by the first inter-cell interference effect.

Group Sfa2

The group Sfa2 includes combinations in which only one of WL(i−1) and WL(i+1) is the "F" level or "G" level. That is, the combinations of WL(i−1) and WL(i+1) include "F/Er", "F/A", "F/B", "F/C", "F/D", "F/E", "G/Er", "G/A", "G/B", "G/C", "G/D", "G/E", "Er/F", "A/F", "B/F", "C/F", "ID/F", "E/F", "Er/G", "A/G", "B/G", "C/G", "D/G", or "E/G". The group Sfa2 is a group that has the influence by the first inter-cell interference effect to a predetermined degree but to a lesser degree than the group Sfa1 has.

Group Sfa3

The group Sfa3 includes remaining combinations. The group Sfa3 is a group having combinations in which the first inter-cell interference effect is neglected.

FIG. 47 shows an example of grouping applied to the reading operation ER in the first calibrating reading. This will be described below.

Group Sfe1

The group Sfe1 includes combinations in which the word line WL(i+1) is the "F" level or "G" level. The word line WL(i−1) may be any level. The group Sfe1 is a group that has the influence by the first inter-cell interference effect.

Group Sfe2

The group Sfe2 includes remaining combinations. That is, the word line WL(i+1) may be the "Er", "A", "B", "C", "D", or "E" level in the combinations. The influence of the first inter-cell interference effect is smaller in the group Sfe2 than in the group Sfe1.

FIG. 48 shows an example of grouping applied to the reading operation ER for the group Sfe2 in the second calibrating reading. This will be described below.

Group Srel1

The group Srel1 includes a combination in which both of WL(i−1) and WL(i+1) are the "Er" level. The group Srel1 is a group that has the significant influence by the second inter-cell interference effect.

Group Srel2

The group Srel2 includes a combination in which either one of WL(i−1) and WL(i+1) is the "Er" level. That is, the combinations of WL(i−1) and WL(i+1) include "Er/A", "Er/B", "Er/C", "Er/D", "Er/E", "A/Er", "B/Er", "C/Er", "D/Er", "E/Er", "F/Er", and "G/Er". The group Srel2 is a group that has the influence by the second inter-cell interference effect to a predetermined degree but to a lesser degree than the group Srel1 has.

Group Srel3

The group Srel3 includes remaining combinations. The influence of the second inter-cell interference effect is smaller in the group Srel3 than in the remaining groups.

FIG. 49 shows an example of the grouping applied to the reading operation ER for the group Sfe1 in the second calibrating reading. This will be described below.

Group Sreh1

The group Sreh1 includes combinations in which both of WL(i−1) and WL(i+1) are the "Er/F" level or "Er/G" level.

The group Sreh1 is a group that has the influence by the second inter-cell interference effect.

Group Sreh2

The group Sreh2 includes remaining combinations. The influence of the second inter-cell interference effect is smaller in the group Sreh2 than in the remaining groups.

7.4 First Calibrating Reading for Lower Page

The first calibrating reading (step S14) for the lower page will be described next. In the prior-reading operation, the reading operation FR is executed for the word lines WL(i−1) and WL(i+1). Accordingly, the memory cell transistors MT of "F" level or more on the word lines WL(i−1) and WL(i+1) are specified.

The main-reading will be described next with reference to FIG. 50. FIG. 50 is a timing chart of voltages applied to the selected word line WLi in the main-reading and the signal STB. FIG. 50 shows the voltages VA1 and VE1 to be used in the normal reading for reference by one-dot dashed lines.

The reading operation AR will be described first. As shown in FIG. 50, in the reading operation AR, the voltage applied to the selected word line WLi is stepped up in three steps. Data is sampled by means of the strobe signal at each of the voltages of three steps, and the operations will be referred to as reading operations AR1 to AR3.

In the reading operation AR1 executed first, the voltage VA1 is applied to the selected word line WLi. In the reading operation AR1, A selected word line WLi having the combinations in the group Sfa3 described with reference to FIG. 46 is a target for sampling data by means of the strobe signal.

In the reading operation AR2 executed next, a voltage VA2 is applied to the selected word line WLi. In the reading operation AR2, a word line WLi having the combinations in the group Sfa2 described with reference to FIG. 46 is a target for sampling data by means of the strobe signal.

In the reading operation AR3 executed finally, a voltage VA3 is applied to the selected word line WLi. In the reading operation AR3, a selected word line WLi having the combinations in the group Sfa1 described with reference to FIG. 46 is a target for sampling data by means of the strobe signal.

In the example of FIG. 50, VA1<VA2<VA3 is set.

The reading operation ER will be described next. As shown in FIG. 50, in the reading operation ER, the voltage applied to the selected word line WLi is stepped up in two steps. Data is sampled by the strobe signal at each of the voltages of two steps, and the operations will be referred to as reading operations ER1 and ER2.

In the reading operation ER1 executed first, the voltage VE1 is applied to the selected word line WLi. In the reading operation ER1, a selected word line WLi having the combinations in the group Sfe2 described with reference to FIG. 47 is a target for sampling data by means of the strobe signal.

In the reading operation ER2 executed next, a voltage VE2 is applied to the selected word line WLi. In the reading operation ER2, a selected word line WLi having the combinations in the group Sfe1 described with reference to FIG. 47 is a target for sampling data by means of the strobe signal.

In addition, VE1<VE2 is set.

7.5 Second Calibrating Reading for Lower Page

The second calibrating reading (steps S18, S22, and S26 and the retry reading) for the lower page will be described next. Even if the memory cell transistor MT holds 3-bit data, information of the reading voltages used in the second calibrating reading are stored in the shift table. That is, in the shift table shown in FIG. 5, information used at the time of second calibrating reading in the reading operations DR to GR are added.

FIG. 51 is a timing chart of voltages applied to the selected word line WLi and the unselected word lines WL(i−1) and WL(i+1) in prior-reading of second calibrating reading and the signal STB.

As shown in FIG. 51, when reading data from the word line WL(i−1), the voltage VREAD is applied to the word lines WLi and WL(i+1), and the voltages VA1 and VF1 are applied to the word line WL(i−1) in turn. As a result, a memory cell transistor MT(i−1) that holds the "Er" level or "F" level or a higher level is specified for the word line WL(i−1). Next, data is read from the word line WL(i+1). That is, the voltage VREAD is applied to the word lines WLi and WL(i−1), and the voltages VA1 and VF1 are applied to the word line WL(i+1). As a result, a memory cell transistor MT(i+1) that holds the "Er" level or "F" level or a higher level is specified for the word line WL(i+1). These prior-reading results are held by, for example, the sense amplifier 140.

FIG. 52 is a timing chart of voltages applied to the selected word line WLi in the main-reading of the second calibrating reading for the lower page and the signal STB. FIG. 52 shows the voltages VA1, VE1, and VE2 to be used in the first calibrating reading for reference by one-dot dashed lines.

The reading operation AR will be described first. In this example, the second inter-cell interference effect for the "Er" level is neglected. Hence, the reading operation AR is like that in first calibrating reading described with reference to FIG. 50.

The reading operation ER will be described next. As shown in FIG. 52, the reading voltages VE1 and VE2 in the first calibrating reading are stepped down in stepwise fashions of three steps and two steps, respectively. Hence, in the entire reading operation ER, the reading voltage is stepped up in five steps. Data is sampled by means of the strobe signal at each of the voltages of five steps. Operations of applying the voltages in the three steps in the reading operation ER1 of the second calibrating reading will be referred to as reading operations ER1-1 to ER1-3 hereinafter. In addition, operations of applying the voltages in the two steps in the reading operation ER2 of the second calibrating reading will be referred to as reading operations ER2-1 and ER2-2.

In the reading operation ER1-1 executed first, a voltage VE4 is applied to the selected word line WLi. The voltage VE4 has a value shifted from, for example, the default voltage VE1 by a shift amount S1 E1 designated in the 1-month lapse table. In the reading operation ER1-1, a selected word line WLi having the combinations in the group Srel1 described with reference to FIG. 48 is a target for sampling data by means of the strobe signal.

In the reading operation ER1-2 executed next, a voltage VE3 is applied to the selected word line WLi. In the reading operation ER1-2, a selected word line WLi having the combinations in the group Srel2 described with reference to FIG. 48 is a target for sampling data by means of the strobe signal.

In the reading operation ER1-3 executed next, the voltage VE1 is applied to the selected word line WLi. In the reading operation ER1-3, a selected word line WLi having the combinations in the group Srel3 described with reference to FIG. 48 is a target for sampling data by means of the strobe signal. Note that in FIG. 52, the default value VE1 is given in the reading operation ER1 using the 1-month lapse table. However, the shift table stores the information of the reading voltages used in this reading operation ER1 as well. This example merely shows, by way of example, a case in which a reading voltage is set to the default value VE1. Hence, if a value ΔV for the reading operation ER1 3 is set as a shift value in the 1-month lapse table, the reading voltage used in the reading operation ER1-3 may be, for example, (VE1−ΔV). This may also apply to the reading operation ER2-2 to be described later.

In the reading operation ER2-1 executed next, a voltage VE5 is applied to the selected word line WLi. In the reading operation ER2-1, a selected word line WLi having the combinations in the group Sreh1 described with reference to FIG. 49 is a target for sampling data by means of the strobe signal.

In the reading operation ER2-2 executed finally, a voltage VE2 is applied to the selected word line WLi. In the reading operation ER2-2, a selected word line WLi having the combinations in the group Sreh2 described with reference to FIG. 49 is a target for sampling data by means of the strobe signal.

As described in the first embodiment, the second inter-cell interference effect has an influence in a direction lowering the threshold voltage. Hence, the voltages in the reading operations AR and ER are stepped down in stepwise fashions in the second calibrating reading. In the example of FIG. 52, VE4<VE3<VE1<VE5<VE2 is set.

In addition, the lower the threshold voltage of an adjacent memory cell transistor is, the larger the second inter-cell interference effect is. Hence, for example, the following relationship may be realized.

$$(VE2-VE5) \leq (VE1-VE4)$$

7.6 Grouping in Upper Page Reading

An example of the grouping applied in the upper page reading will be described next.

FIG. 53 shows an example of the grouping applied to the first calibrating reading, which is common to the reading operations CR and GR. This will be described below.

Group Sfcg1

The group Sfcg1 includes combinations in which WL(i+1) is the "F" level or "G" level. The word line WL(i−1) may have any level. Hence, the group Sfcg1 is a group that has the significant influence of the first inter-cell interference effect.

Group Sfcg2

The group Sfcg2 includes combinations in which WL(i+1) is the "Er", "A", "B", "C", "D", or "E" level. The word line WL(i−1) may have any level. The influence of the first inter-cell interference effect is smaller in the group Sfcg2 than in the group Sfcg1.

FIG. 54 shows an example of the grouping applied to the reading operation GR for the group Sfcg2 in the second calibrating reading. This will be described below.

Group Srgl1

The group Srgl1 includes a combination in which both of WL(i−1) and WL(i+1) are the "Er" level. The group Srgl1 is a group that has the significant influence of the second inter-cell interference effect.

Group Srgl2

The group Srgl2 includes combinations in which either one of WL(i−1) and WL(i+1) is the "Er" level. That is, the combinations of WL(i−1) and WL(i+1) include "Er/A", "Er/B", "Er/C", "Er/D", "Er/E", "A/Er", "B/Er", "C/Er", "D/Er", "E/Er", "F/Er", and "G/Er". The group Srgl2 is a group that has the influence of the second inter-cell interference effect to a predetermined degree but to a lesser degree than the group Srgl1 has.

Group Srgl3

The group Srgl3 includes remaining combinations. The influence of the second inter-cell interference effect is smaller in the group Srgl3 than in the remaining groups.

FIG. 55 shows an example of the grouping applied to the reading operation GR for the group Sfcg1 in second calibrating reading. This will be described below.

Group Srgh1

The group Srgh1 includes combinations in which WL(i−1) and WL(i+1) are the "Er/F" level or "Er/G" level. The group Srgh1 is a group that has the influence of the second inter-cell interference effect.

Group Srgh2

The group Srgh2 includes remaining combinations. The influence of the second inter-cell interference effect is smaller in the group Srgh2 than in the group Srgh1.

7.7 First Calibrating Reading for Upper Page

The first calibrating reading (step S14) for the upper page will be described next. In the prior-reading operation, the reading operation FR is executed for the word lines WL(i−1) and WL(i+1). Accordingly, the memory cell transistors MT of "F" level or a higher level on the word lines WL(i−1) and WL(i+1) are specified.

Figure 56:
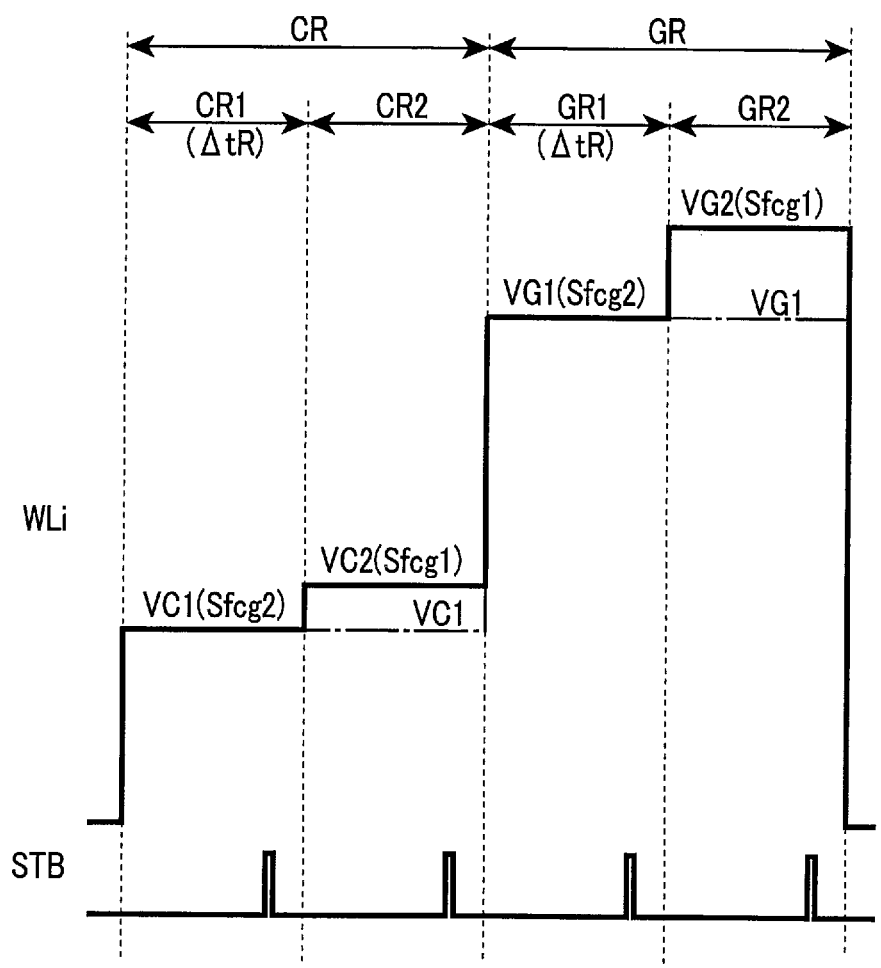
FIG. 56 is a timing chart of various signals in first calibrating reading according to the seventh embodiment.

The main-reading will be described next with reference to FIG. 56. FIG. 56 is a timing chart of voltages applied to the selected word line WLi in the main-reading and the signal STB. FIG. 56 shows the voltages VC1 and VG1 to be used in the normal reading for reference by one-dot dashed lines.

The reading operation CR will be described first. As shown in FIG. 56, in the reading operation CR, the voltage applied to the selected word line WLi is stepped up in two steps. Data is sampled by means of the strobe signal at each of the voltages of two steps, and the operations will be referred to as reading operations CR1 and CR2.

In the reading operation CR1 executed first, the voltage VC1 is applied to the selected word line WLi. In the reading operation CR1, a selected word line WLi having the combinations in the group Sfcg2 described with reference to FIG. 53 is a target for sampling data by means of the strobe signal.

In the reading operation CR2 executed next, a voltage VC2 is applied to the selected word line WLi. In the reading operation CR2, a selected word line WLi having the combinations in the group Sfcg1 described with reference to FIG. 53 is a target for sampling data by means of the strobe signal.

In the example of FIG. 56, VC1<VC2 is set.

The reading operation GR will be described next. As shown in FIG. 56, in the reading operation GR as well, the voltage applied to the selected word line WLi is stepped up in two steps. Data is sampled by means of the strobe signal at each of the voltages of two steps, and the operations will be referred to as reading operations GR1 and GR2.

In the reading operation GR1 executed first, the voltage VG1 is applied to the selected word line WLi. In the reading operation GR1, a selected word line having the combinations in the group Sfcg2 described with reference to FIG. 53 is a target for sampling data by means of the strobe signal.

In the reading operation GR2 executed next, a voltage VG2 is applied to the selected word line WLi. In the reading operation GR2, a selected word line WLi having the combinations in the group Sfcg1 described with reference to FIG. 53 is a target for sampling data by means of the strobe signal.

In addition, VG1<VG2 is set.

7.8 Second Calibrating Reading for Upper Page

The second calibrating reading (steps S18, S22, and S26 and the retry reading) for the upper page will be described next.

Figure 57:
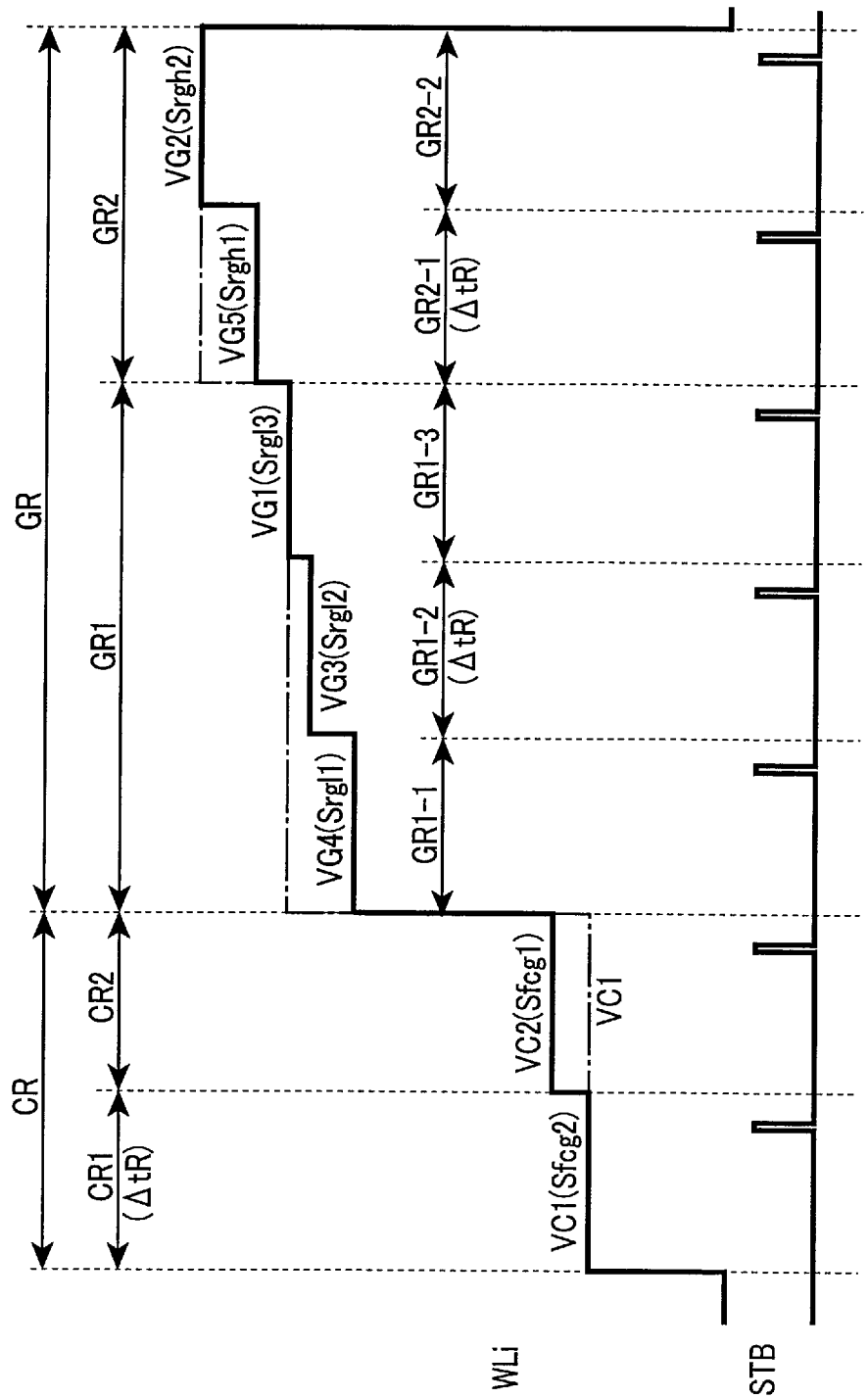
FIG. 57 is a timing chart of various signals in second calibrating reading according to the seventh embodiment.

In the prior-reading of second calibrating reading, the reading operations AR and FR are executed, as described with reference to FIG. 51. Next, the main-reading operation is performed. FIG. 57 is a timing chart of voltages applied to the selected word line WLi in the main-reading of the second calibrating reading for the upper page and the signal STB. FIG. 57 shows the voltages VC1, VG1, and VG2 to be used in the first calibrating reading for reference by one-dot dashed lines.

The reading operation CR will be described first. In this example, the second inter-cell interference effect for the "Er" to "B" levels is neglected. Hence, the reading operation CR is like that in the first calibrating reading described with reference to FIG. 56.

The reading operation GR will be described next. As shown in FIG. 57, the reading voltages VG1 and VG2 in the first calibrating reading are stepped down in stepwise fashions of three steps and two steps, respectively. Hence, in the entire reading operation GR, the reading voltage is stepped up in five steps. Data is sampled by means of the strobe signal at each of the voltages of five steps. Operations of applying the voltages in three steps in the reading operation GR1 of the second calibrating reading will be referred to as reading operations GR1-1 to GR1-3 hereinafter. In addition, operations of applying the voltages in two steps in the reading operation GR2 of the second calibrating reading will be referred to as reading operations GR2-1 and GR2-2.

In the reading operation GR1-1 executed first, a voltage VG4 is applied to the selected word line WLi. The voltage VG4 has a value shifted from, for example, the default voltage VG1 by a shift amount S1 G1 designated in the 1-month lapse table. In the reading operation GR1-1, a selected word line WLi having the combinations in the group Srgl1 described with reference to FIG. 54 is a target for sampling data by means of the strobe signal.

In the reading operation GR1-2 executed next, a voltage VG3 is applied to the selected word line WLi. In the reading operation GR1-2, a selected word line WLi having the combination in the group Srgl2 described with reference to FIG. 54 is a target for sampling data by means of the strobe signal.

In the reading operation GR1-3 executed next, the voltage VG1 is applied to the selected word line WLi. In the reading operation GR1-3, a selected word line having the combinations in the group Srgl3 described with reference to FIG. 54 is a target for sampling data by means of the strobe signal.

In the reading operation GR2-1 executed next, a voltage VG5 is applied to the selected word line WLi. In the reading operation GR2-1, a selected word line WLi having the combinations in the group Srgh1 described with reference to FIG. 55 is a target for sampling data by means of the strobe signal.

In the reading operation GR2-2 executed finally, a voltage VG2 is applied to the selected word line WLi. In the reading operation GR2-2, a selected word line having the combinations in the group Srgh2 described with reference to FIG. 55 is a target for sampling data by means of the strobe signal.

In this example as well, the voltages in the reading operations CR and GR are stepped down in stepwise fashions in the second calibrating reading. In the example of FIG. 57, VG4<VG3<VG1<VG5<VG2 is set. In addition, for example, the following relationship is realized.

$$(VG2-VG5) \leq (VG1-VG4)$$

7.9 Effect According to this Embodiment

As described above, the first to third embodiments may also be applied in a case in which the memory cell transistor holds 3-bit data.

8. Eighth Embodiment

A memory system according to the eighth embodiment will be described next. In this embodiment, the fourth to sixth embodiments are applied in a case in which each memory cell transistor may hold 3-bit data. That is, this is a case in which the second writing method is employed as the writing method. Differences from the fourth to sixth embodiments will be described below. The threshold distributions of a memory cell transistor MT and the normal reading are similar to those described in the seventh embodiment.

8.1 First Calibrating Reading for Lower Page

The first calibrating reading (step S14) for the lower page will be described first. In the first calibrating reading, the grouping shown in FIG. 46 described in the seventh embodiment is applied. Hence, in the prior-reading operation, a reading operation FR is executed for word lines WL(i−1) and WL(i+1). Accordingly, memory cell transistors MT(i−1) and MT(i+1) of "F" level or a higher level on the word lines WL(i−1) and WL(i+1) are specified.

The main-reading will be described next with reference to FIG. 58. FIG. 58 is a timing chart of voltages applied to a selected word line WLi in the main-reading and a signal STB. FIG. 58 shows voltages VA1 and VE1 to be used in the normal reading for reference by one-dot dashed lines.

A reading operation AR will be described first. As shown in FIG. 58, in the reading operation AR, the voltage applied to the selected word line WLi is stepped up in three steps. The reading operation AR is like the reading operations AR1 to AR3 shown in FIG. 50 described in the seventh embodiment.

In a reading operation ER, the reading voltage is not shifted. This is because according to the second writing method, the second inter-cell interference effect for the memory cell transistor MT having a threshold level higher than "Er" may be neglected, as described above. That is, executing the first calibrating reading for the reading operation AR suffices.

8.2 Second Calibrating Reading for Lower Page

The second calibrating reading (steps S18, S22, and S26 and the retry reading) for the lower page will be described next. In the second calibrating reading, the grouping methods shown in FIGS. 46 and 48 described in the seventh embodiment may be applied. Hence, in the prior-reading operation, the reading operations AR and FR are executed for the word lines WL(i−1) and WL(i+1). Accordingly, the memory cell transistors MT of the "Er" level and the memory cell transistors MT of "F" level or a higher level on the word lines WL(i−1) and WL(i+1) are specified.

FIG. 59 is a timing chart of voltages applied to the selected word line WLi in the main-reading of the second calibrating reading for the lower page and the signal STB. FIG. 59 shows voltages VA1 and VE1 to be used in the normal reading for reference by one-dot dashed lines.

The reading operation AR will be described first. In this example, the second inter-cell interference effect for the "Er" level is neglected. Hence, the reading operation AR is like that in first calibrating reading described with reference to FIG. 58.

The reading operation ER will be described next. As shown in FIG. 59, the reading voltage VE1 in normal reading is stepped down in a stepwise fashion of three steps. Data is sampled by means of the strobe signal at each of the voltages of three steps. Operations of applying the voltages in three steps in the reading operation ER will be referred to as reading operations ER1-1 to ER1-3 hereinafter. The reading operations ER1-1 to ER1-3 of this example are like the reading operations ER1-1 to ER1-3 shown in FIG. 52 described in the seventh embodiment. That is, in the reading operation ER1-1, a selected word line WLi having the combinations in the group Srel1 described with reference to FIG. 48 is a target for sampling data by means of the strobe signal. In the reading operation ER1-2, a selected word line WLi having the combinations in the group Srel2 is a target for sampling data by means of the strobe signal. In the reading operation ER1-3, a selected word line having the combination in the group Srel3 is a target for sampling data by means of the strobe signal.

The second inter-cell interference effect has an influence in a direction of lowering the threshold voltage. Hence, the voltages in the reading operation ER are stepped down in a stepwise fashion. In the example of FIG. 59, VE4<VE3<VE1 is set. In addition, the degree of lowering of the reading voltage along with the lapse of time is largest in VE4 and smallest in VE1.

8.3 Second Calibrating Reading for Upper Page

The second calibrating reading (steps S18, S22, and S26 and the retry reading) for the upper page will be described next.

The upper page reading does not include the reading operation AR. For this reason, when the second writing method is employed, it may not require the first calibrating reading. In the second calibrating reading, the grouping described with reference to FIG. 54 may be employed. Hence, in the prior-reading operation, the reading operation AR is executed for the word lines WL(i−1) and WL(i+1). Accordingly, the memory cell transistors MT of the "Er" level on the word lines WL(i−1) and WL(i+1) are specified.

FIG. 60 is a timing chart of voltages applied to the selected word line WLi in the main-reading of the second calibrating reading for the upper page, and the signal STB. FIG. 60 shows the voltages VC1 and VG1 to be used in the normal reading for reference by one-dot dashed lines.

The reading operation CR will be described first. In this example, the second inter-cell interference effect for the "Er" to "B" levels is neglected. Hence, the reading operation CR is like the normal reading.

The reading operation GR will be described next. As shown in FIG. 60, the reading voltage VG1 in the normal reading is stepped down in a stepwise fashion of three steps. Data is sampled by means of the strobe signal at each of the voltages of three steps. Operations of applying the voltages in three steps in the reading operation GR will be referred to as reading operations GR1-1 to GR1-3 hereinafter. The reading operations GR1-1 to GR1-3 according to this example are like the reading operations GR1-1 to GR1-3 shown in FIG. 59 described in the seventh embodiment. That is, in the reading operation GR1-1, a selected word line WLi having the combination in the group Srgl1 described with reference to FIG. 54 is a target for sampling data by means of the strobe signal. In the reading operation GR1-2, a selected word line WLi having the combination in the group Srgl2 is a target for sampling data by means of the strobe signal. In the reading operation GR1-3, a selected word line WLi having the combination of the group Srgl3 is a target for sampling data by means of the strobe signal.

The second inter-cell interference effect has an influence in a direction of lowering the threshold voltage. Hence, the voltages in the reading operation GR are stepped down in a stepwise fashion. In the example of FIG. 60, VG4<VG3<VG1 is set. In addition, the degree of lowering of the reading voltage along with the lapse of time is largest in VG4 and smallest in VG1.

8.4 Effect According to this Embodiment

As described above, the fourth to sixth embodiments may also be applied in a case in which the memory cell transistor holds 3-bit data.

9. Ninth Embodiment

A memory system according to the ninth embodiment will be described next. In this embodiment, the fourth to sixth embodiments are applied in a case in which each memory cell transistor may hold 4-bit data. That is, this is a case in which the second writing method is employed as the writing method. Differences from the fourth to sixth embodiments will be described below.

9.1 Threshold Distribution

FIG. 61 is a diagram showing data that each memory cell transistor MT may take, threshold distributions, and voltages used at the time of reading.

As described above, the memory cell transistor MT may hold 4-bit data in accordance with the threshold voltage. Data expressed by 4 bits will be referred to as "Er" level, "A" level, "B" level, "C" level, . . . , "N" level, and "O" level in ascending order of threshold voltage.

The threshold voltage of the memory cell transistor MT that holds the "Er" data is less than a voltage VA, and this state corresponds to an erased data state. The threshold voltage of the memory cell transistor MT that holds the "A" data is equal to or higher than the voltage VA and less than VB (>VA). The threshold voltage of the memory cell transistor MT that holds the "B" data is equal to or higher than the voltage VB and less than VC (>VB). The threshold voltage of the memory cell transistor MT that holds the "C" data is equal to or higher than the voltage VC and less than VD (>VC). The threshold voltage of the memory cell transistor MT that holds the "D" data is equal to or higher than the voltage VD and less than VE (>VD). The threshold voltage of the memory cell transistor MT that holds the "E" data is equal to or higher than the voltage VE and less than VF (>VE). The threshold voltage of the memory cell transistor MT that holds the "F" data is equal to or higher than the voltage VF and less than VG (>VF). The threshold voltage of the memory cell transistor MT that holds the "G" data is equal to or higher than the voltage VG and less than VH (>VG). The threshold voltage of the memory cell transistor MT that holds the "H" data is equal to or higher than the voltage VH and less than VI (>VH). The threshold voltage of the memory cell transistor MT that holds the "I" data is equal to or higher than the voltage VI and less than VJ (>VI). The threshold voltage of the memory cell transistor MT that holds the "J" data is equal to or higher than the voltage VJ and less than VK (>VJ). The threshold voltage of the memory cell transistor MT that holds the "K" data is equal to or higher than the voltage VK and less than VL (>VK). The threshold voltage of the memory cell transistor MT that holds the "L" data is equal to or higher than the voltage VL and less than VM (>VL). The threshold voltage of the memory cell transistor MT that holds the "M" data is equal to or higher than the voltage VM and less than VN (>VM). The threshold voltage of the memory cell transistor MT that holds the "N" data is equal to or higher than the voltage VN and less than VO (>VN). The threshold voltage of the memory cell transistor MT that holds the "O" data is equal to or higher than the voltage VO and less than VREAD. Of the 4-bit data, the "0" data corresponds to data of the highest threshold voltage.

The threshold distributions are implemented by writing 4-bit (4-page) data formed from a lower bit, a middle bit, an upper bit, and a top bit. That is, the relationship of the data with the lower bit, the middle bit, the upper bit, and top bit is as follows:

"Er" data: "1111" (the bits are arranged in order of "top/upper/middle/lower")
"A" data: "1110"
"B" data: "1010"
"C" data: "1000"
"D" data: "1001"
"E" data: "0001"
"F" data: "0000"
"G" data: "0010"
"H" data: "0110"
"I" data: "0100"
"J" data: "1100"
"K" data: "1101"
"L" data: "0101"
"M" data: "0111"
"N" data: "0011"
"O" data: "1011"

As described with reference to FIG. 44 of the seventh embodiment, even if 4-bit data is held, one of the four bits changes between data corresponding to two adjacent states of the threshold distributions.

Hence, in the lower page reading, the voltage VA that discriminates between the "Er" data and the "A" data, the voltage VD that discriminates between the "C" data and the "D" data, the voltage VF that discriminates between the "E" data and the "F" data, and the voltage VK that discriminates between the "J" data and the "K" data are used as reading levels. Reading operations using the voltages VA, VD, VF, and VK will be referred to as reading operations AR, DR, FR, and KR, respectively.

Similarly, the middle page is read by reading operations CR, GR, IR, and MR. The upper page is read by reading operations BR, HR, and NR. The top page is read by reading operations ER, JR, LR, and OR.

The lower page reading including the reading operation AR of specifying the "Er" level that has the lowest threshold voltage and the top page reading including the reading operation OR of specifying the "O" level that has the highest threshold voltage will be described below.

9.2 Normal Reading

The normal reading (step S11) according to this embodiment will be described first with reference to FIG. 62 by presenting examples in the lower page reading and the top page reading. FIG. 62 is a timing chart for word lines WLi, WL(i−1), and WL(i+1) and a signal STB.

As shown in FIG. 62, in the lower page reading, the voltage of the selected word line WLi is stepped up. In the reading operation AR, a voltage VA1 is applied to the selected word line WLi. In the reading operation DR, a voltage VD1 is applied to the selected word line WLi. In the reading operation FR, a voltage VF1 is applied to the selected word line WLi. In the reading operation KR, a voltage VK1 is applied to the selected word line WLi. The voltages VA1, VD1, VF1, and VK1 are the default values of reading voltages in the reading operations AR, DR, FR, and KR. The voltage VREAD is applied to the unselected word lines.

In the top page reading, the voltage of the selected word line WLi is stepped up. In the reading operation ER, a voltage VE1 is applied to the selected word line WLi. In the reading operation JR, a voltage VJ1 is applied to the selected word line WLi. In the reading operation LR, a voltage VL1 is applied to the selected word line WLi. In the reading operation OR, a voltage VO1 is applied to the selected word line WLi. The voltages VE1, VJ1, VL1, and VO1 are the default values of reading voltages in the reading operations ER, JR, LR, and OR. The voltage VREAD is applied to the unselected word lines.

9.3 First Calibrating Reading for Lower Page

The first calibrating reading (step S14) for the lower page will be described next. In the prior-reading operation, the reading operation JR is executed for the word lines WL(i−1) and WL(i+1), as shown in FIG. 63. Accordingly, the memory cell transistors MT of "J" level or higher levels on the word lines WL(i−1) and WL(i+1) are specified.

Figure 64:
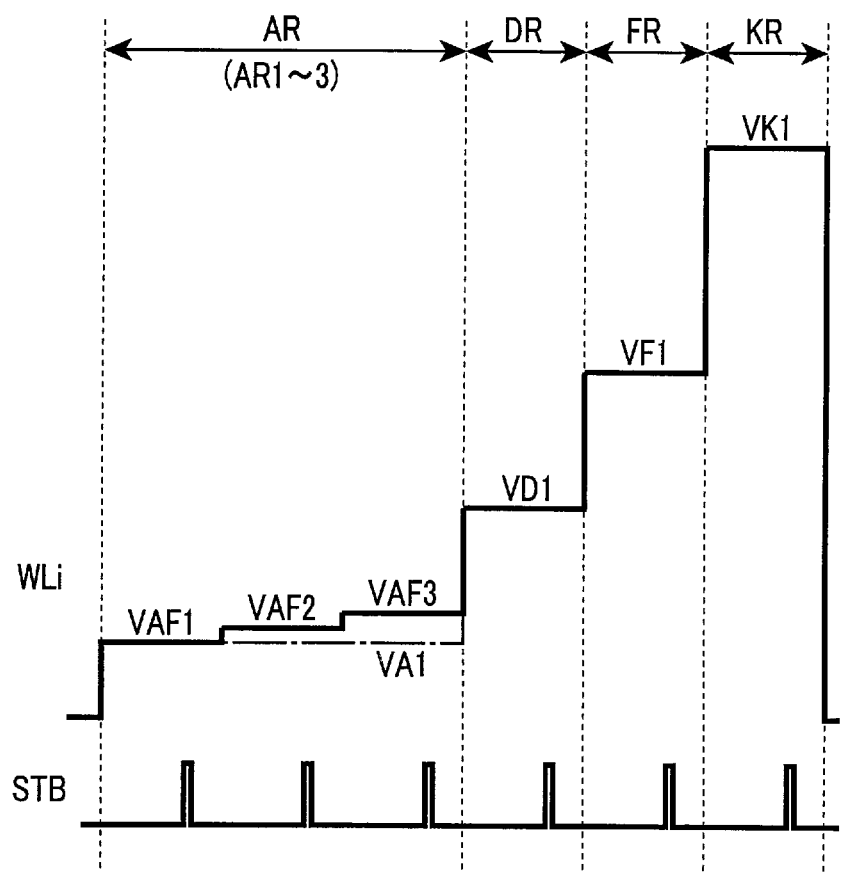

The main-reading will be described next with reference to FIG. 64. FIG. 64 is a timing chart of voltages applied to the selected word line WLi in the main-reading and the signal STB. FIG. 64 shows the voltage VA1 to be used in the normal reading for reference by an one-dot dashed line.

The reading operation AR will be described first. As shown in FIG. 64, in the reading operation AR, the voltage applied to the selected word line WLi is stepped up in three steps. Data is sampled by means of the strobe signal at each of the voltages of three steps, and the operations will be referred to as reading operations AR1 to AR3.

In the reading operation AR1 executed first, a voltage VAF1 is applied to the selected word line WLi. In the reading operation AR1, for example, a selected word line WLi having combinations in which both of the word lines WL(i−1) and WL(i+1) have levels less than the "J" level, that is, the "Er" to "I" levels is a target for sampling data by means of the strobe signal.

In the reading operation AR2 executed next, a voltage VAF2 is applied to the selected word line WLi. In the reading operation AR2, for example, a selected word line WLi having combinations in which either one of the word lines WL(i−1) and WL(i+1) has the "J" level or higher levels, that is, the "J" to "0" levels, and the other of the word lines has a level lower than the "J" level, that is, the "Er" to "I" levels is a target for sampling data by means of the strobe signal.

In the reading operation AR3 executed next, a voltage VAF3 is applied to the selected word line WLi. In the reading operation AR3, for example, a selected word line having combinations in which both of the word lines WL(i−1) and WL(i+1) have the "J" level or higher levels is a target for sampling data by means of the data strobe.

In the example of FIG. 64, VAF1<VAF2<VAF3 is set, and VAF1=VA1 is also set.

For the reading operations DR, FR, and KR, the first calibrating reading is not performed. This is because data is written by the second writing method.

9.4 Second Calibrating Reading for Lower Page

The second calibrating reading (steps S18, S22, and S26 and the retry reading) for the lower page will be described next. Even if the memory cell transistor MT holds 4-bit data, information of reading voltages used in the second calibrating reading are stored in the shift table. That is, in the shift table shown in FIG. 5, information of the reading voltages used at the time of second calibrating reading in the reading operations DR to OR is added.

Figure 65:
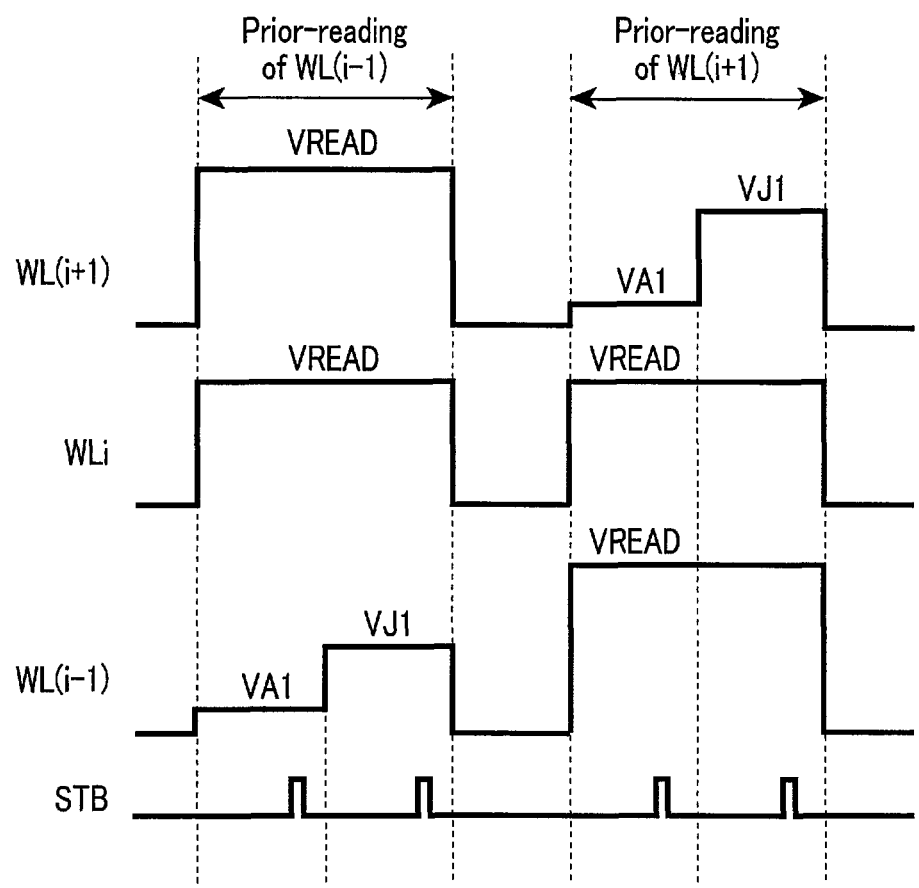
FIG. 65 is a timing chart of various signals in second calibrating reading according to the ninth embodiment.

In the prior-reading of the second calibrating reading, the reading operations AR and JR are executed, as shown in FIG. 65. Accordingly, memory cell transistors of the "Er" level and memory cell transistors of the "J" level or higher levels on the word lines WL(i−1) and WL(i+1) are specified.

The main-reading is performed next. A method of calibrating the second inter-cell interference effect according to this example will be described here with reference to FIGS. 66 and 67.

Figure 66:
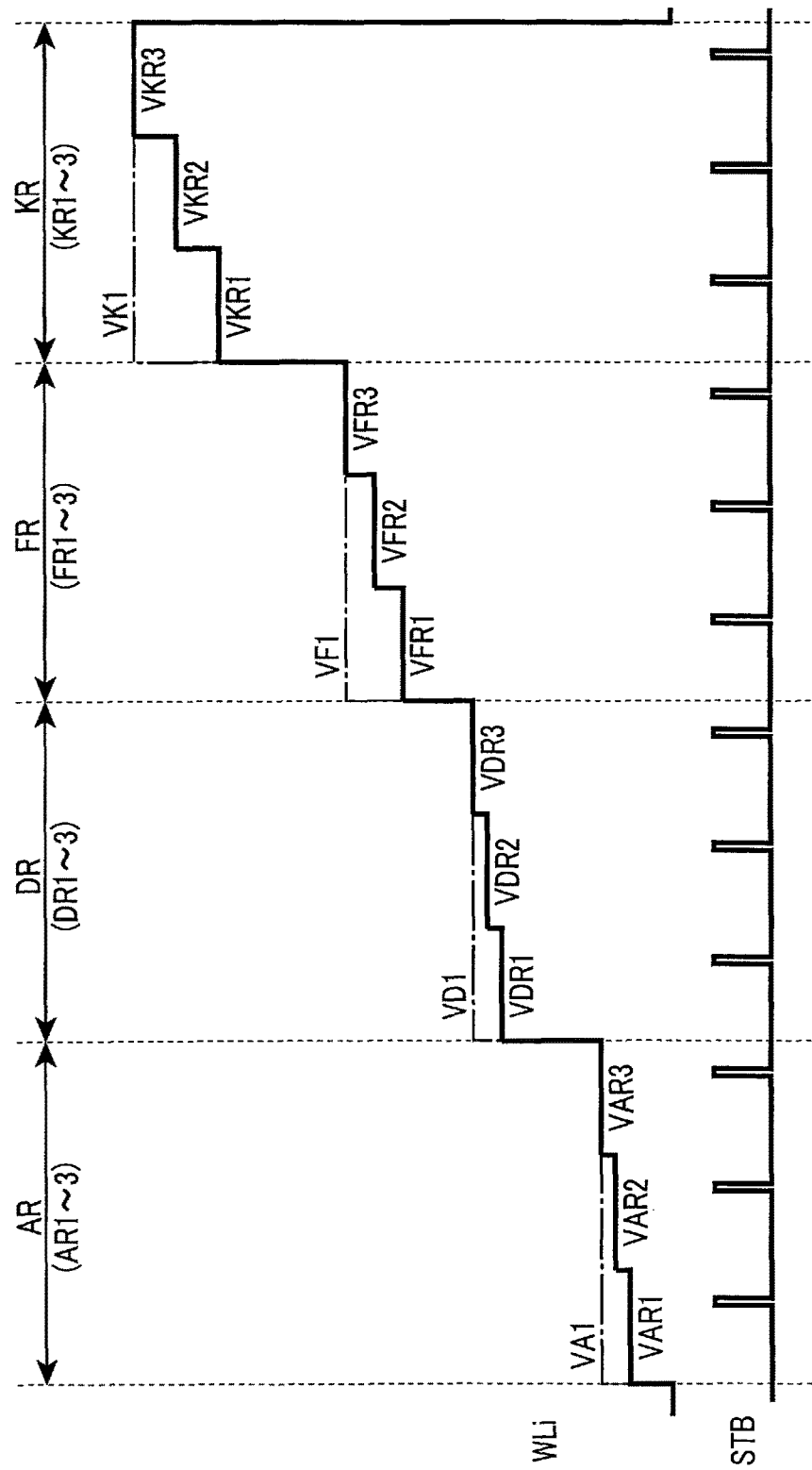

In FIG. 66, each of the reading operations AR, DR, FR, and KR is divided into three steps. That is, the reading operation AR includes AR1 to AR3, the reading operation DR includes DR1 to DR3, the reading operation FR includes FR1 to FR3, and the reading operation KR includes KR1 to KR3. In the reading operations AR1, DR1, FR1, and KR1, for example, a selected word line WLi having the combination in which both of the word lines WL(i−1) and WL(i+1) have the "Er" level is a target for sampling data by means of the strobe signal. In the reading operations AR2, DR2, FR2, and KR2, for example, a selected word line WLi having the combination except for the case in which both of the word lines WL(i−1) and WL(i+1) have the "Er" level and the case in which both of the word lines WL(i−1) and WL(i+1) have the "J" level or higher levels is a target for sampling data by means of the strobe signal. In other word, in the reading operations AR2, DR2, FR2, and KR2, a selected word line WLi having the combination in which both of the word lines WL(i−1) and WL(i+1) have one of the "A" to "I" levels, the combination in which either one of the word lines WL(i−1) and WL(i+1) has the "Er" level, and the other of the word lines has one of the "A" to "I" levels, and the combination in which either one of the word lines WL(i−1) and WL(i+1) has the "J" level or higher level, and the other of the word lines has one of the "A" to "I" levels is target for sampling data. In the reading operations AR3, DR3, FR3, and KR3, for example, a selected word line WLi having the combination in which both of the word lines WL(i−1) and WL(i+1) have the "J" level or higher levels is a target for sampling data by means of the strobe signal. That is, FIG. 66 concerns the second inter-cell interference effect in all of the reading operations AR, DR, FR, and KR.

On the other hand, in FIG. 67, the second inter-cell interference effect in the reading operations AR and DR is neglected. Hence, in the reading operations AR and DR, the default voltages VA1 and VD1 are applied to the word line WLi, respectively.

Under the above-described consideration, two main-reading methods will be described with reference to FIGS. 68 and 69. The case of FIG. 68 will be described first.

Figure 68:
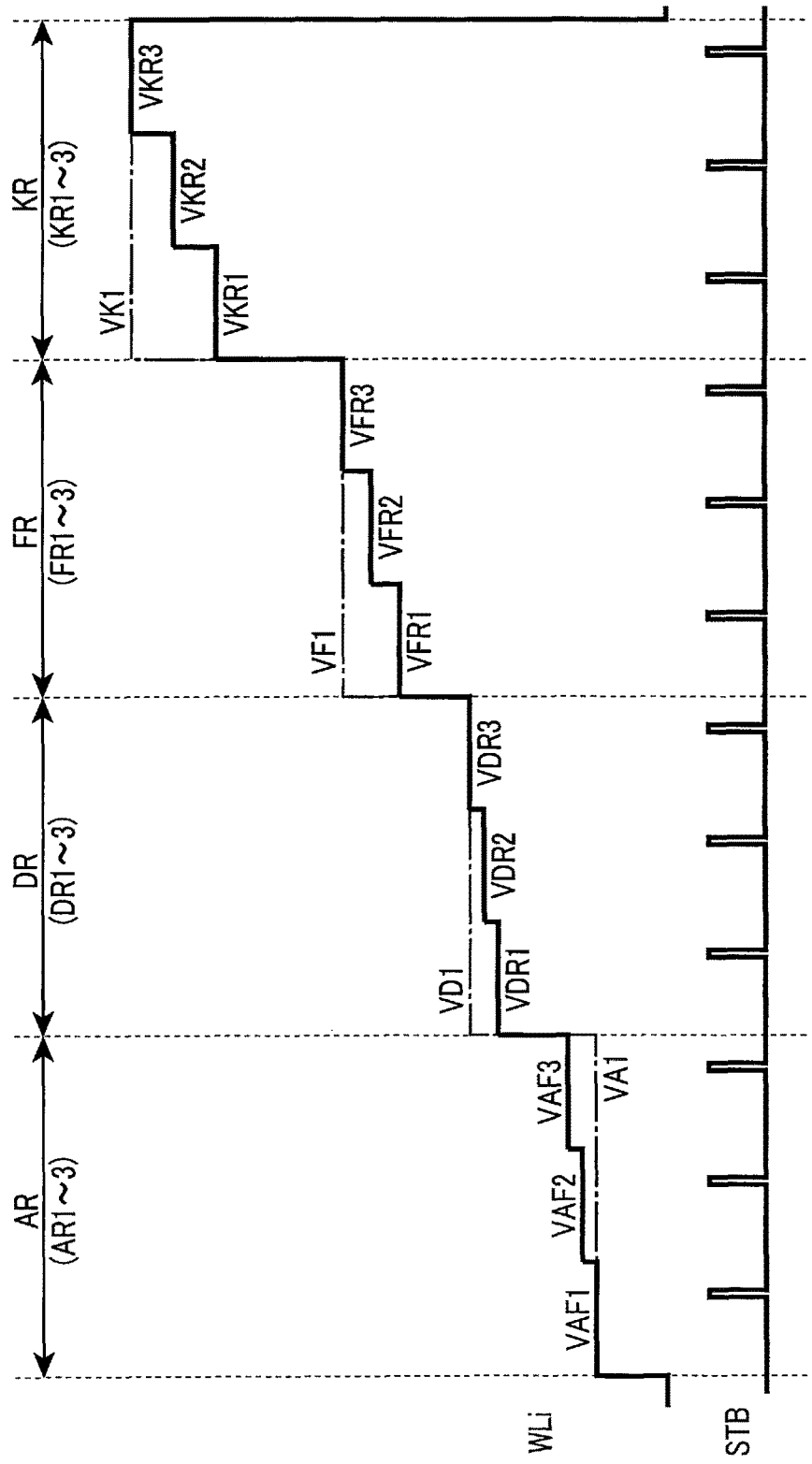
FIGS. 68 and 69 are timing charts of various signals in second calibrating reading according to the ninth embodiment.

In FIG. 68, the second inter-cell interference effect is neglected in the reading operation AR, and the second inter-cell interference effect is taken into consideration in the reading operations DR, FR, and KR. Hence, the reading operation AR is like the reading operation AR in the first calibrating reading described with reference to FIG. 64, and the reading operations DR, FR, and KR are like the reading operations DR, FR, and KR described with reference to FIG. 66.

Then, for example, VAF1<VAF2<VAF3<VDR1< VDR2<VDR3<VFR1<VFR2<VFR3<VKR1<VKR2< VKR3 is set. Additionally, for example, VAF1=VA1, VDR3=VD1, VFR3=VF1, and VKR3=VK1 are set. For example, the following relationships may be realized.

$$(VK1 - VKR3) \geq (VF1 - VFR3) \geq (VD1 - VDR3)$$

$(VK1-VKR2)>(VF1-VFR2)>(VD1-VDR2)$ $(VK1-VKR1)>(VF1-VFR1)>(VD1-VDR1)$

The degrees of lowering along with the lapse of time have the following relationship.

$(VK1-VKR1)>(VK1-VKR2)>(VK1-VKR3)$ $(VF1-VFR1)>(VF1-VFR2)>(VF1-VFR3)$ $(VD1-VDR1)>(VD1-VDR2)>(VD1-VDR3)$ $(VK1-VKR1)>(VF1-VFR1)>(VD1-VDR1)$ $(VK1-VKR2)>(VF1-VFR2)>(VD1-VDR2)$ $(VK1-VKR3)>(VF1-VFR3)>(VD1-VDR3)$

That is, the voltage VKR1 is more largely lowered along with the lapse of time, but the voltage VDR3 is not substantially changed.

Figure 69:
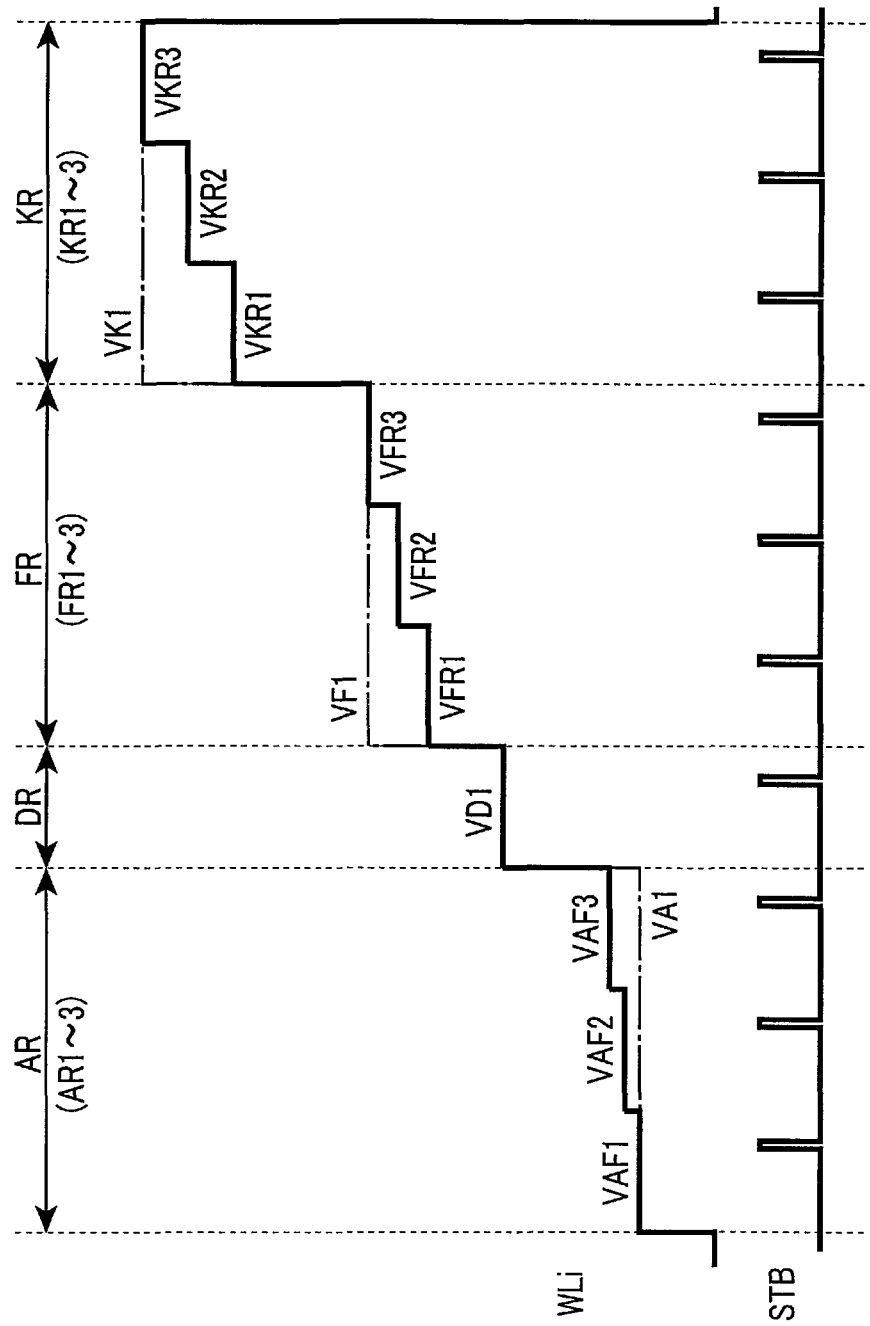

On the other hand, in FIG. 69, the second inter-cell interference effect is neglected not only in the reading operation AR but also in the reading operation DR. As a result, the reading operation AR is like the reading operation AR in the first calibrating reading described with reference to FIG. 64, the reading operation DR is like the reading operation DR in normal reading, and the reading operations FR and KR are like the reading operations FR and KR described with reference to FIG. 66.

9.5 Second Calibrating Reading for Top Page

The second calibrating reading (steps S18, S22, and S26 and the retry reading) for the top page will be described next. For the top page, since the reading operation AR is not included, the first calibrating reading (step S14) is omitted. For the second calibrating reading for the top page, three examples will be described below.

First Example

Figure 70:
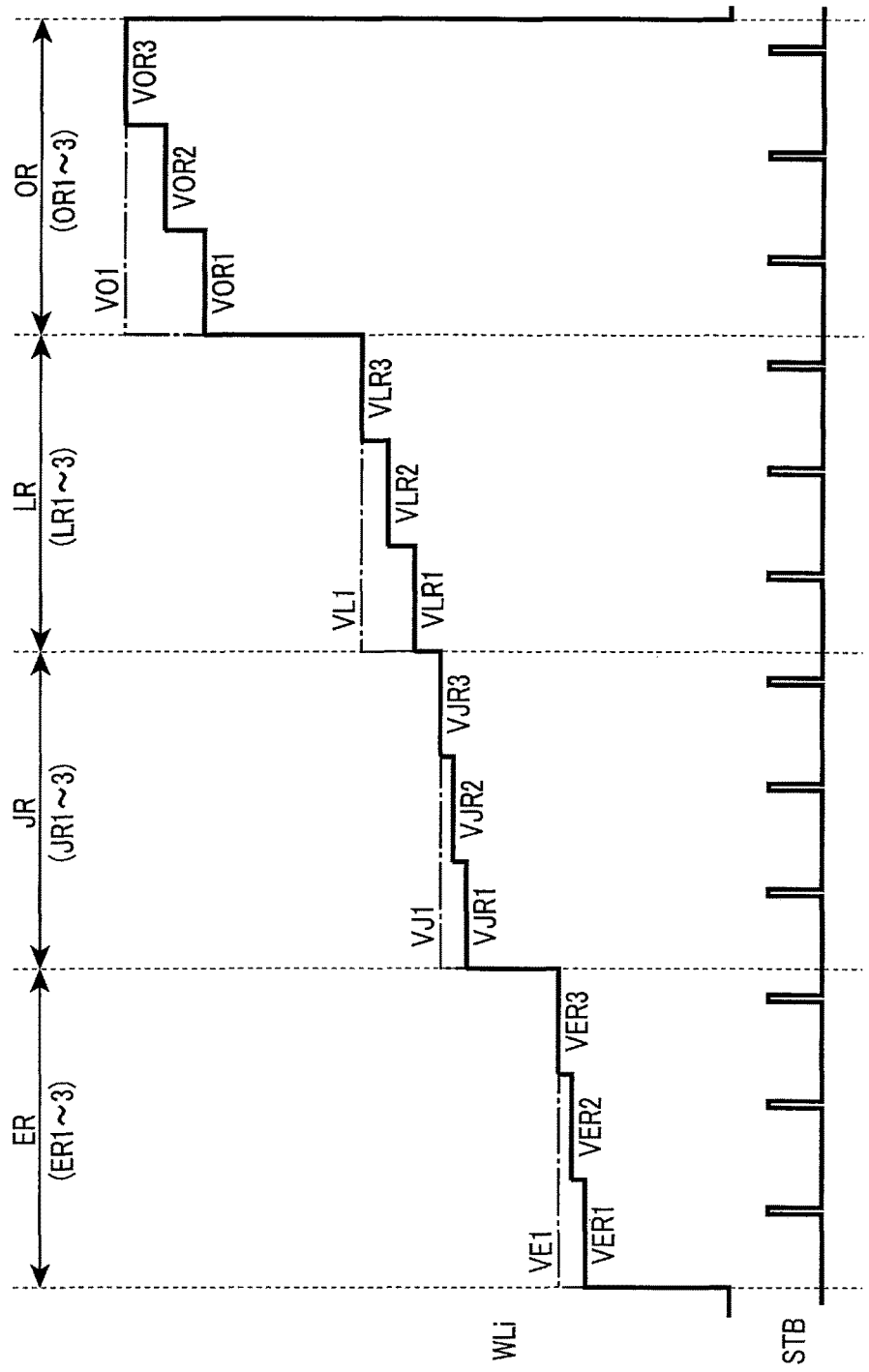
FIGS. 70 and 71 are timing charts of various signals when the influence of a second inter-cell interference effect according to the ninth embodiment is taken into consideration.

The first example will be described first with reference to FIG. 70. FIG. 70 shows the main-reading of the second calibrating reading. In the prior-reading, for example, the reading operation JR is executed, and memory cell transistors of the "J" level or higher levels on the word lines WL(i−1) and WL(i+1) are specified.

In the main-reading, each of the reading operations ER, JR, LR, and OR is divided into three steps, as shown in FIG. 70. That is, the reading operation ER includes ER1 to ER3, the reading operation JR includes JR1 to JR3, the reading operation LR includes LR1 to LR3, and the reading operation OR includes OR1 to OR3. In the reading operations ER1, JR1, LR1, and OR1, for example, a selected word line having the combination in which both of the word lines WL(i−1) and WL(i+1) have a level lower than the "J" level is a target for sampling data by means of the strobe signal. In the reading operations ER2, JR2, LR2, and OR2, for example, a selected word line WLi having the combination in which either one of the word lines WL(i−1) and WL(i+1) has the "J" level or higher levels, and the other of the word lines has a level lower than the "J" level is a target for sampling data by means of the data strobe. In the reading operations ER3, JR3, LR3, and OR3, for example, a selected word line WLi having the combination in which both of the word lines WL(i−1) and WL(i+1) have the "J" level or higher levels is a target for sampling data by means of the strobe signal.

For example, VER1<VER2<VER3<VJR1<VJR2< VJR3<VLR1<VLR2<VLR3<VOR1<VOR2<VOR3 is set.

In addition, for example, VER3=VE1, VJR3=VJ1, VLR3=VL1, and VOR3=VO1 are set. For example, the following relationships are realized.

$(VO1-VOR3)\geq(VL1-VLR3)\geq(VJ1-VJR3)\leq(VE1-VER3)$ $(VO1-VOR2)>(VL1-VLR2)>(VJ1-VJR2)>(VE1-VER2)$ $(VO1-VOR1)>(VL1-VLR1)>(VJ1-VJR1)>(VE1-VER1)$ The voltage lowering ratios along with the lapse of time may be those in the example of the lower page.

Second Example

Figure 71:
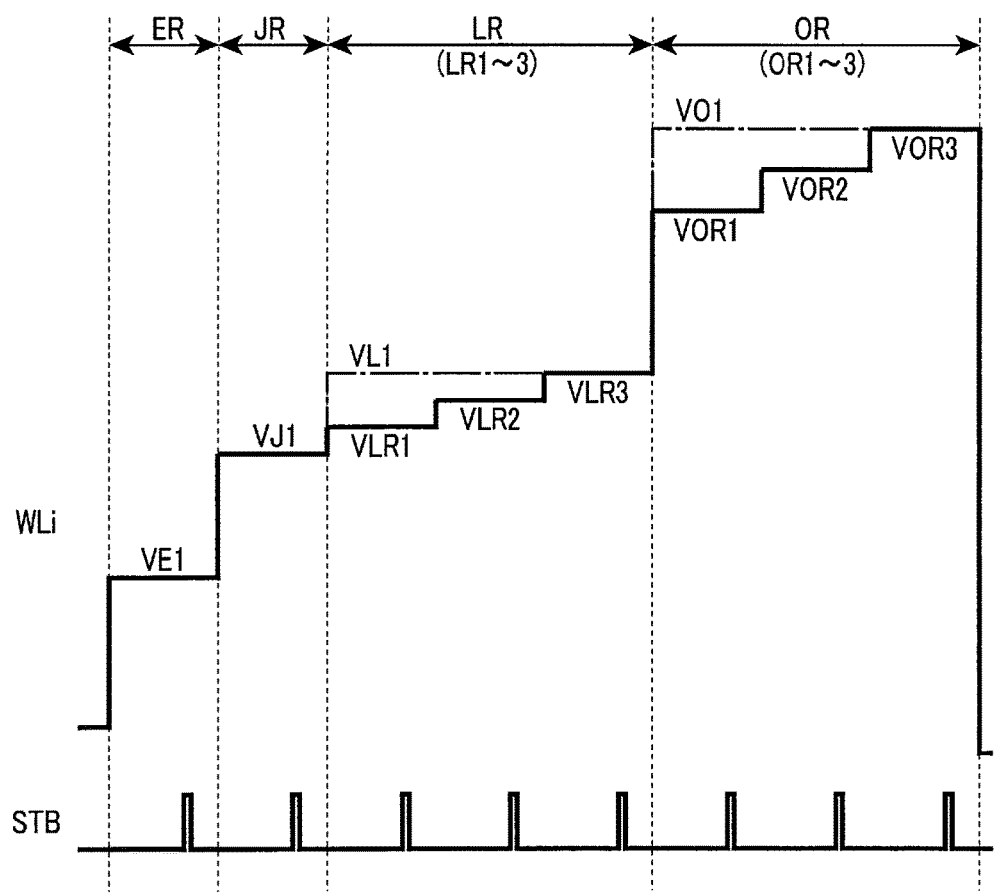

The second example will be described next with reference to FIG. 71. FIG. 71 shows the main-reading of the second calibrating reading. The second example is an example in which the second inter-cell interference effect concerned in the reading operations ER and JR in the first example is neglected.

Hence, as shown in FIG. 71, the reading operations ER and JR are like the reading operations ER and JR of the normal reading, respectively, and the reading operations LR and OR are like the reading operations LR and OR shown in FIG. 70 described in the first example, respectively.

Third Example

The third example will be described next with reference to FIGS. 72 and 73. FIG. 72 shows the prior-reading, and FIG. 73 shows the main-reading.

As shown in FIG. 72, in the prior-reading operation, for example, the reading operations ER and LR are performed. Accordingly, the memory cell transistors MT of a level lower than the "E" level and the memory cell transistors MT of the "L" level or higher levels on the word lines WL(i−1) and WL(i+1) are specified.

The main-reading is performed next. As shown in FIG. 73, the reading operation ER is divided into two steps ER1 and ER2. The reading operation JR is divided into two steps JR1 and JR2. The reading operation LR is divided into three steps LR1, LR2, and LR3. The reading operation OR is divided into five steps OR1, OR2, OR3, OR4, and OR5.

Reading voltages and data sampling targets of the reading operations are as follows. That is, ER1: VER1. The data sampling target includes a selected word line WLi having the combinations in which both of WL(i−1) and WL(i+1) have a level lower than "E".

ER2: VER2. The data sampling target includes a selected word line WLi having the combinations excluded in ER1.

JR1: VJR1. The data sampling target includes a selected word line WLi having combinations in which both of WL(i−1) and WL(i+1) have a level lower than "E".

JR2: VJR2. The data sampling target includes a selected word line WLi having the combinations excluded in JR1.

LR1: VLR1. The data sampling target includes a selected word line WLi having the combinations in which both of WL(i−1) and WL(i+1) have a level lower than "E".

LR2: VLR2. The data sampling target includes a selected word line WLi having the combinations excluded in LR1 and LR3.

LR3: VLR3. The data sampling target includes a selected word line WLi having the combinations in which both of WL(i−1) and WL(i+1) have the "L" level or higher levels.

OR1: VOR1. The data sampling target includes a selected word line WLi having the combinations in which both of WL(i−1) and WL(i+1) have a level lower than "E".

OR2: VOR2. The data sampling target includes a selected word line WLi having the combinations in which either one of WL(i−1) and WL(i+1) has a level lower than "E", and the other of the word lines has one of the "E" to "K" levels.

OR3: VOR3. The data sampling target includes a selected word line WLi having the combinations in which both of WL(i−1) and WL(i+1) have one of the "E" to "K" levels.

OR4: VOR4. The data sampling target includes a selected word line WLi having the combinations in which either one of WL(i−1) and WL(i+1) has the "L" level or more, and the other of the word lines has one of the "E" to "K" levels.

OR5: VOR5. The data sampling target includes a selected word line WLi having the combinations in which both of WL(i−1) and WL(i+1) have the "L" level or higher levels.

Then, for example, VER1<VER2<VJR1<VJR2<VLR1< VLR2<VLR3<VOR1<VOR2<VOR3<VOR4<VOR5 is set. In addition, for example, VER2=VE1, VJR2=VJ1, VLR3=VL1, and VOR5=VO1 are set. For example, the following relationships are realized.

$$(VO1-VOR1) > (VL1-VLR1) > (VJ1-VJR1) > (VE1-VER1)$$

$$(VO1-VOR2) > (VL1-VLR2) > (VJ1-VJR2) > (VE1-VER2)$$

$$(VO1-VOR3) > (VL1-VLR3)$$

$$(VO1-VOR4) > (VO1-VOR5) \geq (VL1-VLR3) \geq (VJ1-VJR2) > (VE1-VER2)$$

The voltage lowering ratios along with the lapse of time may be those in the example of the lower page.

9.6 Effect According to this Embodiment

As described above, the fourth to sixth embodiments may also be applied in a case in which the memory cell transistor holds 4-bit data.

In particular, the threshold voltages of a memory cell transistor that holds multi-bit data, such as 4-bit data, are considerably higher as compared to the threshold voltages of a memory cell transistor that holding 2-bit data. Hence, the degree of the second inter-cell interference effect is larger, and the differences of the degree of the second inter-cell interference effect among held data also become larger. In this case, by changing the number of steps of a reading voltage in accordance with held data, as described in the third example, the reading accuracy is significantly improved.

Note that a case in which the second writing method is applied has been described in this embodiment. However, the first writing method may be applied.

10. 10th Embodiment

A memory system according to the 10th embodiment will be described next. This embodiment is directed to a method of setting a reading voltage used in the second calibrating reading, or a shift value of the reading voltage, according to the first to ninth embodiments.

10.1 Normal Reading

Normal reading will be described first. When executing the normal reading, that is, in step S11 of FIG. 7, the controller 200 transmits the following command sequence to the NAND flash memory 100.

<first reading command> <address> <second reading command>

The first reading command is a command that declares, to the NAND flash memory 100, that an address is to be input. The address is transmitted to the NAND flash memory 100 in, for example, five cycles. The first two cycles of the five cycles are for designating a column address, and the remaining three cycles are for designating a row address. The second reading command is a command that causes the NAND flash memory 100 to start data reading from a memory cell array 110.

10.2 First Calibrating Reading

The first calibrating reading will be described next. When executing the first calibrating reading, that is, in step S13 of FIG. 7, the controller 200 transmits the following command sequence to the NAND flash memory 100.

<first calibrating reading command> <first reading command> <address> <second reading command>

The first calibrating reading command is a command that declares, to the NAND flash memory 100, that the first calibrating reading is to be performed. Subsequent procedure may be those in the normal reading. The shift value of a reading voltage used in the first calibrating reading is held in one of the registers of the NAND flash memory 100. Based on the shift value read from the register by the sequencer 170, the reading voltage is designated. The shift value is stored in, for example, a block BLK of the memory cell array 110 and read from the block BLK to the register when, for example, the NAND flash memory 100 is powered on. Hence, concerning the first calibrating reading, it is not necessary for the controller 200 to designate the shift value.

10.3 Second Calibrating Reading

The second calibrating reading will be described next. When executing second calibrating reading, first, in steps S16, S20, and S24 of FIG. 7, the shift table is read from the NAND flash memory 100 to the controller 200. Then, in steps S17, S21, and S25, the controller 200 notifies the NAND flash memory 100 of a shift value for a reading voltage by means of, for example, a set feature command. The set feature command is a command for changing various settings such as voltages and timing in the NAND flash memory 100. This method will be described using three examples.

First Example

Figure 74:
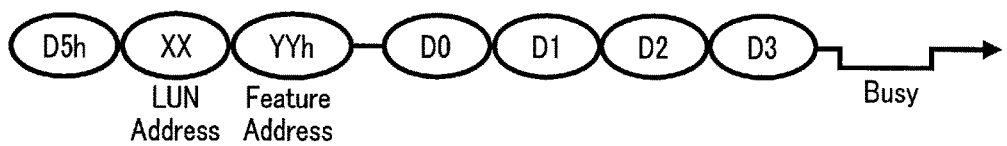
FIGS. 74 and 75 are command sequences according to the 10th embodiment.

The first example will be described first. FIG. 74 is a command sequence according to the first example. As shown in FIG. 74, the controller 200 uses the following command sequence in transmission to the NAND flash memory 100.

<D5h> <XX> <YYh> <D0> <D1> <D2> <D3>

"D5h" is a command that declares a setting change to the NAND flash memory 100. <XX> is a logic unit number. One logic unit number corresponds to, for example, a minimum unit that may be executed in an independent command and may report a status independently. That is, different logic unit numbers may be operated in parallel by arbitrary command sequences. In other words, the logic unit number may also be said to be an aggregate of a plurality of blocks BLK that share data registers included in the sense amplifier 140. Also in other words, if the memory system 1 includes a plurality of memory chips, the logic unit number may be an address to designate one of the memory chips. <YYh> is an address that designates a set value as a target to be changed. In this example, a reading voltage in a reading operation is designated. "D0" to "D3" are data representing the values of reading voltages or the shift values of the reading voltages.

For example, when executing the second calibrating reading shown in FIG. 68, the command sequence shown in FIG. 74 is repeated four times.

In the first command sequence, a reading voltage in a reading operation AR is designated by "XX". Then, VAF1 to VAF3 are designated as reading voltages by "D0" to "D2". In this case, data of "D3" is neglected.

In the second command sequence, a reading voltage in a reading operation DR is designated by "XX". Then, VDR1 to VDR3 are designated as reading voltages by "D0" to "D2". In this case as well, data of "D3" is neglected.

In the third command sequence, a reading voltage in a reading operation FR is designated by "XX". Then, VFR1 to VFR3 are designated as reading voltages by "D0" to "D2". In this case as well, data of "D3" is neglected.

In the fourth command sequence, a reading voltage in a reading operation KR is designated by "XX". Then, VKR1 to VKR3 are designated as reading voltages by "D0" to "D2". In this case as well, data of "D3" is neglected.

After that, the controller 200 issues the same command sequence as in normal reading to the NAND flash memory 100. In response to this, the NAND flash memory executes the second calibrating reading using the voltages designated by the command sequence shown in FIG. 74.

Second Example

The second example will be described next. The command sequence according to the second example is similar to the command sequence shown in FIG. 74. The second example is different from the first example in that a reading operation is not designated in <YYh>, and a reading voltage value is set in <D3> as well.

For example, when executing the second calibrating reading shown in FIG. 68, the command sequence shown in FIG. 74 is repeated three times. In any command sequence, while "YYh" designates a reading voltage, it does not designate which reading operation is to be performed.

In the first command sequence, the reading voltages VAF1 to VAF3 of reading operations AR1 to AR3 are designated by "D0" to "D2", and the reading voltage VDR1 of a reading operation DR1 is designated by "D3". In the second command sequence, the reading voltages VDR2 and VDR3 of reading operations DR2 and DR3 are designated by "D0" and "D1", and the reading voltages VFR1 and VFR2 of reading operations FR1 and FR2 are designated by "D2" and "D3".

In the third command sequence, the reading voltage VFR3 of a reading operation FR3 is designated by "D0", the reading voltages VKR1 to VKR3 of reading operations KR1 to KR3 are designated as reading voltages by "D1" to "D3".

After that, the controller 200 issues the same command sequence as in the normal reading to the NAND flash memory 100.

Third Example

Figure 75:
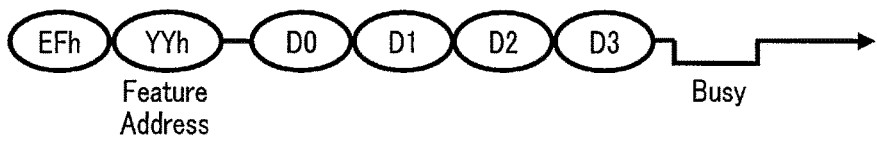

The third example will be described next. FIG. 75 is a command sequence according to the third example. As shown in FIG. 75, the controller 200 uses the following command sequence in transmission to the NAND flash memory 100.

<EFh> <YYh> <D0> <D1> <D2> <D3>

"EFh" is a command that declares a setting change to the NAND flash memory 100, like "D5h". This example is different from the first and second examples in that a logic unit number is not designated. The rest is the same as described in the first and second examples.

11. Modifications

As described above, a memory system according to the above embodiment includes a semiconductor memory capable of reading data from a memory cell on a page basis, and a controller that controls the semiconductor memory. The semiconductor memory includes a first reading operation (normal reading), a second reading operation (second calibrating reading performed at a first time) to be performed when the first reading operation fails, and a third reading operation (second calibrating reading performed at a second time) to be performed when the second reading operation fails. In the first reading operation (normal reading), a first voltage (VC1 in FIG. 12) is applied to a selected word line. In the second reading operation (second calibrating reading performed at a first time in FIG. 12), a second voltage (VCee in FIG. 12) which is different from the first voltage and a third voltage (VCea in FIG. 12) are applied to the selected word line in turn. In the third reading operation (second calibrating reading performed at a second time in FIG. 12), a fourth voltage (VCee in FIG. 12) which are different from the first voltage, the second voltage, and the third voltage and a fifth voltage (VCea in FIG. 12) are applied to the selected word line in turn. An absolute value of a difference between the second voltage and the fourth voltage (a change amount of ΔVC1 as shown in FIG. 12) is different from an absolute value of a difference between the third voltage and the fifth voltage (a change amount of ΔVC2 in FIG. 12).

In other words, a semiconductor memory according to the above embodiment includes a first reading operation (normal reading), a second reading operation (second calibrating reading performed at a first time) to be performed when the first reading operation fails, and a third reading operation (second calibrating reading performed at a second time) to be performed when the second reading operation fails. In the first reading operation (normal reading), a first voltage (VC1 in FIG. 12) is applied to a selected word line. In the second reading operation (second calibrating reading performed at a first time in FIG. 12), a second voltage (VCee in FIG. 12) which is different from the first voltage and a third voltage (VCea in FIG. 12) are applied to the selected word line in turn. In the third reading operation (second calibrating reading performed at a second time in FIG. 12), a fourth voltage (VCee in FIG. 12) which are different from the first voltage, the second voltage, and the third voltage and a fifth voltage (VCea in FIG. 12) are applied to the selected word line in turn. The second voltage (VCee to VCeb of the second calibrating reading performed at the first time in FIG. 12) is lower than the first voltage (VC1 in FIG. 12). The fourth voltage (VCee to VCeb of the second calibrating reading performed at the second time in FIG. 12) is lower than the second voltage (VCee to VCeb of the second calibrating reading performed at the first time in FIG. 12). The fifth voltage (VCec of the second calibrating reading performed at the second time in FIG. 12) is lower than the third voltage (VCec of the second calibrating reading performed at the first time in FIG. 12).

According to this configuration, it may improve the data reading accuracy and improve the operation reliability of the memory system. Note that the above-described embodiments are provided merely by way of example, and various modifications may be made.

For example, in FIG. 17 described in the second embodiment, the examples in which the first inter-cell interference effect is taken into consideration when the adjacent memory cell transistor MT(i+1) holds the "C" level have been described. However, the level is not limited to the "C" level, and the first inter-cell interference effect may be taken into consideration if the level may be, for example, the "B" or higher level. In this case, in the prior-reading of the first calibrating reading, the reading operation BR is performed, and the memory cell transistor MT(i+1) holding data of "B" or higher level is specified. Additionally, in FIG. 23 described in the third embodiment, the examples in which the second inter-cell interference effect is taken into consideration when at least one of the memory cell transistors MT(i−1) and MT(i+1) holds the "Er" level have been described. However, the level is not limited to the "Er" level, and for example, the "Er" or "A" level may be held. In this case as well, the reading operation BR is performed in the second calibrating reading.

As described above, combination of levels are not limited to the combinations of levels serving as a boundary based on which whether to concern the first inter-cell interference effect and the second inter-cell interference effect, or the combinations of levels determined to be different in the degree of influence of the first inter cell interference effect and the second inter cell interference effect in a case where the degree of influence is determined by classifying the combinations into three or more types, as described with reference to FIGS. 16, 21, and 33, and may be appropriately set.

This may also apply to the seventh to ninth embodiments. For example, in the examples of FIGS. 46 and 47, the "F" and "G" levels are used as the determination levels of the influence of the first inter-cell interference effect, and the "Er" level is used as the determination level of the influence of the second inter-cell interference effect. However, another level may be used. In this case, a reading operation depending on the determination level used may be executed in the prior-reading, as described above.

As for the second inter-cell interference effect, the above embodiments addresses the examples in which the second inter-cell interference effect is not taken into consideration in the 1-month lapse table if the threshold voltages of the memory cell transistors MT(i−1) and MT(i+1) are high (see FIG. 12) for the sake of simplicity. However, even if the threshold voltages of adjacent memory cell transistors are high, the influence of the second inter-cell interference effect may become larger along with the lapse of time. Hence, although the reading voltage of the reading operation CR1-4 is lowered by ΔVC4 in the 2-month lapse table in the examples of FIG. 12, ΔVC4 may be set as a positive value in the 1-month lapse table. This may apply not only to the reading operation CR1-4 but also to a reading operation that does not concern a threshold variation because of the weak influence of the second inter-cell interference effect in the above embodiments. That is, this may also apply to the reading operations CR1-4, CR2-4, CR3-4, and CR4-4 in FIG. 9, CR1-6 and CR2-4 in FIG. 20, CR1-3 and CR2-2 in FIG. 28, CR16 in FIGS. 32 and 33, CR7 in FIG. 37, CR3 in FIG. 42, AR1-3, AR2-2, AR3, and CR3 in FIG. 43, ER1-3 and ER2-2 in FIG. 52, GR1-3 and GR2-2 in FIG. 57, ER1-3 in FIG. 59, GR1-3 in FIG. 60, DR3, FR3, and KR3 in FIGS. 68 and 69, and JR2, LR3, and OR5 in FIGS. 71 and 73.

For example, in the above embodiments, the examples in which the threshold of the memory cell transistor MTi is lowered have been described as the second inter-cell interference effect. However, the threshold voltage may be raised depending on the threshold voltages of the adjacent memory cell transistors. For example, in FIG. 44, the thresholds of the "Er" and "A" levels may be raised, the thresholds of the "F" and "G" levels may be lowered, and the thresholds of the "B" to "E" levels may be lowered or raised depending on the adjacent cell. That is, by the second inter-cell interference effect, the threshold of a high voltage level may tend to be lowered, the threshold of a low voltage level may tend to be raised, and the threshold of an intermediate voltage level may have both tendencies. Even in this case, information of appropriate reading voltages in the second calibrating reading may be stored in the shift table.

In the above embodiments, the examples in which the shift table is provided for every month have been described. However, the shift table may be provided not for every month but for every two or more months or for every week. The shift table is not necessarily provided at a predetermined interval, and may be appropriately set.

In the above embodiments, several examples of the grouping of combinations of the thresholds of the adjacent word lines WL(i−1) and WL(i+1) have been described. However, the grouping method may appropriately be selected. In the seventh to ninth embodiments, the examples in which the grouping is performed have been described. However, there may be a case where the grouping may be concerned.

In the above embodiments, the examples in which the reading voltage is raised stepwise along with time have been described. However, the reading voltage may be raised continuously along with time. Note that "continuously along with time" includes a case in which, for example, the voltage is raised in a fine or small stepwise fashion. For example, a case in which two step-up processes are included in the period of assertion of the signal STB may also be included.

Note that in each embodiment concerning the present invention, (1) The voltage applied to the selected word line in the reading operation of A level may range from, for example, 0 V to 0.55 V. However, the present invention is not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the reading operation may be set within the range of, for example, 25 μs to 38 μs, 38 μs to 70 μs, or 70 μs to 80 μs.

(2) A writing operation may include a program operation and a verify operation. In the writing operation, the voltage first applied to the selected word line in the program operation may range from, for example, 13.7 V to 14.3 V.

The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation may be ISPP (Incremental Step Pulse Program), the voltage of step-up may be, for example, 0.5 V.

The voltage applied to an unselected word line may be set within the range of, for example, 6.0 V to 7.3 V. However, the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the writing operation may be set within the range of, for example, 1,700 μs to 1,800 μs, 1,800 μs to 1,900 μs, or 1,900 μs to 2000 μs.

(3) In erasing operation,

The voltage first applied to the well which may be formed in the upper portion of the semiconductor substrate and above which the memory cell may be arranged may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 μs to 4,000 μs, 4,000 μs to 5,000 μs, or 4,000 μs to 9,000 μs.

(4) The structure of the memory cell

A charge accumulation layer may be arranged on a 4 to 10 nm thick tunnel insulating film on the semiconductor substrate (silicon substrate). The charge accumulation layer may have a stacked structure of a 2 to 3 nm thick insulating film of SiN or SiON and 3 to 8 nm thick polysilicon. A metal such as Ru may be added to the polysilicon. An insulating film is provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a semiconductor memory capable of reading data from memory cells on a page basis; and
   a controller which controls the semiconductor memory,
   wherein the semiconductor memory is configured to execute a first reading operation, a second reading operation when the first reading operation fails, and a third reading operation when the second reading operation fails,
   wherein in the first reading operation, a first voltage is applied to a selected word line of the semiconductor memory,
   in the second reading operation, a second voltage and a third voltage are sequentially applied to the selected word line, and the second voltage is different from the first voltage, and
   in the third reading operation, a fourth voltage and a fifth voltage are sequentially applied to the selected word line, and the fourth voltage is different from the first voltage, the second voltage, and the third voltage, and
   wherein an absolute value of a difference between the second voltage and the fourth voltage is different from an absolute value of a difference between the third voltage and the fifth voltage.

2. The system according to claim 1, wherein the second voltage and the third voltage are lower than the first voltage, and the second voltage is lower than the third voltage, and
   the fourth voltage is lower than the second voltage, and the fifth voltage is lower than the third voltage and the fourth voltage.

3. The system according to claim 1, wherein the semiconductor memory is further configured to execute a fourth reading operation when the first reading operation fails,
   the second reading operation is executed when the fourth reading operation fails,
   in the fourth reading operation, a sixth voltage and a seventh voltage are sequentially applied to the selected word line, and
   the sixth voltage is equal to or higher than the first voltage, and the seventh voltage is higher than the first voltage and the sixth voltage.

4. The system according to claim 3, wherein in the fourth reading operation,
   when the sixth voltage is applied to the selected word line, a first group of a plurality of memory cells connected to the selected word line is a target for being sampled by a strobe signal, and
   when the seventh voltage is applied to the selected word line, among the plurality of memory cells connected to the selected word line, a second group of the memory cells different from the first group of the memory cells is a target for being sampled by a strobe signal.

5. The system according to claim 4, wherein the second reading operation is executed for each of the first group and the second group.

6. The system according to claim 5, wherein in the second reading operation for the first group, the second voltage and the third voltage are lower than the sixth voltage, and
   in the second reading operation for the second group, the second voltage and the third voltage are lower than the seventh voltage.

7. A memory system comprising:
a semiconductor memory capable of reading data from memory cells on a page basis; and
a controller which controls the semiconductor memory,
wherein the semiconductor memory is configured to execute a first reading operation, a second reading operation when the first reading operation fails, and a third reading operation when the second reading operation fails,
wherein in the first reading operation, a first voltage is applied to a selected word line,
in the second reading operation, a second voltage and a third voltage are sequentially applied to the selected word line, and the second voltage is different from the first voltage, and
in the third reading operation, a fourth voltage and a fifth voltage are sequentially applied to the selected word line, and the fourth voltage is different from the first voltage, the second voltage, and the third voltage, and
wherein the second voltage is lower than the first voltage, and
the fourth voltage is lower than the second voltage, and the fifth voltage is lower than the third voltage.

8. The system according to claim 7, wherein the second voltage and the third voltage are lower than the first voltage, and the second voltage is lower than the third voltage, and
the fourth voltage is lower than the second voltage, and the fifth voltage is lower than the third voltage and the fourth voltage.

9. The system according to claim 7, wherein the semiconductor memory is further configured to execute a fourth reading operation when the first reading operation fails,
the second reading operation is executed when the fourth reading operation fails,
in the fourth reading operation, a sixth voltage and a seventh voltage are sequentially applied to the selected word line, and
the sixth voltage is equal to or higher than the first voltage, and the seventh voltage is higher than the first voltage and the sixth voltage.

10. The system according to claim 9, wherein in the fourth reading operation,
when the sixth voltage is applied to the selected word line, a first group of a plurality of memory cells connected to the selected word line is a target for being sampled by a strobe signal, and
when the seventh voltage is applied to the selected word line, among the plurality of memory cells connected to the selected word line, a second group of the memory cells different from the first group of the memory cells is a target for being sampled by a strobe signal.

11. The system according to claim 10, wherein the second reading operation is executed for each of the first group and the second group.

12. The system according to claim 11, wherein in the second reading operation for the first group, the second voltage and the third voltage are lower than the sixth voltage, and
in the second reading operation for the second group, the second voltage and the third voltage are lower than the seventh voltage.

13. A memory system comprising:
a semiconductor memory capable of reading data from memory cells on a page basis; and
a controller capable of issuing a first reading instruction and a second reading instruction to the semiconductor memory,
wherein the semiconductor memory is configured to execute a first reading operation when receiving the first reading instruction from the controller, and execute a second reading operation when receiving the second reading instruction,
in the first reading operation, a first voltage, a second voltage higher than the first voltage, and a third voltage higher than the second voltage are applied to a selected word line,
in the second reading operation, a fourth voltage, a fifth voltage, a sixth voltage, a seventh voltage, an eighth voltage, and a ninth voltage which are different from each other are applied to the selected word line,
the fourth voltage is lower than the first voltage, and
the fifth voltage is higher than the first voltage.

14. The system according to claim 13, wherein in the second reading operation, a tenth voltage is further applied to the selected word line, and
the tenth voltage equals the first voltage.

15. The system according to claim 13, wherein the seventh voltage is higher than the sixth voltage and equal to or lower than the second voltage, and
the ninth voltage is higher than the eighth voltage and equal to or lower than the third voltage.

16. The system according to claim 13, wherein the memory cell is capable of holding multi-bit data including at least a first bit and a second bit,
the first voltage, the second voltage, and the third voltage are used to determine the first bit in the first reading operation, and
the fourth voltage, the fifth voltage, the sixth voltage, the seventh voltage, the eighth voltage, and the ninth voltage are used to determine the second bit in the second reading operation.

17. The system according to claim 16, wherein the controller issues the second reading instruction when the semiconductor memory fails in the first reading operation.

* * * * *